(12) United States Patent
Sengupta et al.

(10) Patent No.: US 10,063,191 B2
(45) Date of Patent: Aug. 28, 2018

(54) FREQUENCY AND BACK-OFF RECONFIGURABILITY IN MM-WAVE POWER AMPLIFIERS

(71) Applicants: Kaushik Sengupta, Princeton Junction, NJ (US); Chandrakanth Reddy Chappidi, Princeton, NJ (US)

(72) Inventors: Kaushik Sengupta, Princeton Junction, NJ (US); Chandrakanth Reddy Chappidi, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 15/469,174

(22) Filed: Mar. 24, 2017

(65) Prior Publication Data

US 2017/0279414 A1 Sep. 28, 2017

Related U.S. Application Data

(60) Provisional application No. 62/312,822, filed on Mar. 24, 2016.

(51) Int. Cl.
  *H03F 1/26* (2006.01)
  *H03F 1/56* (2006.01)
  (Continued)

(52) U.S. Cl.
  CPC ............... *H03F 1/26* (2013.01); *H01Q 1/50* (2013.01); *H03F 1/565* (2013.01); *H03F 3/19* (2013.01);
  (Continued)

(58) Field of Classification Search
  CPC ......... H03F 1/0288; H03F 1/07; H03F 1/3252
  (Continued)

(56) References Cited

U.S. PATENT DOCUMENTS

| 5,751,242 A | * | 5/1998 | Goutzoulis | G01S 7/032 342/157 |
| 8,583,057 B2 | * | 11/2013 | Tu | H04B 1/0053 455/101 |

(Continued)

OTHER PUBLICATIONS

Chandrakanth R. Chappidi and Kaushik Sengupta, "Frequency Reconfigurable mm-Wave Power Amplifier with Active Impedance Synthesis in an Asymmetrical Non-Isolated Combiner", ISSCC, p. 344-345, IEEE 2016.

(Continued)

*Primary Examiner* — Henry Choe
(74) *Attorney, Agent, or Firm* — Meagher Emanuel Laks Goldberg & Liao, LLP

(57) ABSTRACT

A power amplifier system for amplifying an input having a carrier frequency having an amplitude. The system includes a plurality of n amplifiers coupled to an asymmetrical combiner formed of a passive network, each amplifier has an input and an output, the asymmetrical combiner has a plurality of inputs and an output, the output of each amplifier is coupled to an input of the asymmetrical combiner, an impedance viewed at the output of each of the n amplifiers is a function of the amplitude and phase at each of the other n−1 amplifiers. An amplitude/phase controller is coupled to the plurality of n amplifiers or the asymmetrical combiner to control the amplitude/phase at the asymmetrical combiner input. The amplitude/phase controller is configured to present an amplitude/phase at each input of the asymmetrical combiner to target an optimal impedance at the carrier frequency for each of the plurality of n amplifiers.

29 Claims, 63 Drawing Sheets

(51) Int. Cl.
　　　*H03F 3/21*　　　(2006.01)
　　　*H03F 3/19*　　　(2006.01)
　　　*H01Q 1/50*　　　(2006.01)
　　　*H04B 1/04*　　　(2006.01)

(52) U.S. Cl.
　　　CPC ......... *H03F 3/21* (2013.01); *H03F 2200/387* (2013.01); *H03F 2200/451* (2013.01); *H04B 1/04* (2013.01)

(58) Field of Classification Search
　　　USPC .............................................. 330/295, 124 R
　　　See application file for complete search history.

(56) References Cited

U.S. PATENT DOCUMENTS

| | | | |
|---|---|---|---|
| 9,391,684 B1* | 7/2016 | Marr ................... | H04B 7/0617 |
| 9,411,104 B2* | 8/2016 | Summers ........... | G02B 6/29344 |
| 9,438,186 B2* | 9/2016 | Srinidhi Embar ........ | H03F 3/21 |
| 9,712,119 B2* | 7/2017 | Datta ................... | H03F 1/0288 |
| 2015/0222230 A1* | 8/2015 | Tajima ...................... | H03F 3/19 330/124 R |
| 2016/0181234 A1* | 6/2016 | Xu .......................... | H03F 3/189 330/253 |

OTHER PUBLICATIONS

Chandrakanth R. Chappidi et al. "Generalized Approach towards Frequency and Back-off Reconfigurability in mm-Wave" PAs (2016).
http :1 /www .cisco. com/c/en/us/solutions/collateral/service-provider/visual-networking-index-vni/white_paper_c11-520862.pdf (2017).
A. Hajimiri, "The Future of High Frequency Circuit Design," Proc. IEEE ESSCIRC, pp. 44-51, 2006.
E. Johnson, "Physical limitations on frequency and power parameters of transistors," Proc. IRE, vol. 5, pp. 27-34, Sep. 1965.
U. Pfeiffer and D.Goren, "A 20 dBm fully-integrated 60 GHz SiGe power amplifier with automatic level control," in Proc. IEEE ESSCIRC, pp. 356-359, 2006.
A. Komijani and A. Hajimiri, "A wideband 77 GHz, 17.5 dBm power amplifier in silicon," in Proc. IEEE CICC, pp. 571-574, 2005.
A. Agah, Hayg Dabag, Bassel Hanafi, Peter Asbeck, Lawrence Larson, and James Buckwalter, "A 34% PAE, 18.6 dBm 42-45 GHz stacked power amplifier in 45 nm SOI CMOS," in IEEE RFIC Symp. Dig. Papers, pp. 57-60, 2012.
S. Pompromlikit, Hayg-Taniel Dabag, Bassel Hanafi and Joohwa Kim., "A Q-band amplifier implemented with stacked 45-nm CMOS FETs," in Proc. IEEE CSICS, pp. 1-4, 2011.
A. Agah, Hayg Dabag, Bassel Hanafi, Peter Asbeck, Lawrence Larson, and James Buckwalter, "A 45 GHz doherty power amplifier with 23% PAE and 18 dBm output power in 45 nm SOI CMOS," in IEEE MTT-S Int Microwave Symp. Dig., pp. 1-3, 2012.
Wei Tai, L.Richard Carley and David S. Ricketts "A 0.7 W fully integrated 42 GHz power amplifier with 10% PAE in 0.13 m SiGe BiCMOS," in IEEE ISSCC Dig. Tech. Papers, pp. 142-143, 2013.
Alberto Valdes-Garcia, Scott Reynolds and Ullrich R. Pfeiffer ,"A 60 GHz class-E power amplifier in SiGe," in Proc. IEEE A-SSCC, pp. 199-202, 2006.
N. Kalantari and James Buckwalter., "A 19.4 dBm, Q-band class-E power amplifier in a 0.12 m SiGe BiCMOS process," in Proc. IEEE Microwave and Wireless Components, pp. 283-285, May 2010.
O. Ogunnika and Alberto Valdes-Garcia "60 GHz Class-E tuned power amplifier with PAE 25% in 32 nm SOI CMOS," in IEEE RFIC Symp. Dig. Papers, pp. 65-68, 2012.
I. Sarkas, Andreea Balteanu, Eric Dacquay, Alexander Tomkins, Sorin Voinigescu "A 45 nm SOI CMOS Class-D mm-wave PA with 10 Vpp differential swing," in IEEE ISSCC Dig Tech. Papers, pp. 88-90, 2012.

A. Chakrabarti and H. Krishnaswamy., "High power, high efficiency stacked mmWave class-E-like power amplifiers in 45 nm SOI CMOS," in Proc. IEEE CICC, pp. 1-4, 2012.
A. Kavousian, David K. Su, Mohammad Hekmat, Alireza Shirvani, and Bruce A. Wooley "A digitally modulated polar CMOS power amplifier with a 20-MHz channel bandwidth." IEEE .J. Solid-State Circuits, vol. 43, No. 10, pp. 2251-2258, Oct. 2008.
Andreea Balteanu, Joannis Sarkas, Eric Dacquay, Alexander Tomkins, Gabriel M. Rebeiz, Peter M. Asbeck and Sorin P. Voinigescu, "A 2-bit, 24 dBm, millimeter-wave SOI CMOS power-DAC cell for watt-level high-efficiency, fully digital m-ary QAM transmitters," IEEE J Solid-State Circuits, vol. 48, No. 2, pp. 1126-1137, May 2013.
R. Bhat, A. Chakrabarti and H.Krishnaswamy, "Large-scale power-combining and linearization in wattclass mmWave CMOS power amplifiers," in IEEE RFIC Symp. Dig. Papers, pp. 283-286, 2013.
A. Agah, Wei Wang, Peter Asbeck, Lawrence Larson and James Buckwalterl "A 42 to 47-GHz, 8-bit I/Q digital-to-RF converter with 21-dBm and 16% PAE in 45-nm SOI CMOS," in IEEE RFIC Symp. Dig. Papers, pp. 249-252, 2013.
M. Shifrin, Y. Ayasli, and P.Katzin., "A new power amplifier topology with series biasing and power combining of transistors," in Proc. IEEE Microwave and Millimeter-Wave Monolithic Circuits Symp., pp. 39-41, 1992.
I. Aoki, S.D.Kee, D.Rutledge and A.Hajimiri, "Distributed active transformer—A new power-combining and impedance-transformation technique," IEEE Trans. Microw. Theory Tech., vol. 50, No. 1, pp. 316-331, Jan. 2002.
K.Datta and H. Hashemi., "A 29dBm 18.5% Peak PAE mm-Wave Digital Power Amplifier with Dynamic Load Modulation," ISSCC Dig. Tech. Papers, pp. 46-47, Feb. 2015.
K.Datta and H.Hashemi., "Analysis, Design and Implementation of mm-Wave SiGe Stacked Class-E Power Amplifiers," IEEE Radio Frequency Integrated Circuits Symp., pp. 275-278, Jun. 2013.
A. Komijani and A.Hajimiri, "A Wideband 77-GHz, 17.5-dBm Fully Integrated Power Amplifier in Silicon," in IEEE J Solid-State Circuits, vol. 8, No. 41, pp. 1749-1756, Aug. 2006.
E.Afshari, X.Li and A.Hajimiri, "Electrical funnel: A broadband signal combining method," IEEE ISSCC Dig. Tech. Papers, pp. 751-760, Feb. 2006.
Aurélien Larie, Eric Kervé, Baudouin Martineau, Vincent Knopik and Didier Belot, "A 1.2V 20 dBm 60 GHz Power Amplifier with 32.4 dB Gain and 20% Peak PAE in 65nm CMOS," Proc. Eur. Solid-State Cir. Conf, pp. 175-178, Sep. 2014.
Bassi et al., "A 40-67 GHz Power Amplifier With 13 dBm Psat and 16% PAE in 28 nm CMOS LP," IEEE J Solid-State Circuits, vol. 50, No. 7, pp. 1618-1628, Jul. 2015.
K. Sengupta and A.Hajimiri, "Distributed Active Radiation for THz Signal Generation" Proc. IEEE Int. Solid-State Circuits Conf, pp. 288-289, Feb. 2011.
K. Sengupta and A.Hajimiri, "A 0.28THz 4×4 power-generation and beam-steering array," Proc. IEEE Int. Solid-State Circuits Conf, pp. 256-258, Feb. 2012.
K.Sengupta and A, Hajimiri, "A 0.28 THz Power-Generation and Beam-Steering Array in CMOS Based on Distributed Active Radiators," invited paper for IEEE Journal Solid-State Circuits, pp. 3013-3031, Dec. 2012.
Kaushik Sengupta and Ali Hajimiri, "Sub-THz Beam-forming using Near-field Coupling of Distributed Active Radiator Arrays," IEEE RFIC Symp., Jun. 2011.
Kaushik Dasgupta, Kaushik Sengupta and Ali Hajimiri, "A mm-Wave Segmented Power Mixer", IEEE Trans. Microw. Theory. Tech., vol. 63, No. 4, pp. 1118-1129, Apr. 2015.
Kaushik Dasgupta, Kaushik Sengupta and Ali Hajimiri, "A 19.1 dBm Segmented Power-Mixer Based Multi-Gbps mm-Wave Transmitter in 32nm SOI CMOS",IEEE RFIC Symp.Dig. , Jun. 2014.
Steven Bowers, Kaushik Sengupta, Kaushik Dasgupta and Ali Hajimiri, "A Fully-Integrated Self-Healing Power Amplifier," IEEE RFIC Symp., 2012.

(56) References Cited

OTHER PUBLICATIONS

Steven Bowers, Kaushik Sengupta, Kaushik Dasgupta and Ali Hajimiri, "Integrated Self-Healing for mm-Wave Power Amplifiers," invited paper for IEEE Trans. Microwave Theory and .Techniques. vol. 61, No. 3, Mar. 2013.

* cited by examiner

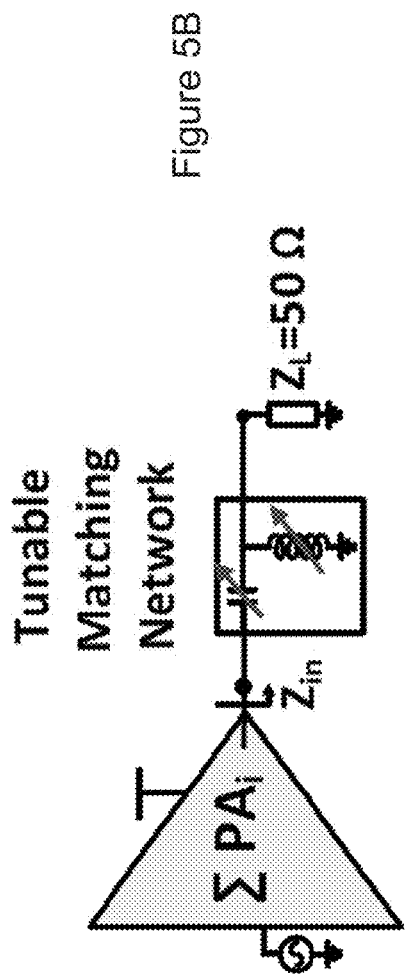
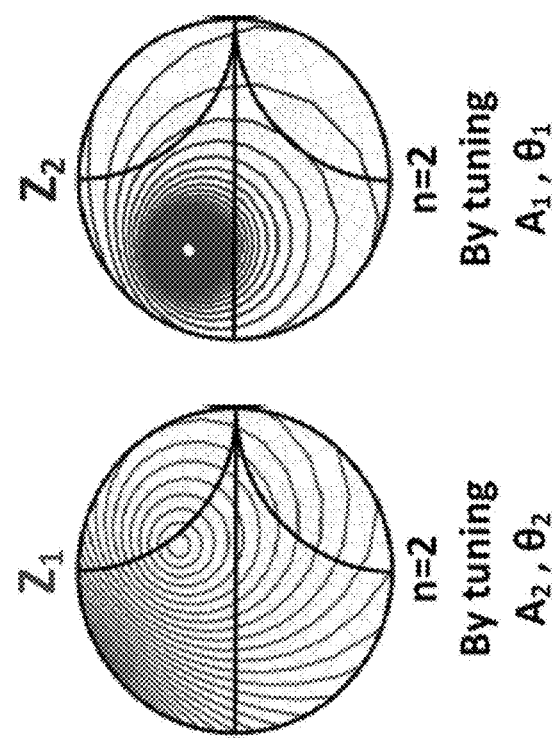
Figure 5B
Figure 5C
Figure 5D

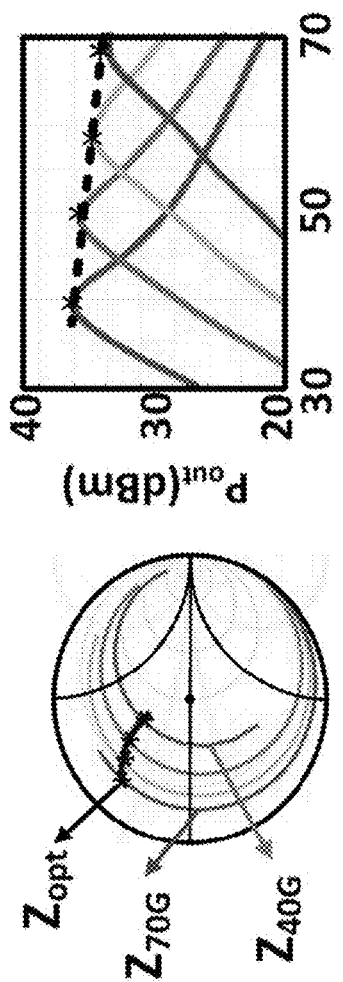
Figure 5E
Figure 5F
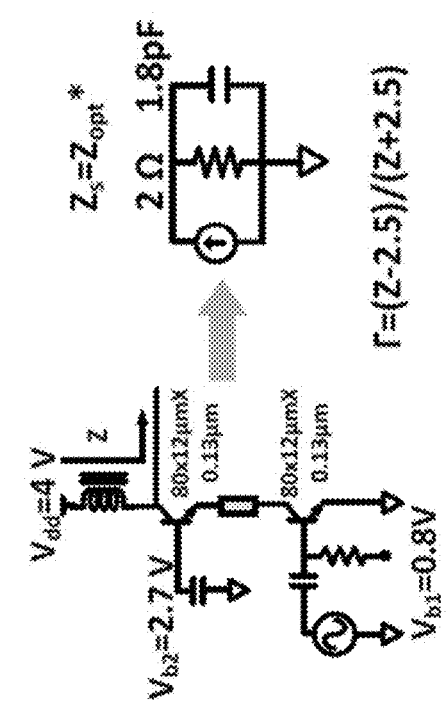
Figure 6A

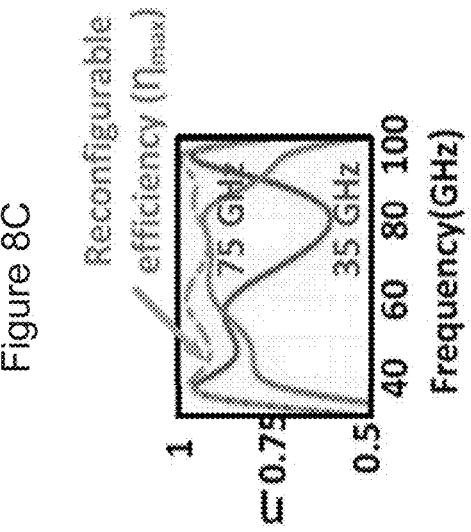
Figure 8C
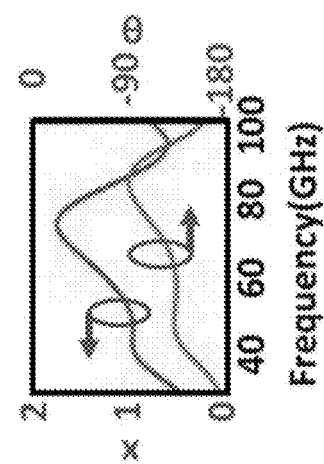
Figure 8E
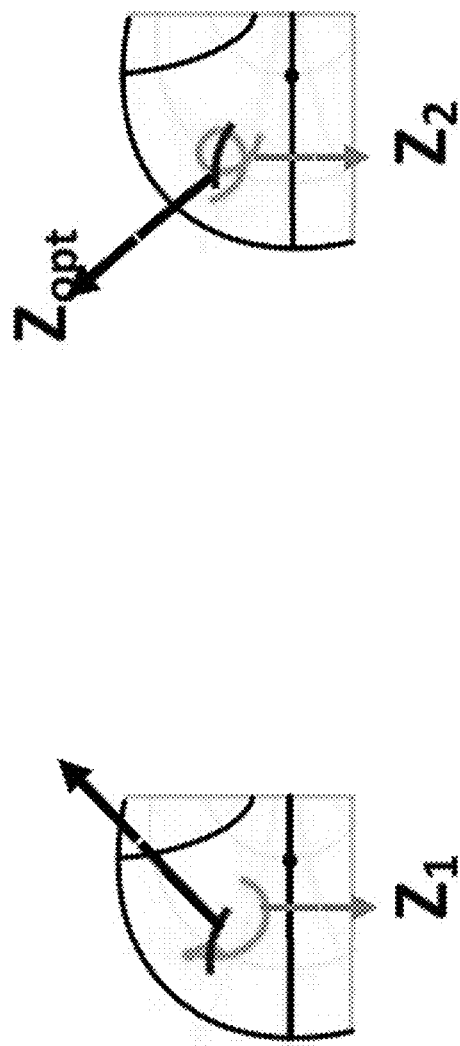
Figure 8B
Figure 8D

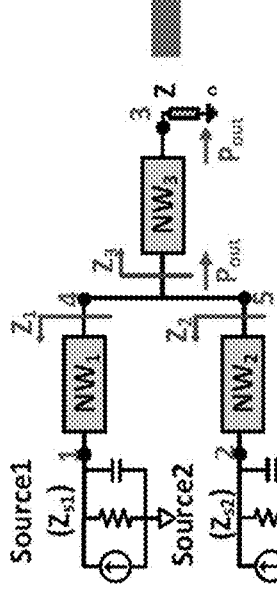
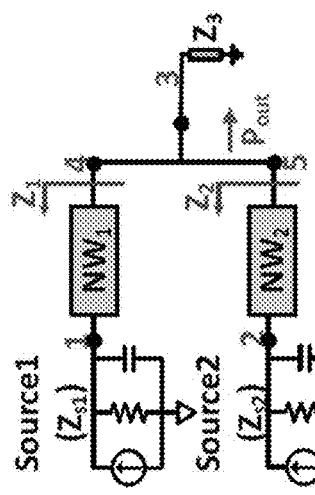
Figure 10A
$\eta_A = |S_{31}|^2 + |S_{32}|^2$ with reference impedances $(Z_{s1}, Z_{s2}, Z_3)$
Figure 10B
$\eta_B = |S_{31}|^2 + |S_{32}|^2$ with reference impedances $(Z_{s1}, Z_{s2}, Z_3)$

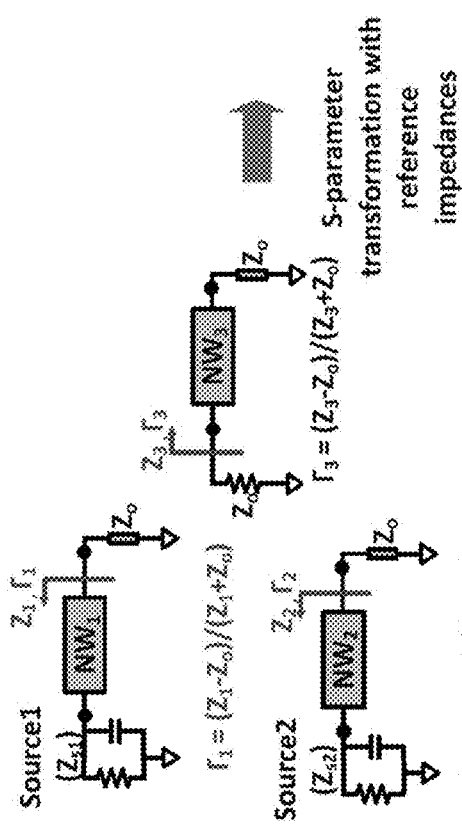
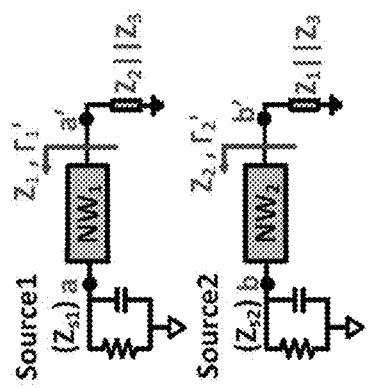
Figure 11A
Figure 11B

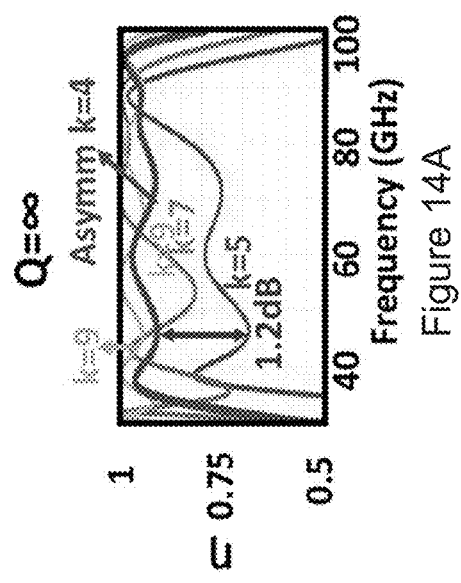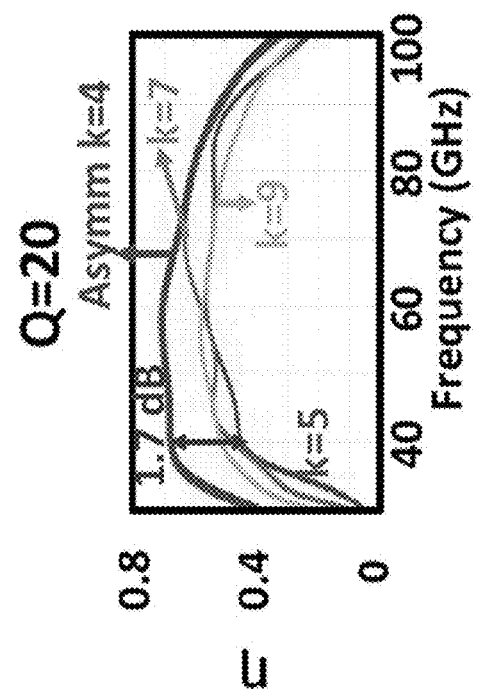
Figure 14A
Figure 14B

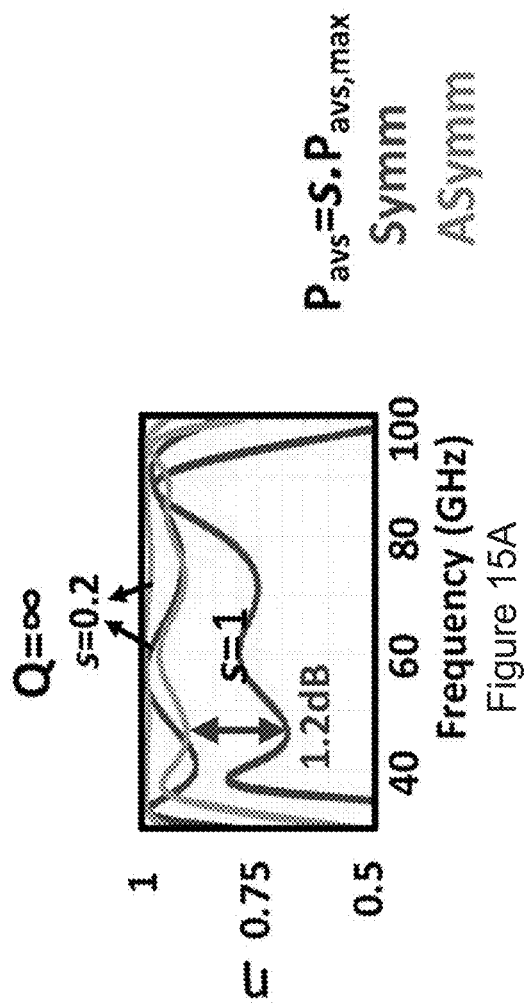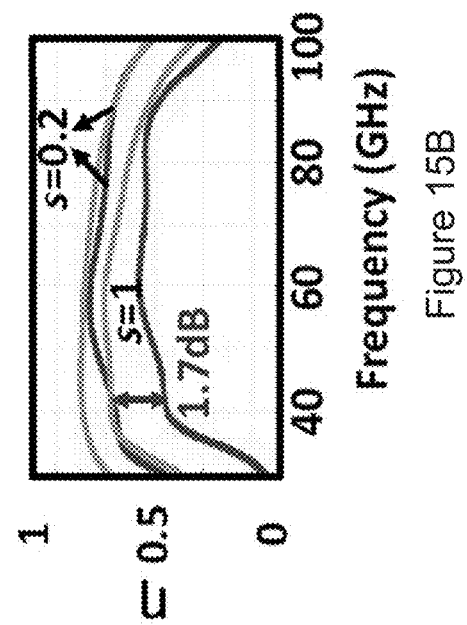
Figure 15A
Figure 15B

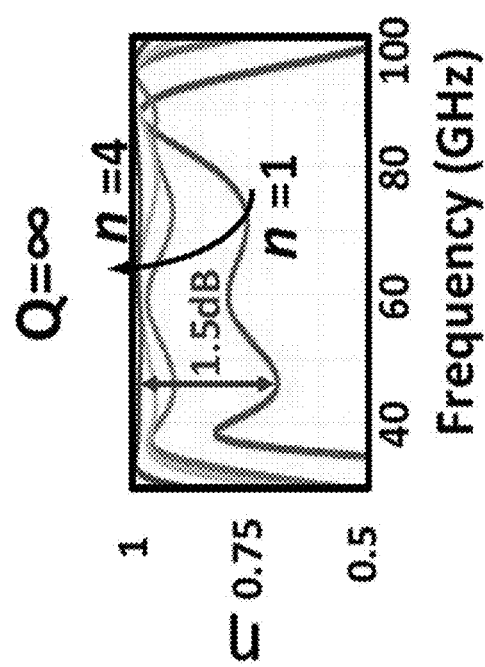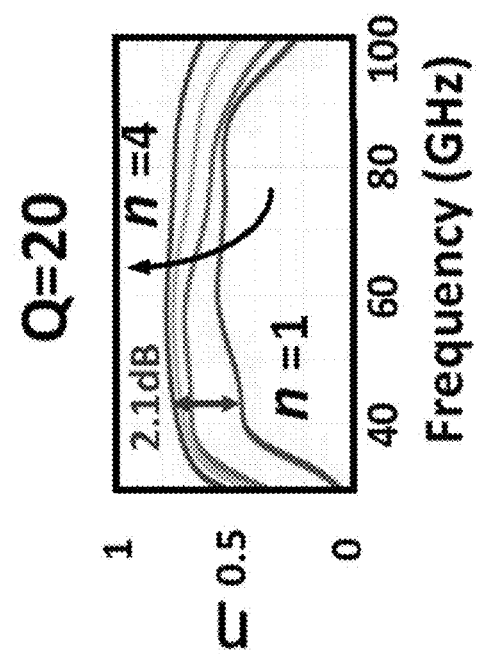
Figure 17A
Figure 17B

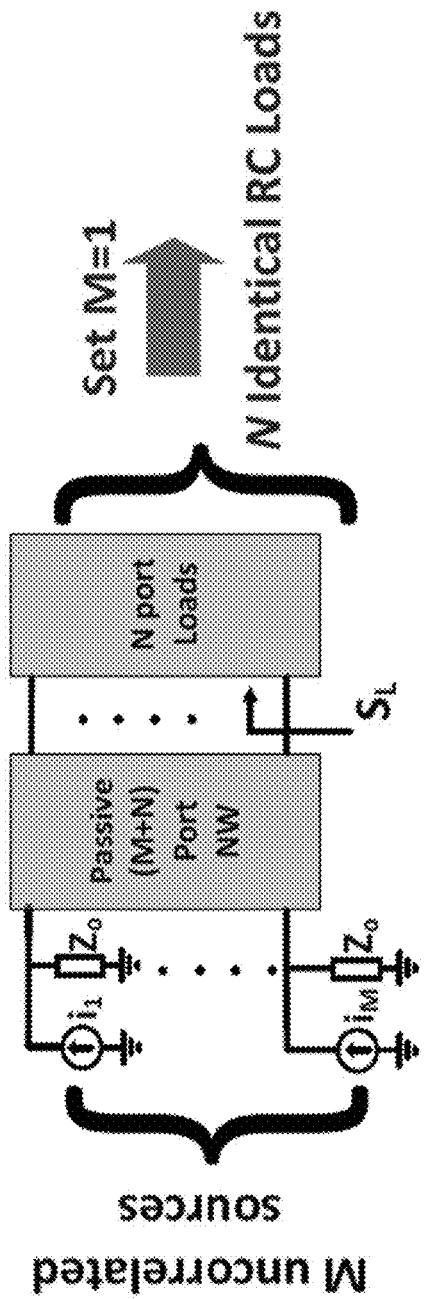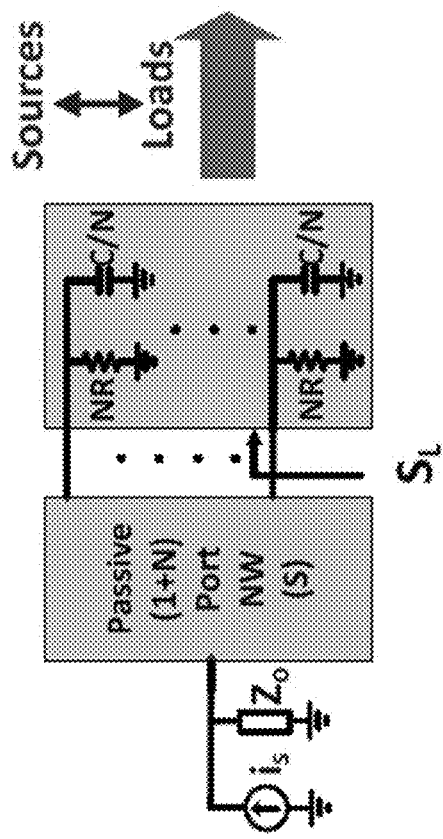
Figure 19A
Figure 19B

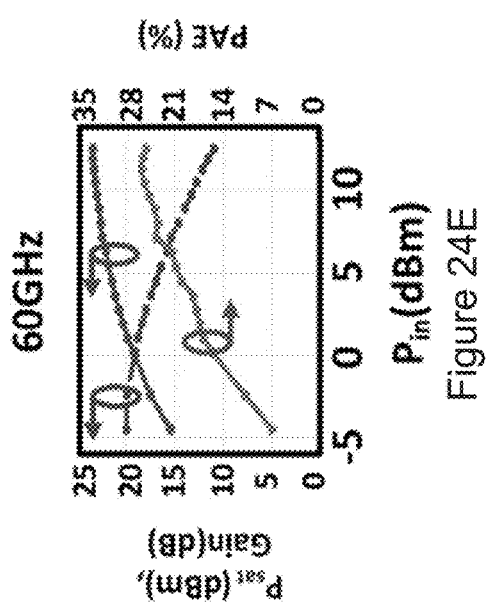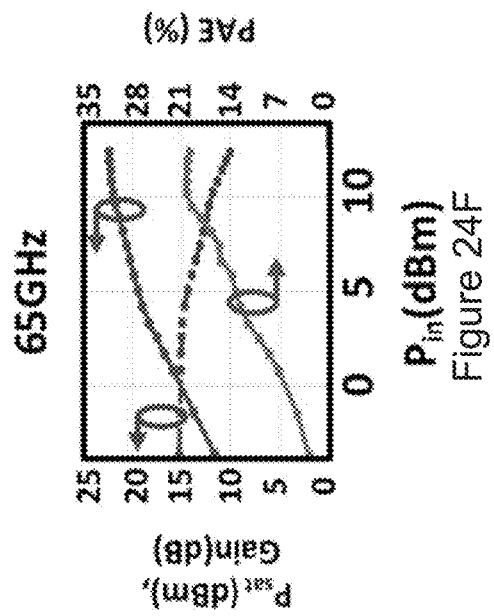
Figure 24E
Figure 24F 14.5dBm, -21.9dB EVM @40G 14.8dBm, -21.2dB EVM @60G

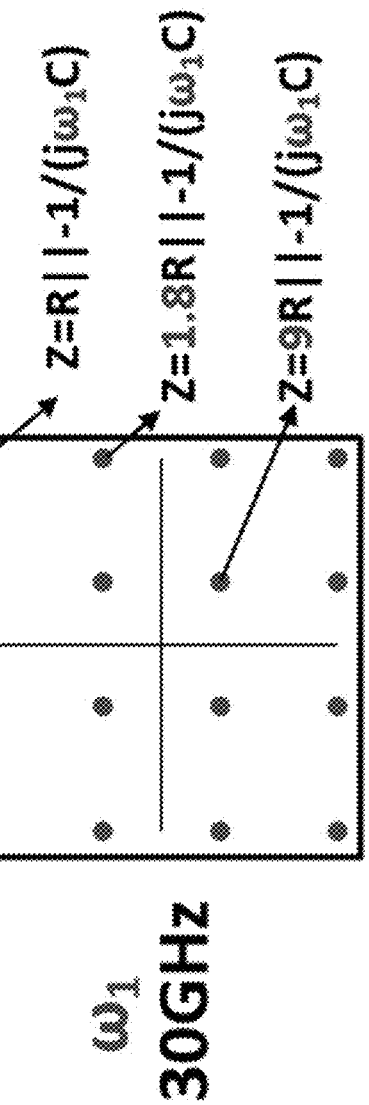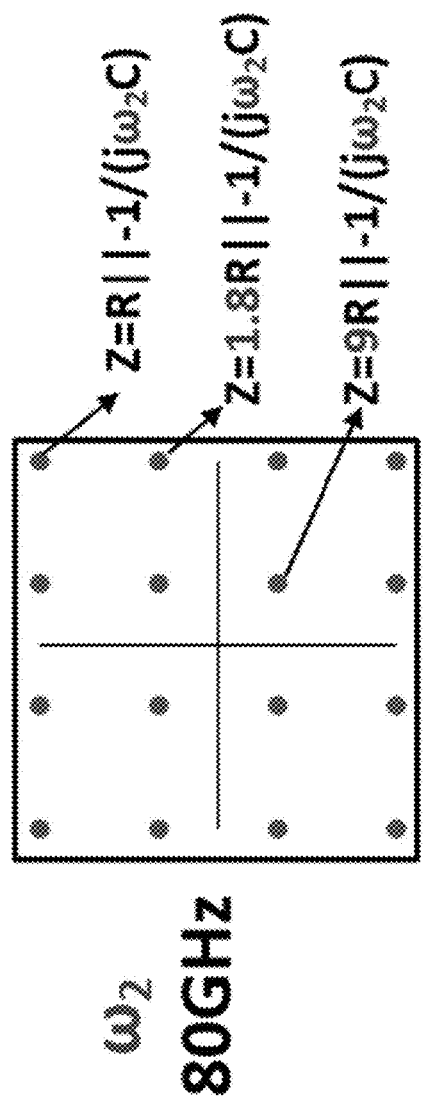

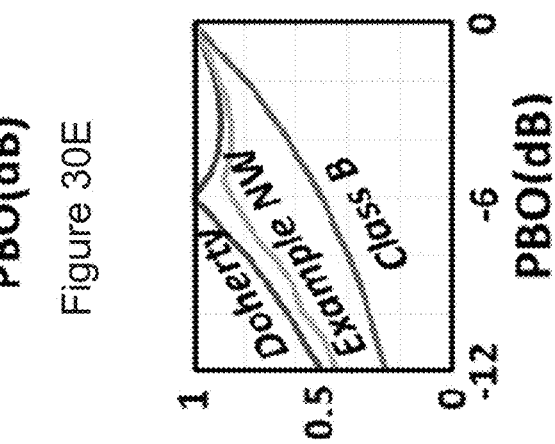
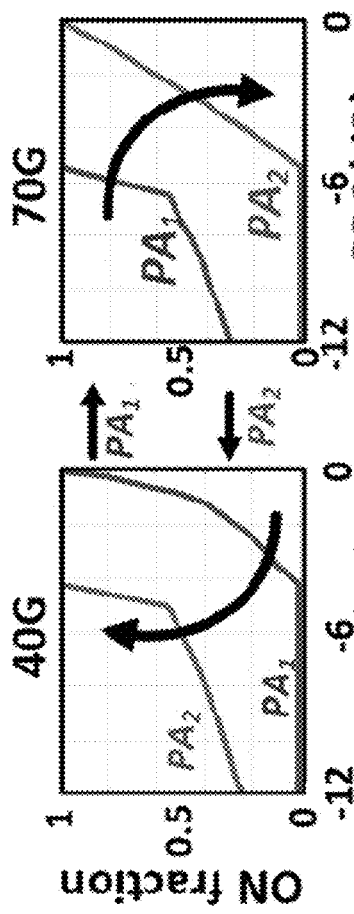
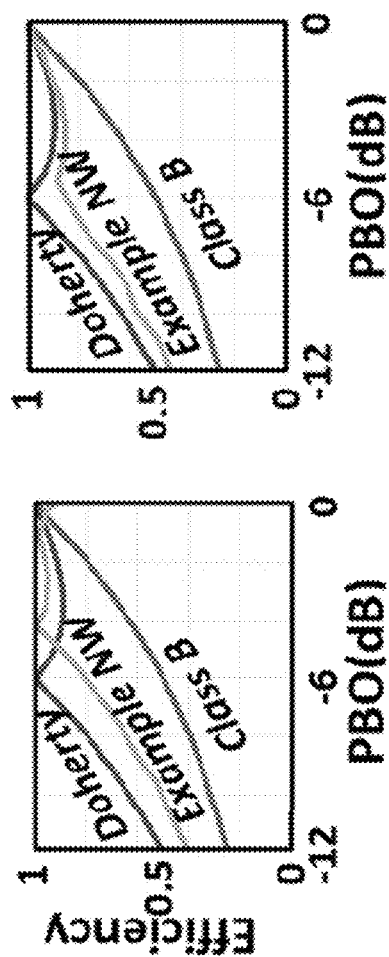

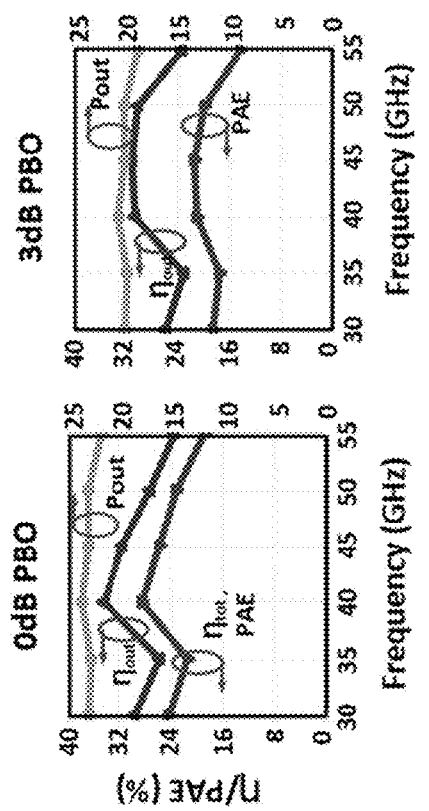
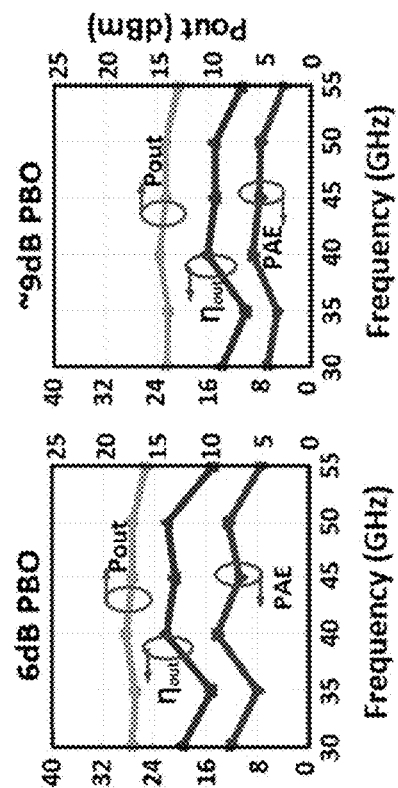
Figure 33A
Figure 33B
Figure 33C
Figure 33D

FREQUENCY AND BACK-OFF RECONFIGURABILITY IN MM-WAVE POWER AMPLIFIERS

CROSS-REFERENCE TO PRIOR FILED APPLICATIONS

This application claims priority to U.S. provisional application 62/312,822, filed Mar. 24, 2016, which is incorporated herein in its entirety.

STATEMENT REGARDING FEDERALLY SPONSORED RESEARCH OR DEVELOPMENT

This invention was made with government support under Grant N00014-15-1-2217 awarded by the Office of Naval Research and Grant ECCS-1408490 awarded by the National Science Foundation. The government has certain rights in the invention.

FIELD OF THE INVENTION

The present disclosure generally relates to the field of high frequency power amplifiers (PAs) and in more particular mm-Wave, frequency-flexible PA architectures which can be reconfigured to operate near-optimally over a wide band of mm-Wave frequencies without lossy variable passive elements.

BACKGROUND

The rapid evolution of mm-Wave integrated technology has demonstrated tremendous application potential across multiple fields from sensing and imaging, gesture recognition to short-range high-speed data communication, mobile backhauls and last-mile connectivity. With the future deployment of 5G mm-Wave wireless communication, and continued evolution of 60 GHz short-range high-speed wireless links, 77 GHz automotive radar and sensing, mm-Wave spectrum is expected to experience proliferation in its usage spanning over a large portion, often non-contiguously. In addition to the availability of wide bandwidth at a single carrier frequency, hyper-spectral imaging and multi-band communication can also fuel novel application development in the frequency range. In order to fully utilize the spectrum with high efficiency, frequency-reconfigurable transceiver architectures are needed which can be programmed to operate efficiently across a broad swathe of the frequency range, in the limit approaching universal front-ends.

SUMMARY OF THE INVENTION

A power amplifier system is disclosed. The power amplifier system amplifies an input having a carrier frequency having an amplitude and phase and generates an amplified output. The system includes plurality of n amplifiers coupled to an asymmetrical combiner, the asymmetrical combiner being formed of a passive network, each amplifier has an input and an output, the asymmetrical combiner has a plurality of inputs and an output, the output of each amplifier is coupled to an input of the asymmetrical combiner, an impedance viewed at the output of each of the n amplifiers is a function of the amplitude and phase at each of the other n−1 amplifiers. An amplitude/phase controller is coupled to the plurality of n amplifiers or the asymmetrical combiner to control the amplitude and phase at the asymmetrical combiner input. The amplitude/phase controller is configured to present an amplitude/phase at each input of the asymmetrical combiner to target an optimal impedance at the carrier frequency for each of the plurality of n amplifiers.

Each of the n amplifiers may have a control port configured to receive a control output to control the amplitude/phase of the generated at the amplifier output. The control output may be configured as a bias control in each of the n amplifiers. The control output may be realized with a separate active device connected to each of the plurality of n amplifiers. The asymmetrical combiner may comprise a passive network including a one or more of the following: inductors, capacitors, transmission lines and transformers. An input distribution network may be coupled to the input of each of the n amplifiers. The input distribution network may include amplitude and/or phase control.

The amplitude/phase controller may comprise at least one of variable capacitors, variable inductors and variable delay lines. The amplitude/phase controller may be configured to control amplitude/phase by vector summation of in-phase and quadrature phase input signal. The amplitude/phase controller may be configured for improving linearity at least one of the plurality of n amplifiers. The amplitude/phase controller may be configured for reducing AM-AM and/or AM-PM distortion of at least one of the plurality of n amplifiers. The amplitude/phase controller may be configured for reducing antenna impedance mismatches. The system may also include a sensor for measuring output power so that amplitude/phase controller may be controlled in a feedback fashion based on the measured output power.

Another power amplifier system for amplifying an input generating an amplified output is disclosed. The system includes a plurality of n amplifier cells, each amplifier cell comprising an array of unit amplifiers, each of the n amplifier cells being coupled to an asymmetrical combiner, each amplifier cell having a set of driving conditions, the asymmetrical combiner being formed of a passive network, each amplifier cell has an input and an output, the asymmetrical combiner has a plurality of inputs and an output, the output of each amplifier cell is coupled to an input of the asymmetrical combiner, the impedance viewed at the output of each of the n amplifier cells is a function of the driving conditions of the other n−1 amplifier cells. A driving condition controller is coupled to the plurality of n amplifier cells to control driving conditions at the input of the asymmetrical combiner to target an optimal impedance for back-off operation, wherein the driving conditions include: codes defining a fraction of the unit amplifiers being switched on, or a duty cycle for each of the unit amplifiers and/or amplitude/phase.

The driving condition controller may be configured to present an amplitude/phase at each input of the asymmetrical combiner to establish an optimal impedance to each of the plurality of n amplifier cell. Each of the n amplifier cells may have a control port configured to receive a control output to control the amplitude/phase of the generated at the amplifier output. The control output may be configured as a bias control in each of the n amplifier unit cells. The control output may be realized with a separate active device connected to each of the plurality of n amplifiers. The asymmetrical combiner may comprise a passive network including a combination of inductors, capacitors, transmission lines or transformers. An input distribution network may be coupled to the input of each of the n amplifiers. The input distribution network may include amplitude and/or phase control.

The driving condition controller may comprise variable capacitors and/or inductors. The driving condition controller may be configured to control amplitude/phase by vector summation of in-phase and quadrature phase input signal. Each of the n amplifier cells may be configured to receive a control output comprising a plurality of bits configured for optimal back-off operation. The control bits may be modulated to impart amplitude information in a phase rotated signal. The driving condition controller may be configured to improve linearity of at least one the plurality of n amplifiers. The driving condition controller may be configured for reducing AM-AM and/or AM-PM distortion of at least one of the plurality of n amplifier cells. The driving condition controller may be configured for reducing antenna impedance mismatches. The system may also include a sensor for measuring output power so that driving condition controller may be controlled in a feedback fashion based on the measured output power.

Figure 3A:
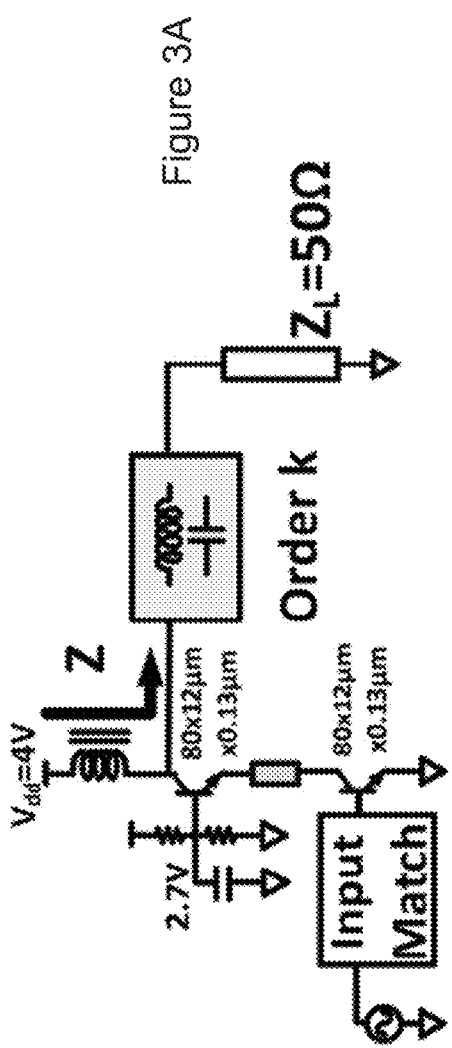
FIG. 3A shows an example of a unit PA cell with stacked architecture with simulated optimal $P_{out} \approx 4$ W at 40 GHz.
Figure 3B:
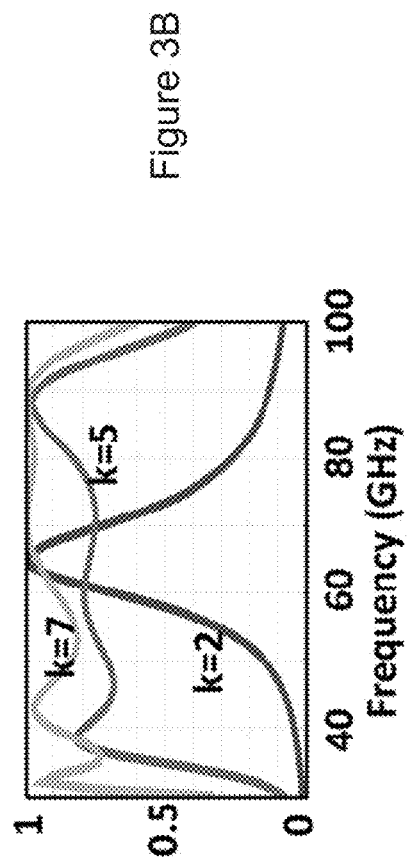
FIG. 3B is a graph that shows variation of power delivery efficiency $$\left(\eta = \frac{P_L}{P_{avs}}\right)$$
Figure 3C:
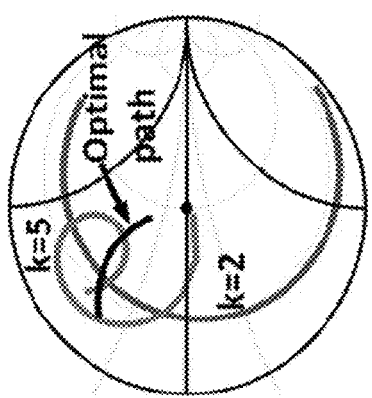
Figure 4A:
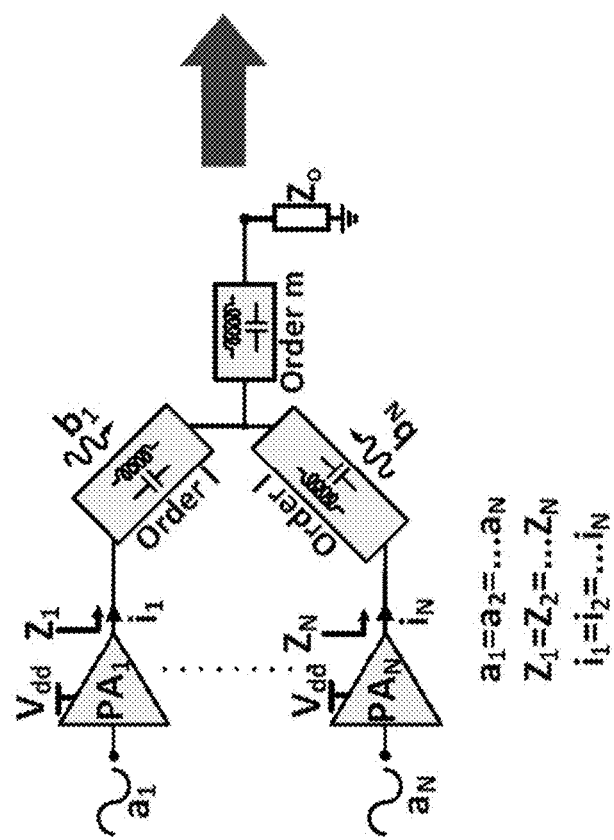
Figure 4B:
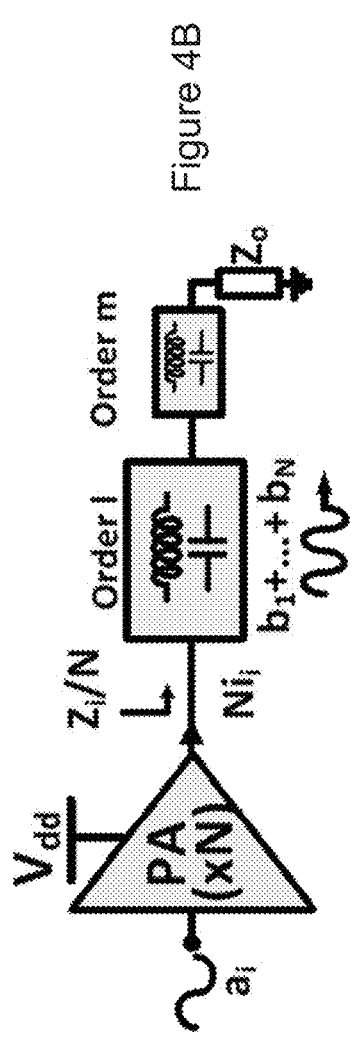
Figure 5A:
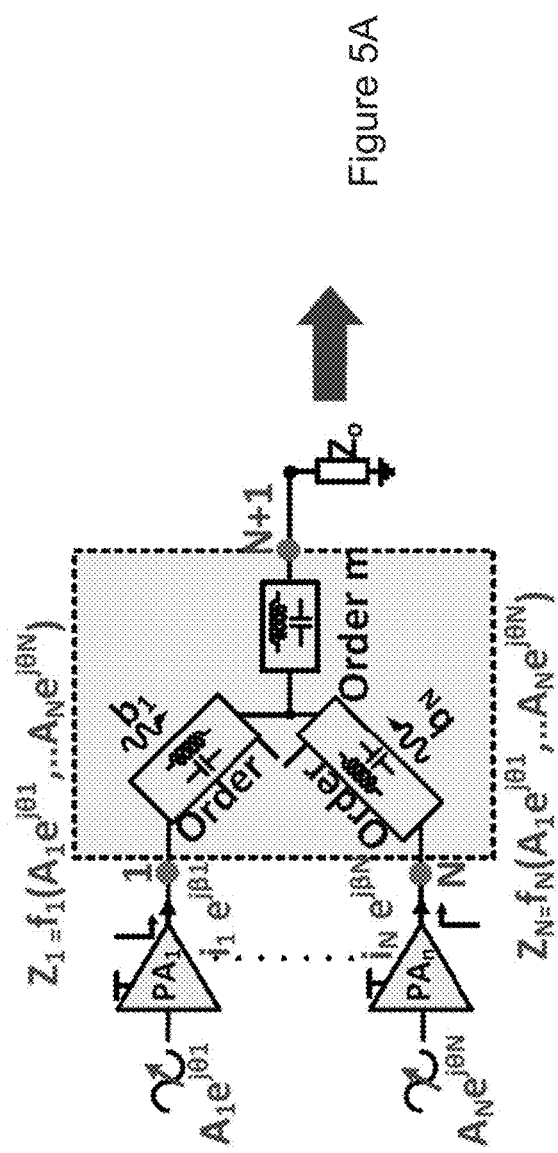
Figure 6C:
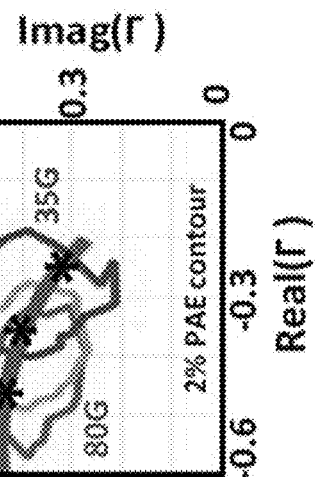
Figure 6B:
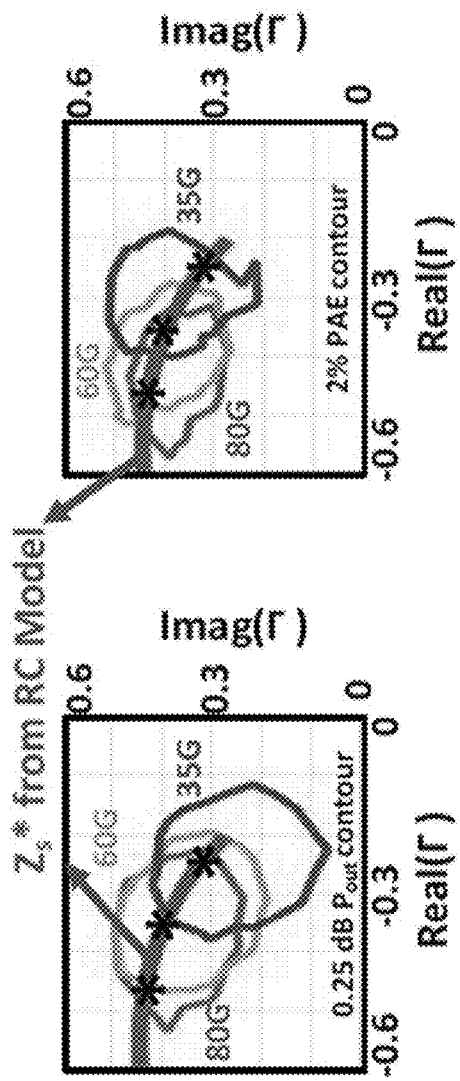
Figure 7A:
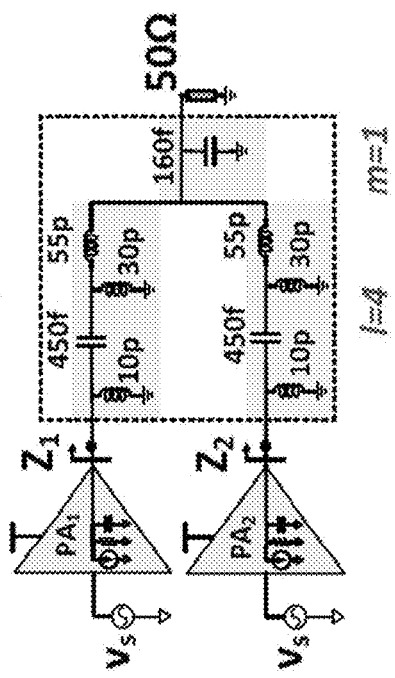
Figure 7D:
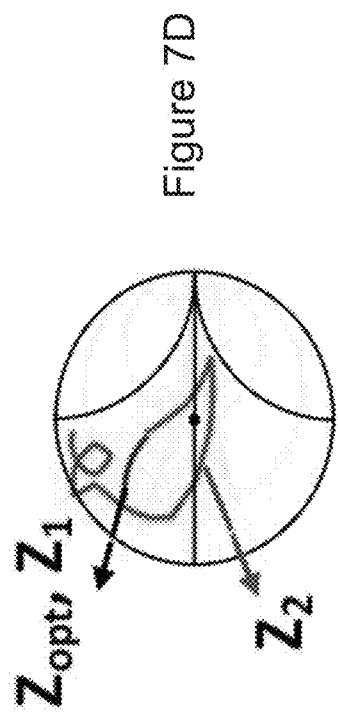
Figure 7E:
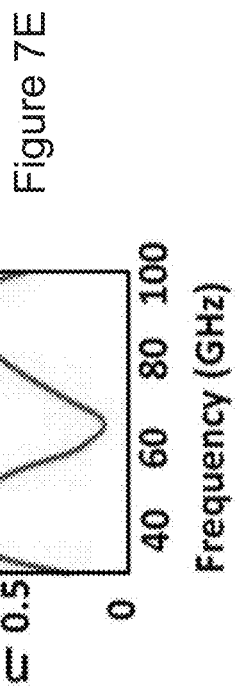
Figure 7B:
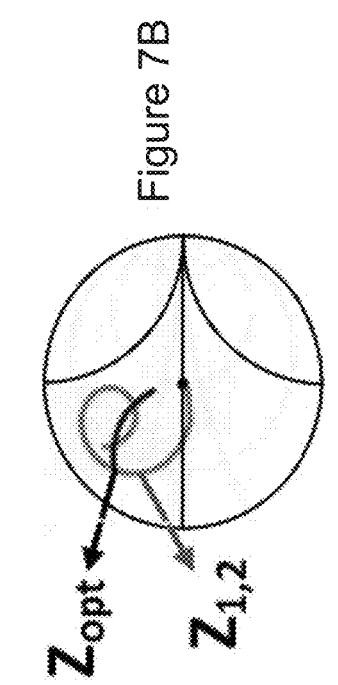
Figure 7C:
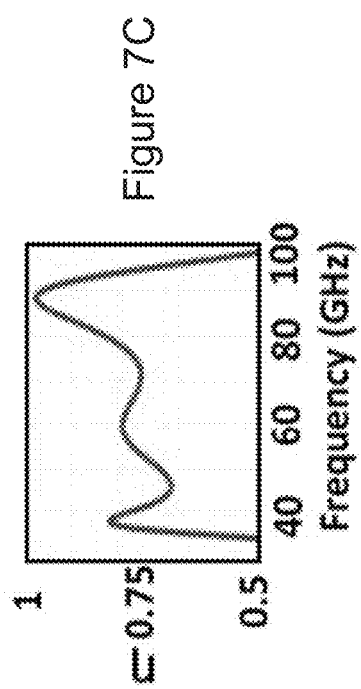
Figure 8A:
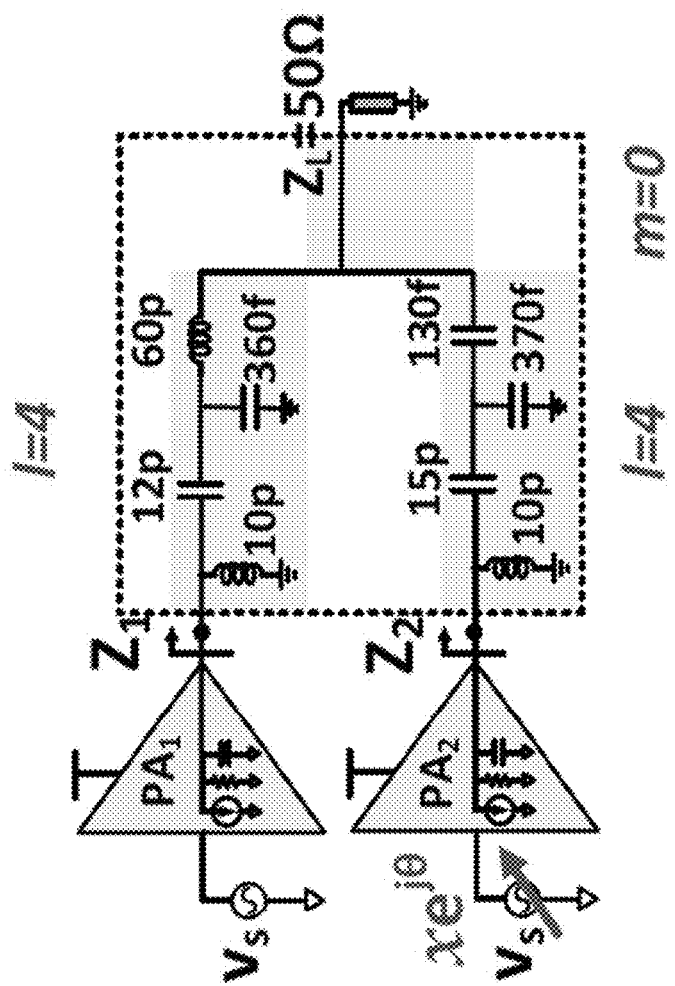
Figure 9A:
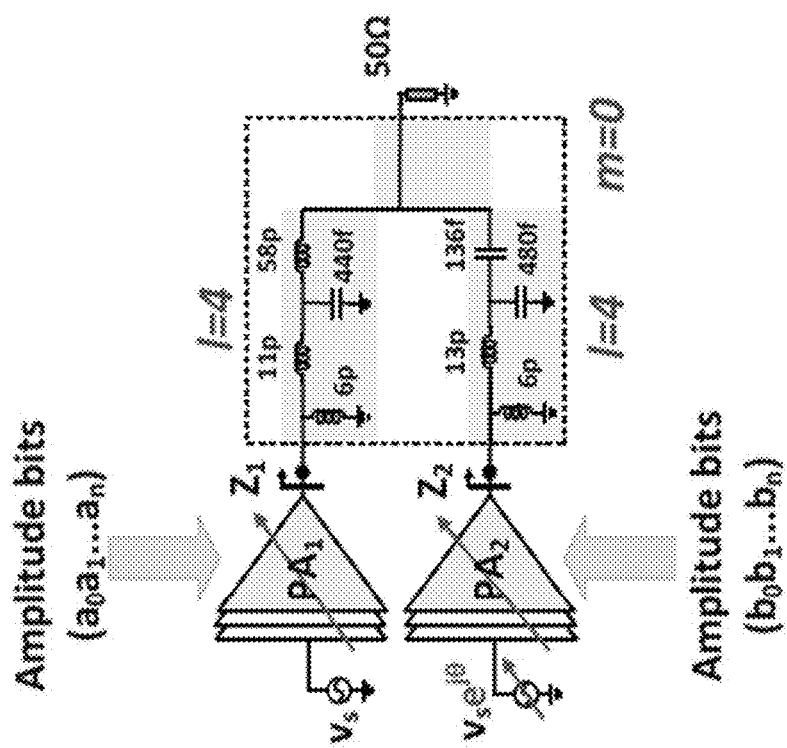
Figure 9C:
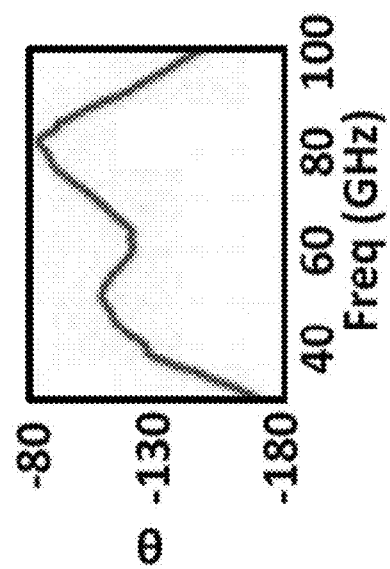
Figure 9B:
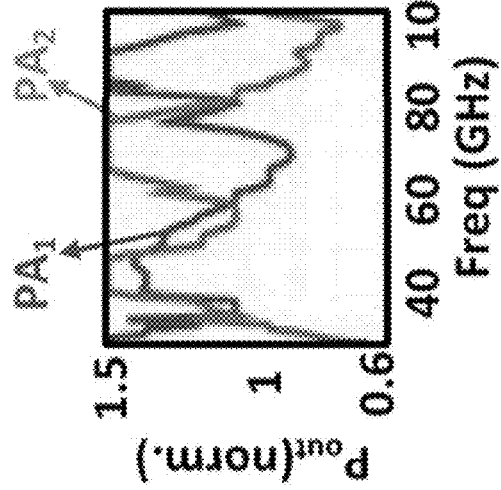
Figure 9E:
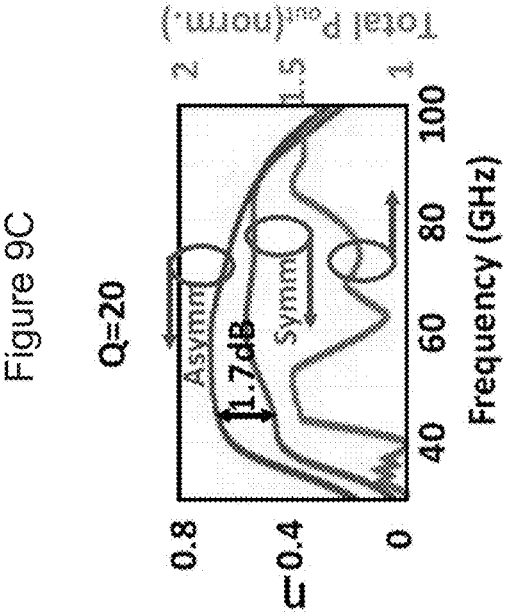
Figure 9D:
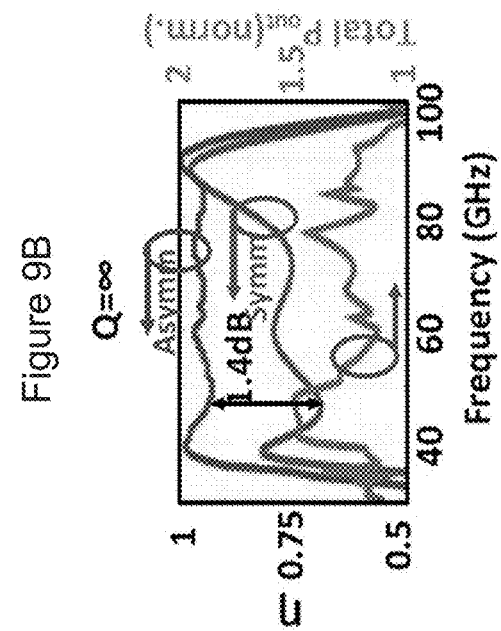
Figure 12A:
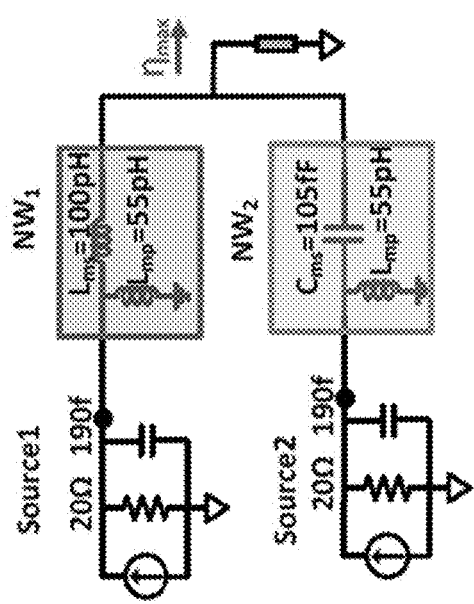
Figure 12B:
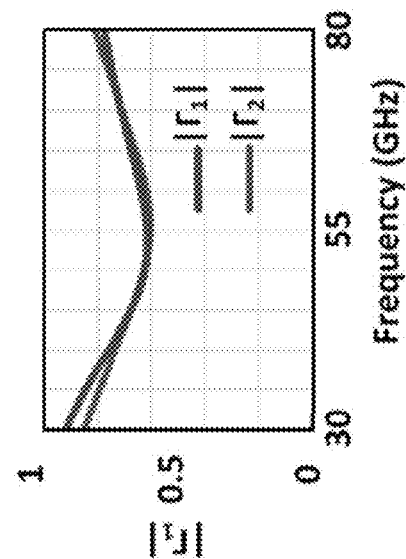
Figure 12C:
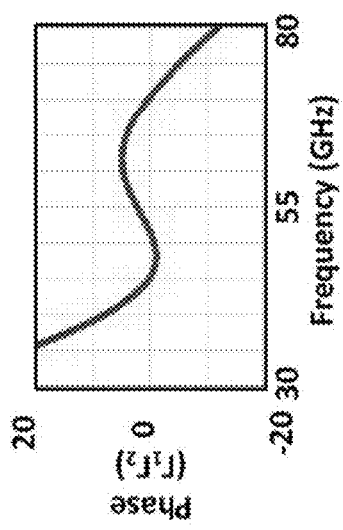
Figure 12D:
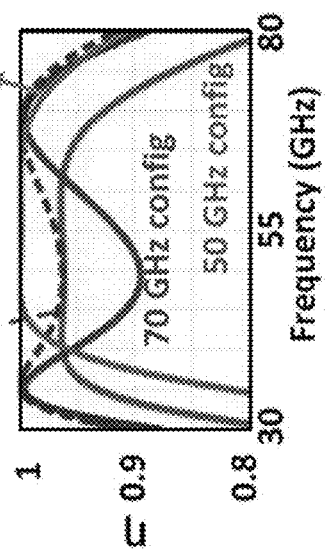
Figure 13A:
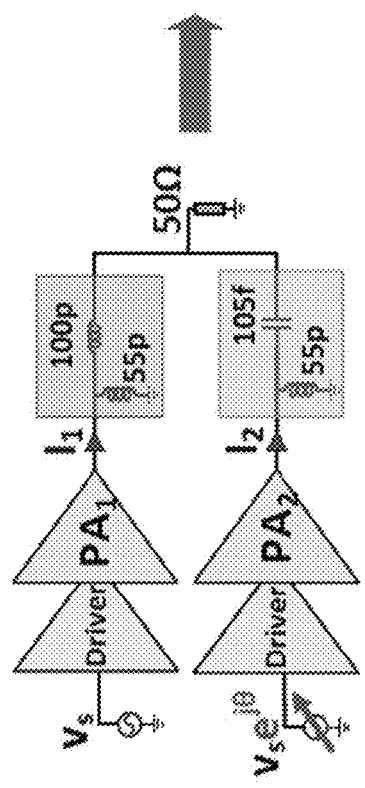
Figure 13B:
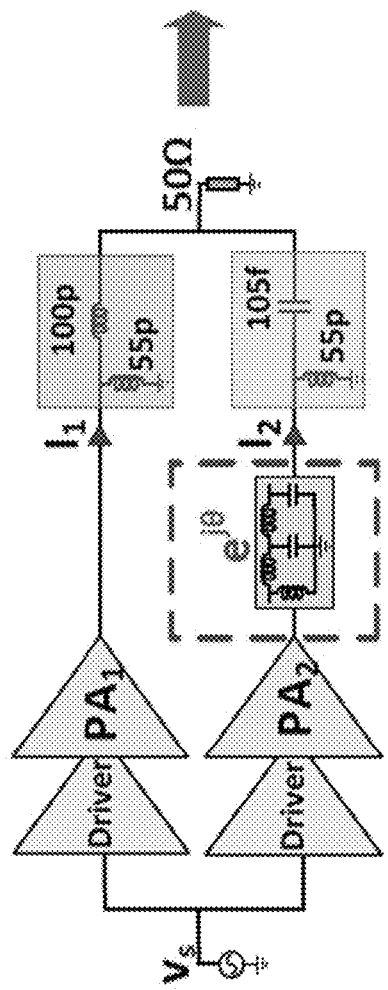
Figure 13C:
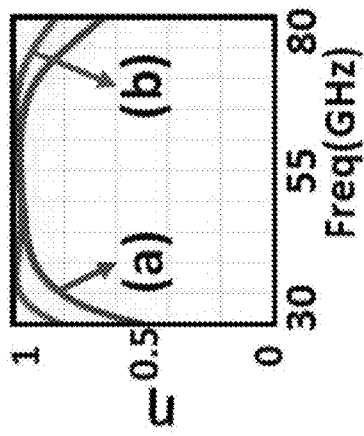
Figure 13D:
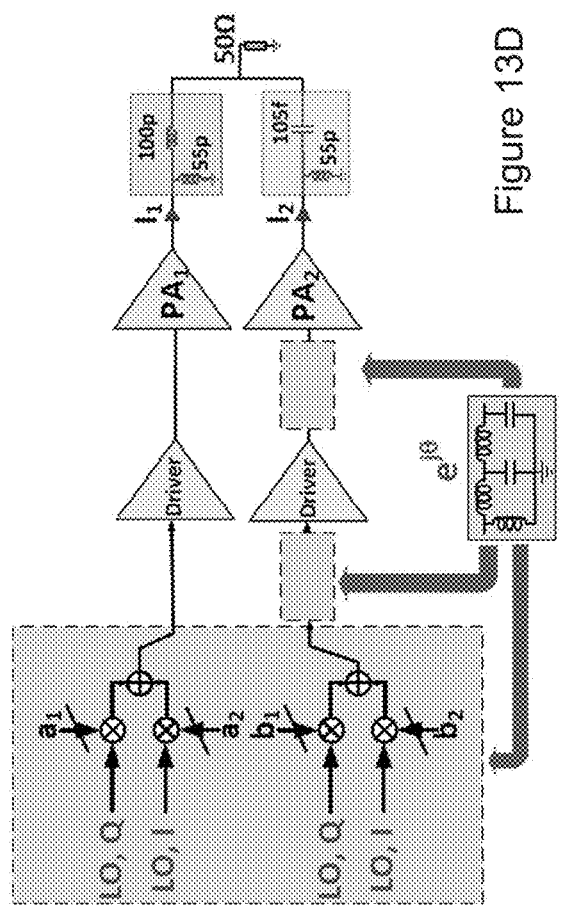
Figure 13E:
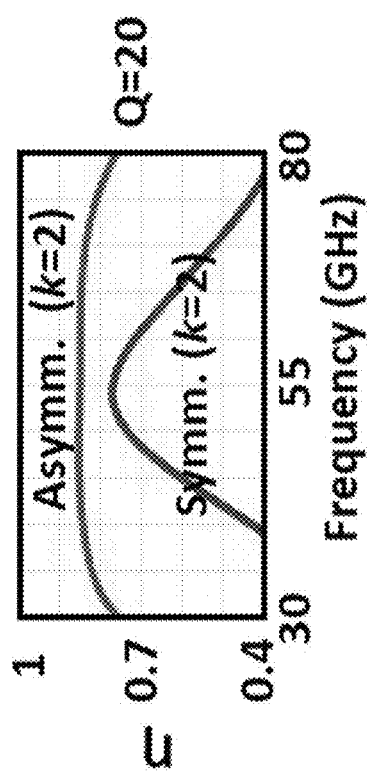
Figure 13F:
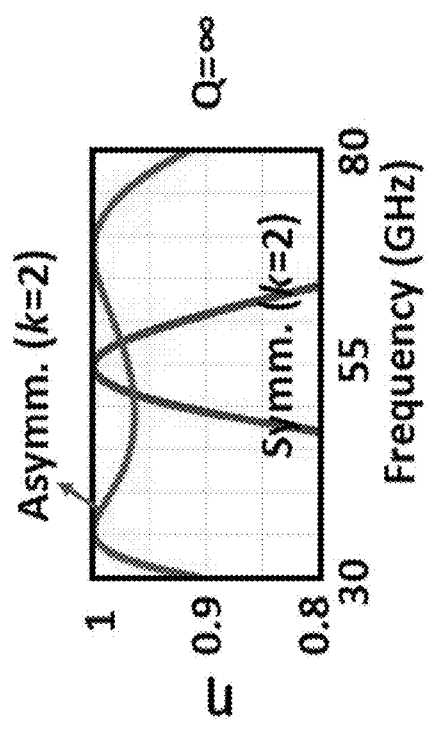
Figure 16A:
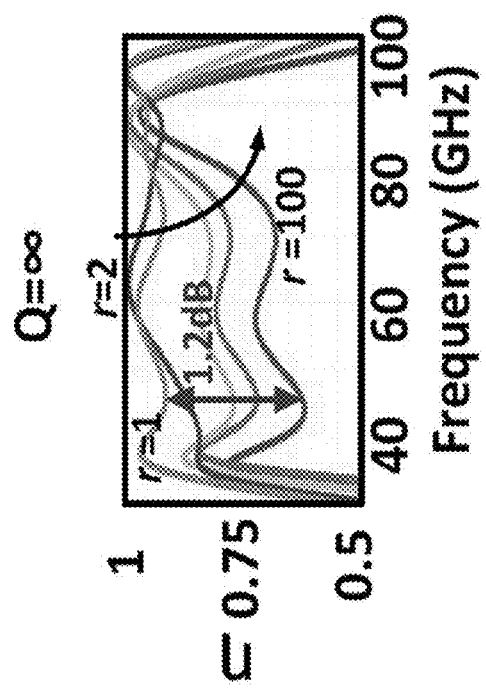
Figure 16B:
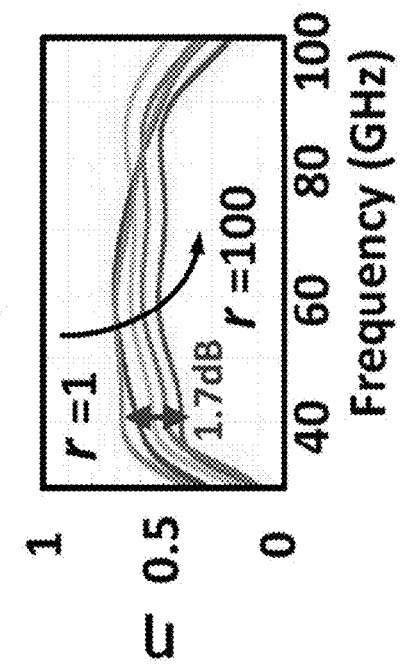
Figure 18A:
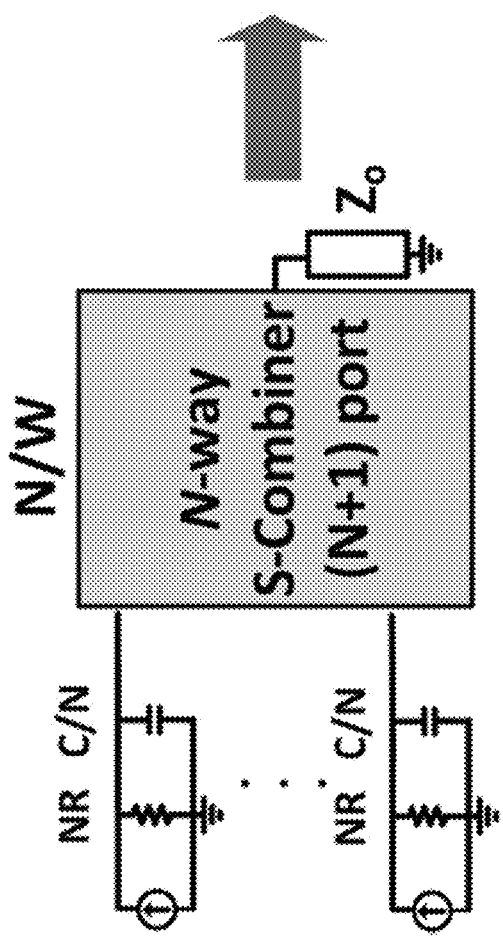
Figure 18B:
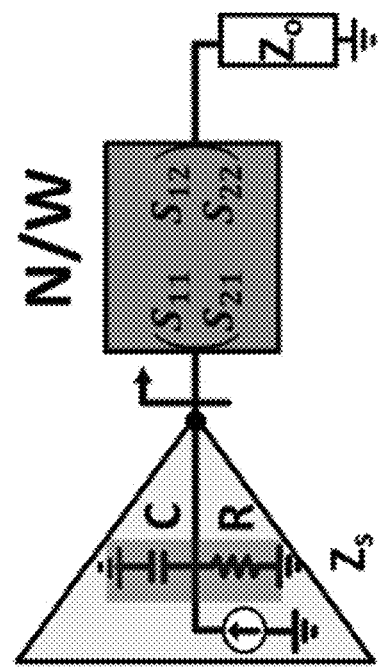
Figure 19C:
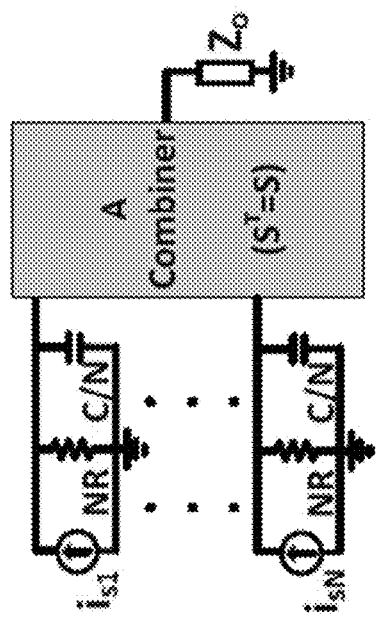
Figure 19D:
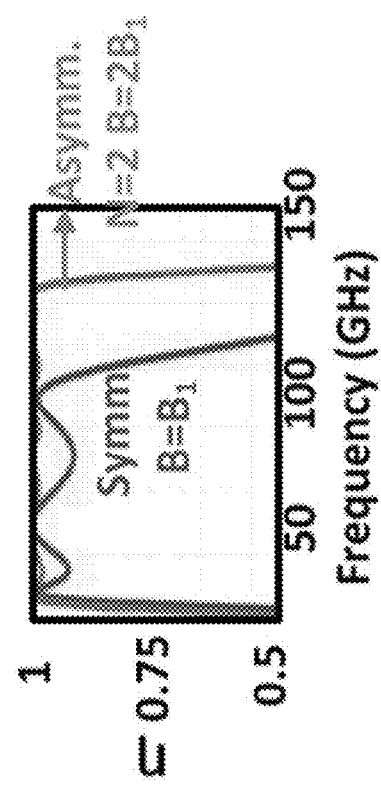
Figure 20A:
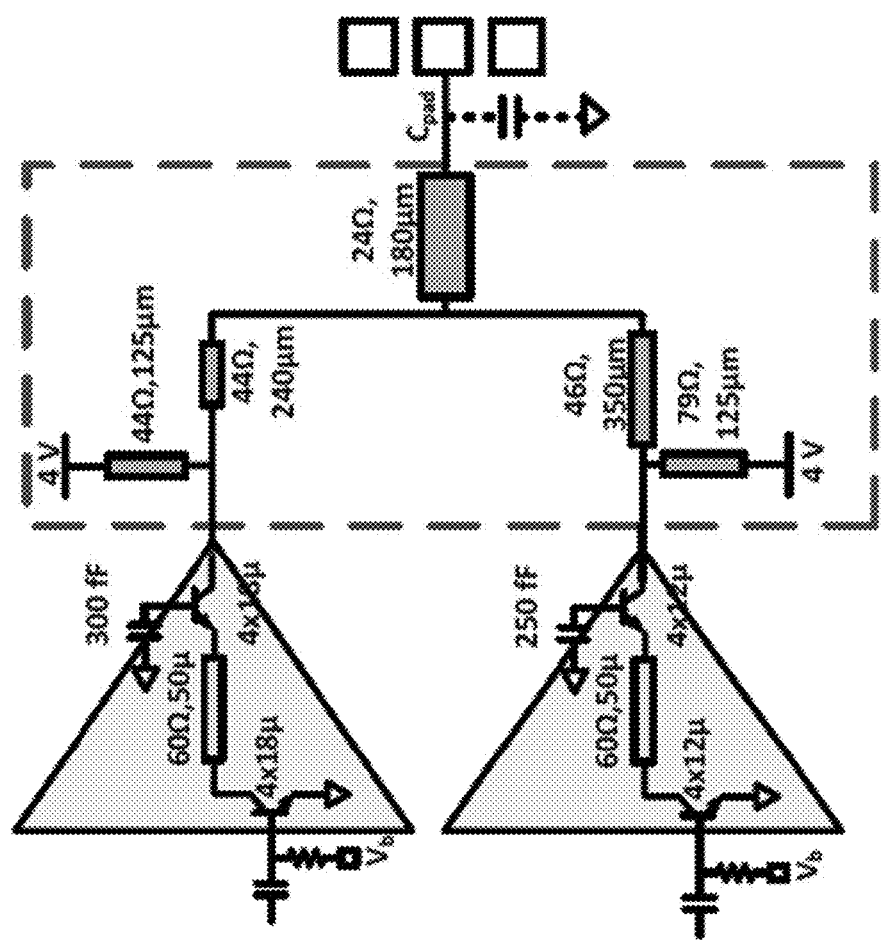
Figure 20B:
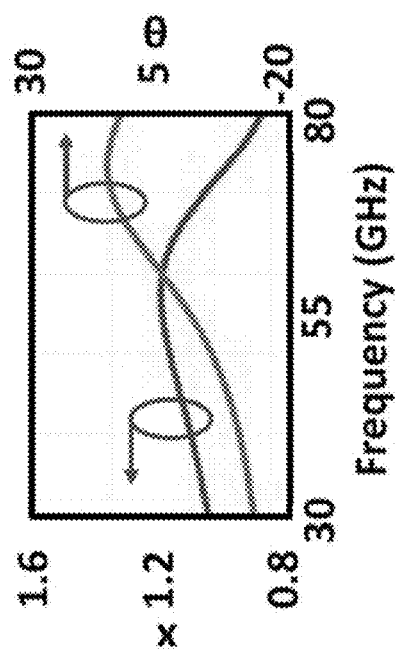
Figure 20C:
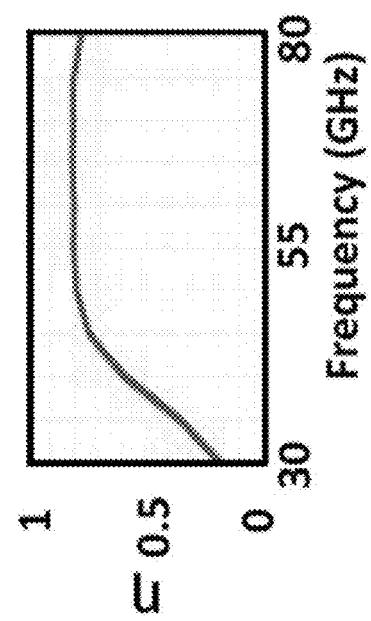

for lossless networks of different orders (k) across frequencies from the amplifier cell;

FIG. 3C is a Smith Chart showing optimal load-pull path against frequency and convergence of impedance paths followed by matching networks with increasing order towards the optimal one;

FIGS. 4A and 4B are circuit diagram showing that a traditional current combined N-way symmetrical PA architecture (FIG. 4A) is functionally similar to a single larger PA (of size xN) with a matching network of order k=l+m (FIG. 4B);

FIGS. 5A and 5B are circuit diagram showing asymmetrical PA architecture with actively synthesized impedances for the combining cells that allows frequency-reconfiguration (FIG. 5A) operation similar to classical PA with ideal tunable matching network (FIG. 5B);

FIGS. 5C and 5D are Smith Chart examples of impedance variation of one PA cell as the driving condition of the other PA cell is varied in an asymmetrical combiner;

FIGS. 5E and 5F are charts showing a conceptual representation of the impedance variation and output power for the frequency-reconfigurable PA which allows the architecture to trace the peaks of the individual plots for optimal operation across the range;

FIGS. 6A and 6B are circuit diagrams showing a linearized model of a PA output cell consisting of a stacked SiGe topology with intra-transistor matching for output network analysis and synthesis;

FIG. 6C is a graphs showing a comparison of optimal load-pull path ($Z_{opt}$) obtained through nonlinear simulations against $Z_s^*$ showing close correspondence and validity of the model for predicting $Z_{opt}$ against frequency;

FIG. 7A is a circuit diagram showing an example of an optimized 2-way symmetrical architecture with a fifth order lossless network (k=l+m=5) with combined PA cell size identical to the one in FIG. 6 (PA1=PA2);

FIGS. 7B and 7C are graphs showing identical impedance path seen by each PA with symmetric excitation and efficiency of power delivery to the load;

FIGS. 7D and 7E are graphs showing paths followed by the two PAs under asymmetric excitation when one PA cell is presented the optimal load-pull path. The deviation of the other PA from the ideal path results in degradation of net efficiency implying symmetric excitation is optimal at any frequency for symmetric combiners;

FIG. 8A is a circuit diagram showing an example of a two-way asymmetrical architecture with the same PA cells (PA1=PA2) as in FIG. 7;

FIGS. 8B and 8C are graphs showing impedance paths followed by both the cells follow closely the load-pull path when driven optimally;

FIGS. 8D and 8E are graphs showing the optimal driving conditions ($x_i$) across frequencies and the efficiency of power delivery when re-configured for two sets of driving conditions at 35 GHz and 75 GHz. Achievable maximum efficiency traces the peaks of all such frequency-specific configured curves as seen by the dotted line;

FIG. 9A is a circuit diagram showing an example of a digital PA architecture where amplitude control is achieved through asymmetric switching of the PA cells;

FIGS. 9b and 9C are graphs showing the total output power from each cell across frequency normalized to that in a symmetrical combiner and phase control across the frequency of operation;

FIGS. 9D and 9E are graphs showing a comparison of efficiency of the A-combiner and S-combiner for ideal and lossy passives. The total output power of the A-combiner normalized to the S-combiner shows higher power delivery with higher efficiency across the frequency with almost 50% improvement in efficiency and output power over certain frequency range for lossy passives for the design example presented;

FIG. 10A is a circuit diagram showing synthesis of a two-way asymmetric combiner with ideal passives with each source being modeled with their complex output impedance $Z_{s1,2} = Z_{opt1,2}^*$;

FIG. 10B is a circuit diagram showing a simplification of the 3-port network by encompassing the network $NW_3$ into one impedance $Z_3$ and the lossless nature of the passives ensures $\eta_A = \eta_B$. This decouples the 3-port network problem into the synthesis of two 2-port networks;

FIG. 11A is a circuit diagram representing the port impedances by their reflection coefficients with a reference load $Z_0$;

FIG. 11B is a circuit diagram showing transformation of the S-parameter with change in reference impedance;

FIG. 12A is a circuit diagram showing synthesis and optimization of an asymmetric combiner;

FIGS. 12B and 12C are graphs showing the synthesized network establishes $\Gamma_2 \approx \Gamma_1^*$ across the frequencies 40-70 GHz which establishes optimal efficiency and peak operation of both the cells;

FIG. 12D is a graph showing power delivery efficiency of the synthesized network demonstrating reconfigurable η>90% across 40-80 GHz and can be optimized with slight tuning of the parameters covering 30-80 GHz. The figure also shows the efficiency variation when the PA is reconfigured for optimal operation at two frequencies namely 50 GHz and 70 GHz;

FIGS. 13A and 13B are circuit diagrams showing intuitive understanding of the broadband nature of A-architecture by enabling the phase control with passive elements leading to an effective broadband higher-order output combining network;

FIG. 13C is a graph showing a comparison of the maximum efficiency of FIGS. 13A and 13B;

FIG. 13D is a circuit diagram showing dissociating the broadband higher-order output network and encompassing the phase shifter either at baseband, or at the input or at the intermediate stage minimizing output combiner loss;

FIGS. 13E and 13F are graphs showing a comparison of the A-architecture vs optimized S-architecture for ideal and lossy passives;

FIGS. 14A and 14B are graphs showing achievable reconfigurable efficiency for a 2-way A-combiner with k=4 vs optimized S-combiners with k=5, 7, 9 for (a) ideal passives and (b) finite Q passives;

FIGS. 15A and 15B are graphs showing achievable reconfigurable efficiency for a 2-way A-combiner with k=4 vs optimized S-combiner with k=5 for various power-scaling factors 'ss' (=0.2, 1) for ideal passives (FIG. 15A) and finite Q passives (FIG. 15B);

FIGS. 16A and 16B are graphs showing achievable reconfigurable efficiency for a 2-way A-combiner with k=4/5 for various size ratios 'r'. Here, $PA_1$ sized r times $PA_2$ for the same total PA size and output power. η for such 2-way A-combiner with ideal (FIG. 16A) and finite Q passives (FIG. 16B) for different values of r varying from 1 to 100;

FIGS. 17A and 17B are graphs showing variation of reconfigurable efficiency for a N-way A-combiner with k<5 for various number of combining elements (N) for constant output power for ideal (FIG. 17A) and lossy passives (FIG. 17B);

FIGS. 18A and 18B are circuit diagrams showing bandwidth bounds for a N-way symmetrical combiner is identical to that of a two-port network with scaled impedances;

FIG. 19A is a circuit diagram showing a general (N+M) port passive network with M uncorrelated sources driving N loads defined by load S matrix ($S_L$) whose bound scales as N/M;

FIG. 19B is a circuit diagram showing that by setting M=1 and N identical RC loads in FIG. 19A to arrive at FIG. 19B which has N-times higher bound than a single RC network;

FIG. 19C is a circuit diagram showing an A-architecture with a combiner employing N-sources with scaled output impedances (NR,C/N) driving a single load $Z_o$ (obtained by interchanging the sources and loads) has N-times bound compared to a S-architecture;

FIG. 19D is a graph showing a simulation of the bound of a 2-way A-combiner showing twice the bound of that of a S-combiner;

FIG. 20A is a circuit diagram showing and output asymmetrical combiner with stacked PA unit cells with intra-stage t-line matching. The cells are sized at a ratio of 1.5:1;

FIGS. 20B and 20C are graphs showing optimal driving conditions for amplitude and phase for frequency-reconfigurable operation. The bottom figure shows the power delivery efficiency of the combiner $$\left(\eta = \frac{P_L}{P_{avs}}\right);$$

Figure 20D:
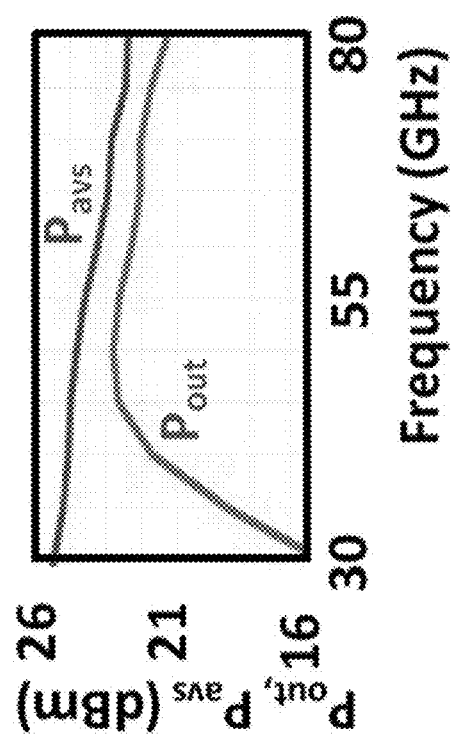
Figure 21:
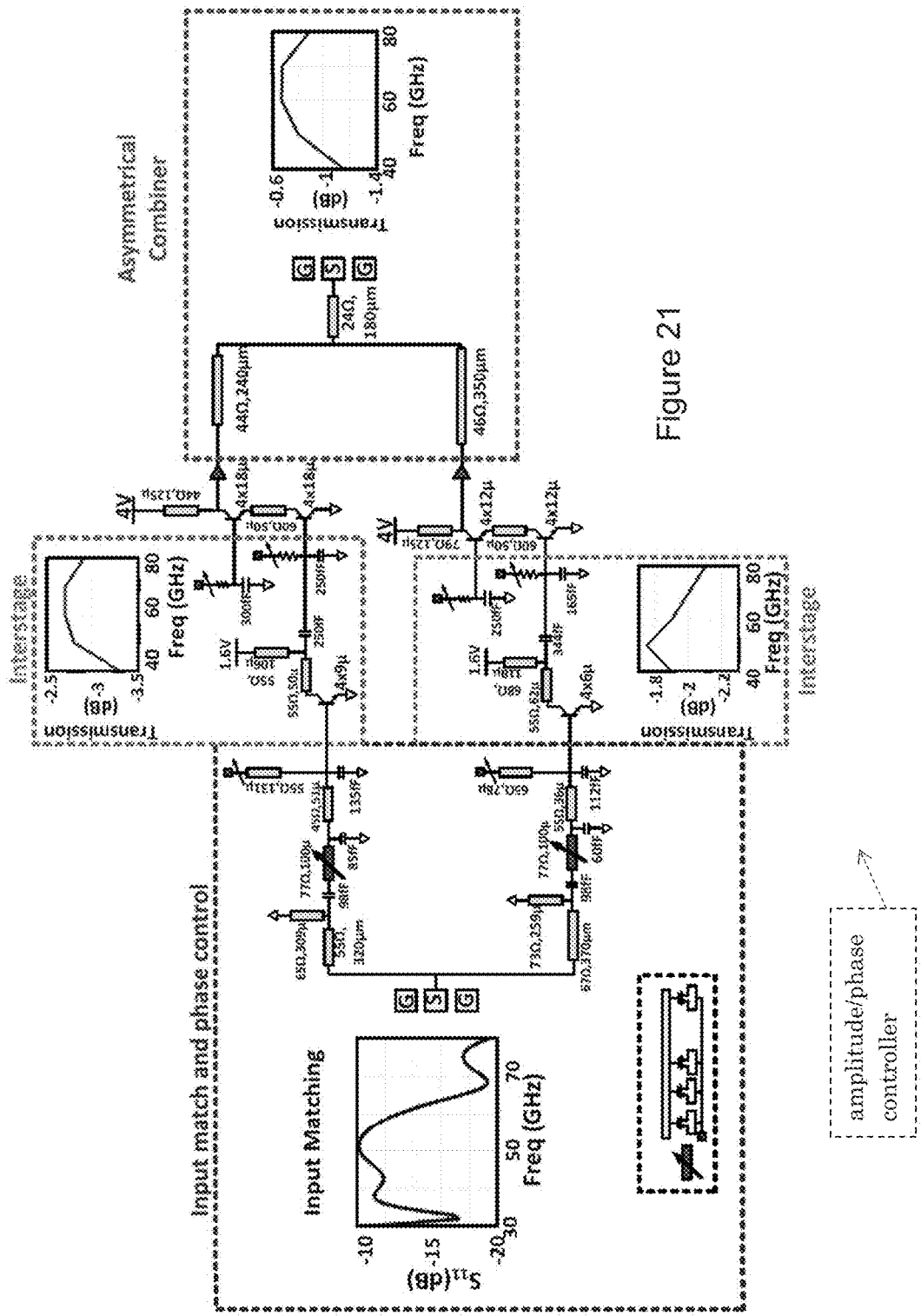
Figure 22:
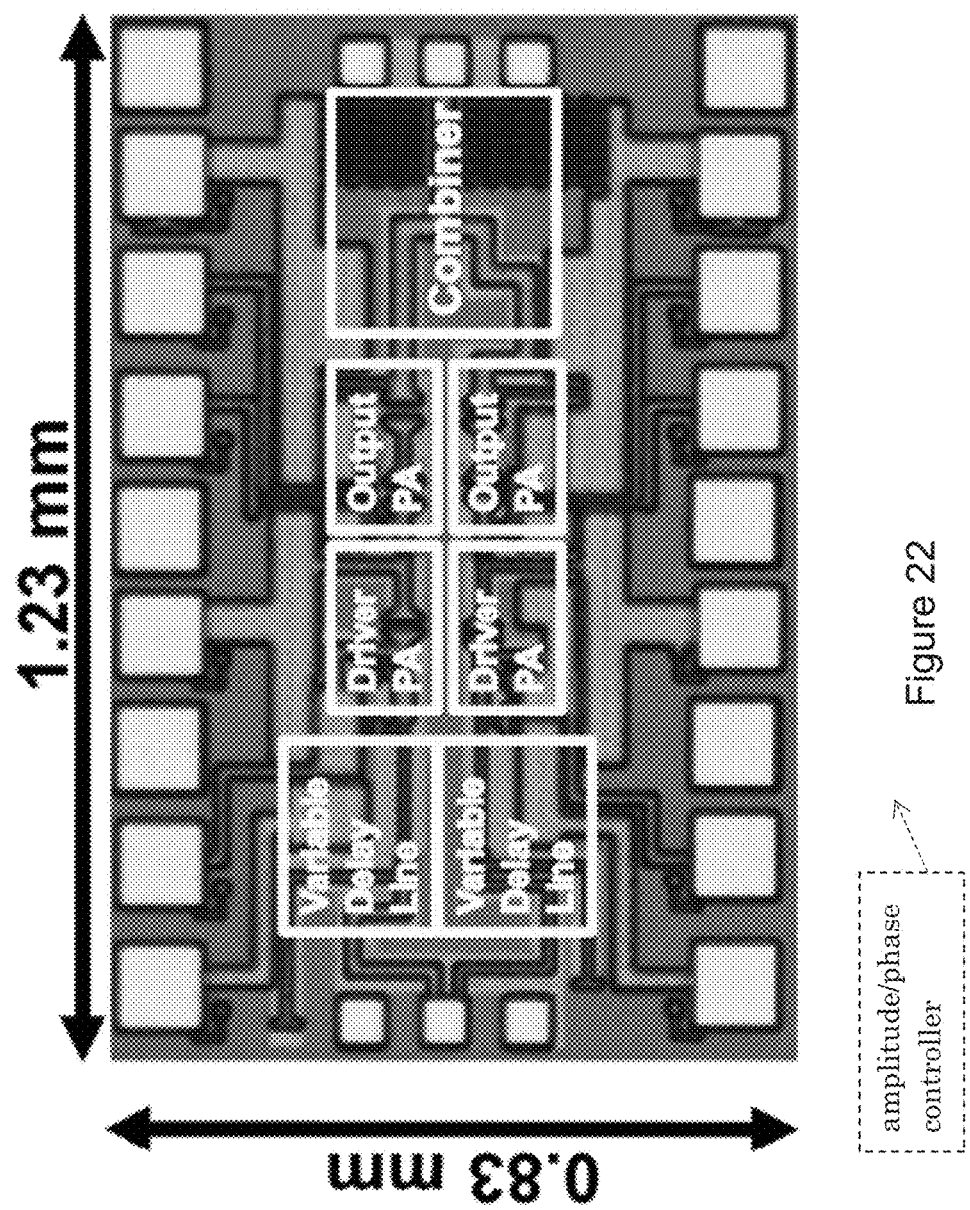
Figure 23A:
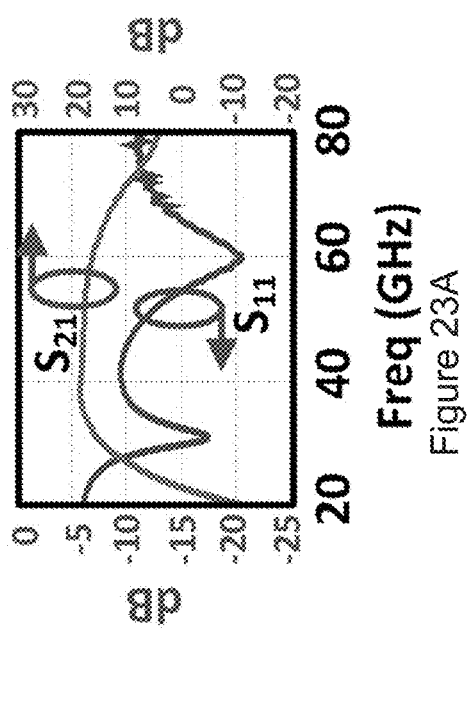
Figure 23B:
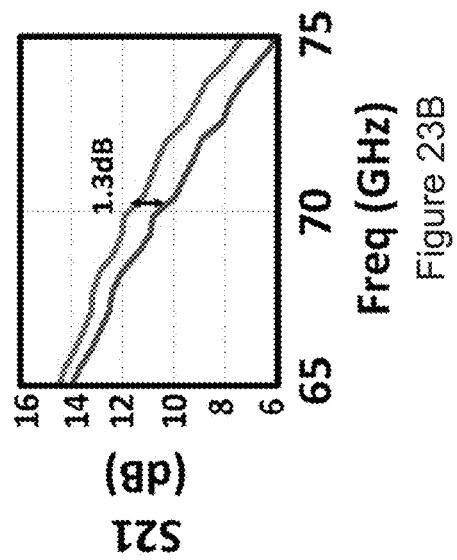
Figure 24A:
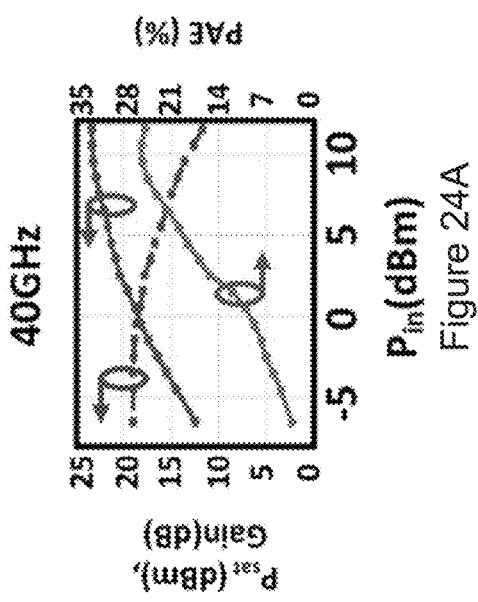
Figure 24B:
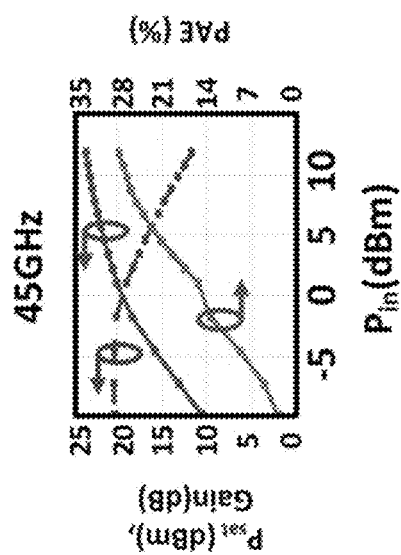
Figure 24C:
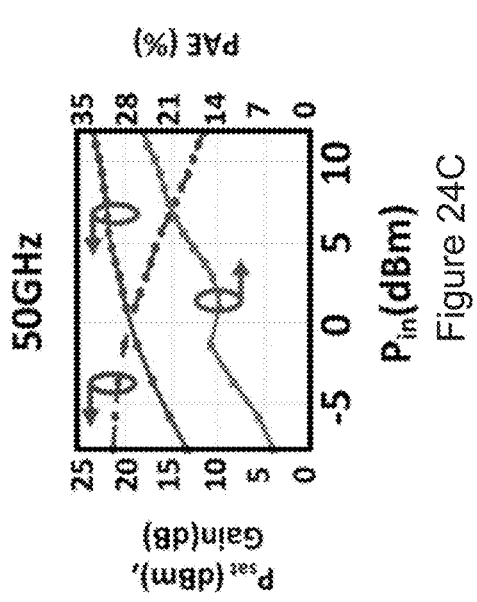
Figure 24D:
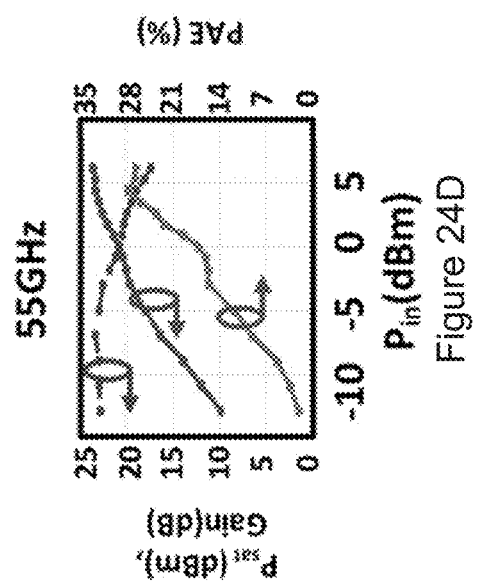
Figure 25A:
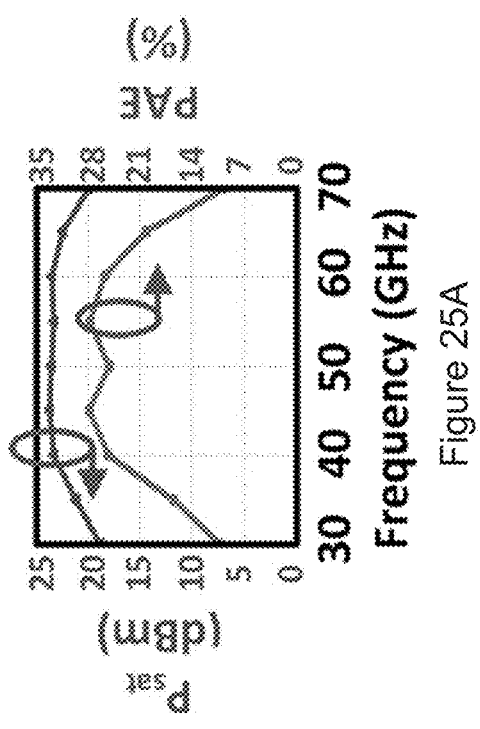
Figure 25B:
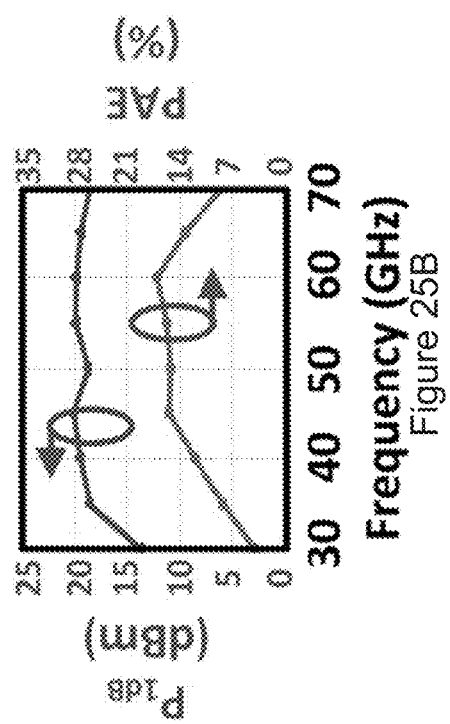
Figure 25C:
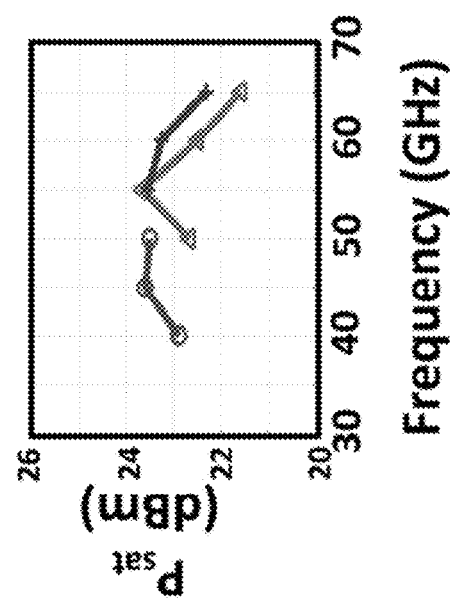
Figure 26A:
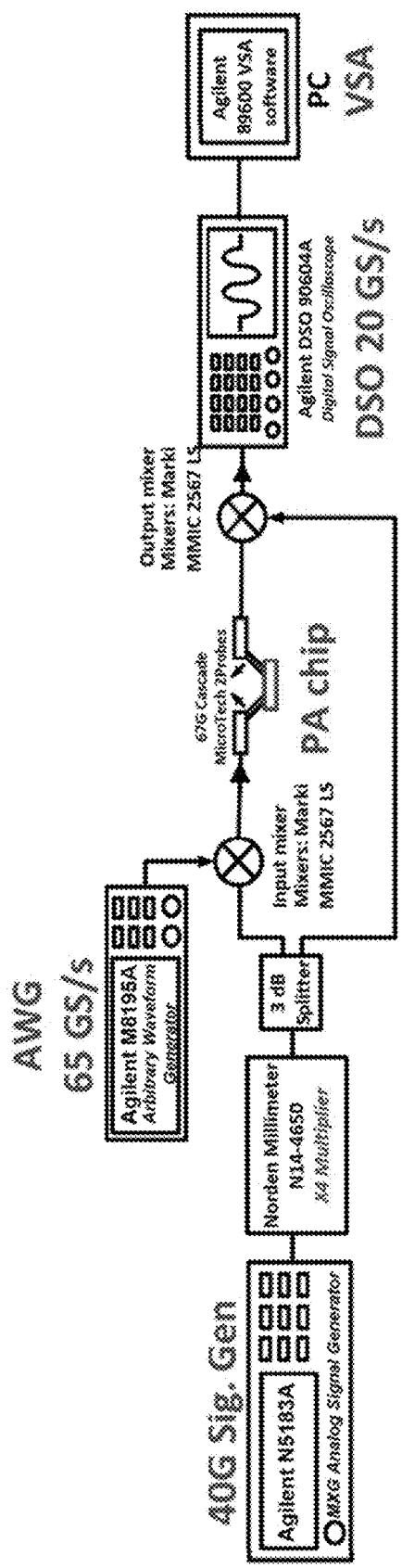
Figure 26B:
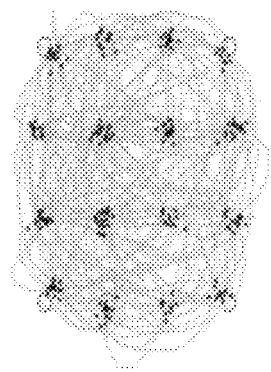
Figure 26C:
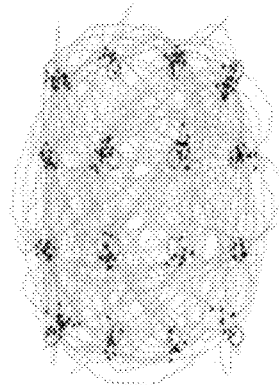
Figure 26D:
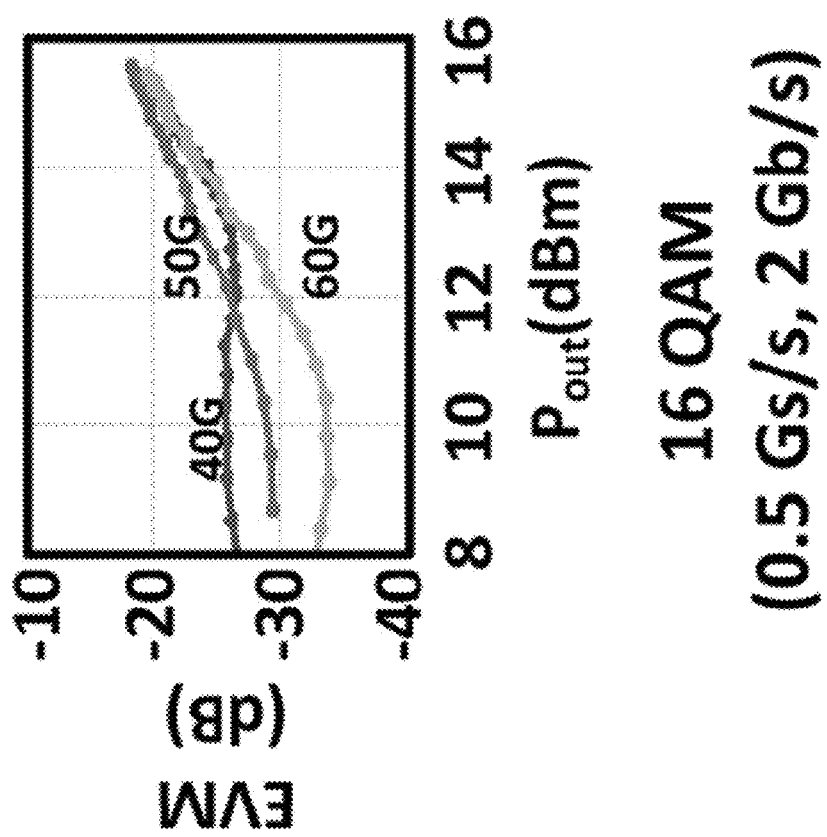
Figure 26E:
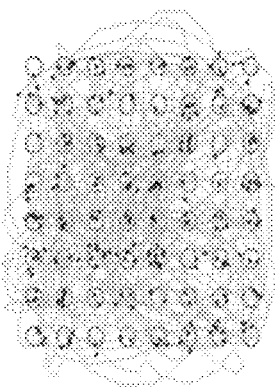
Figure 26F:
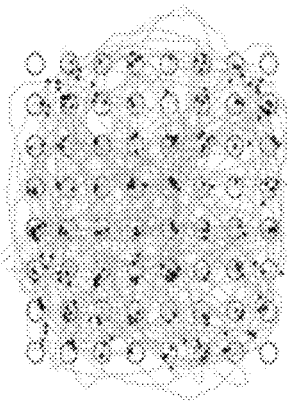
Figure 26G:
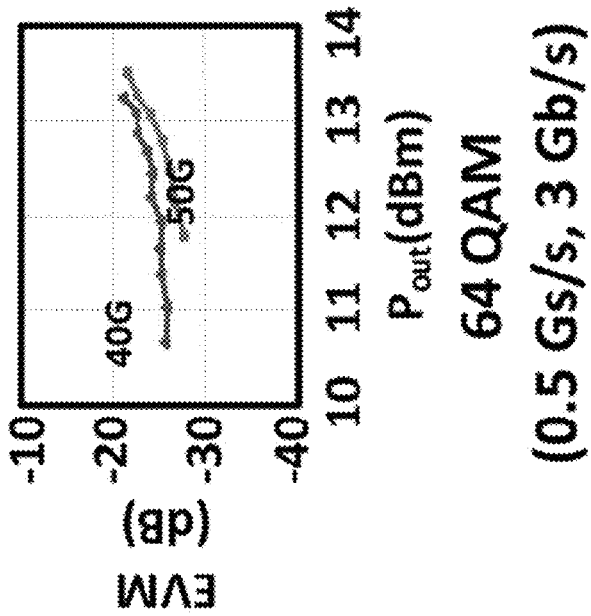
Figure 27:
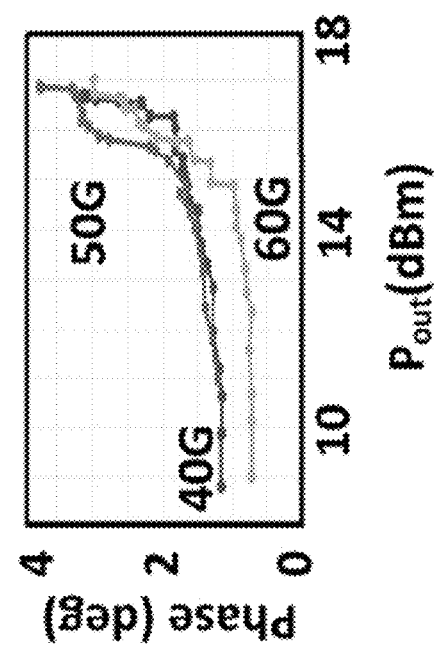
Figure 28A:
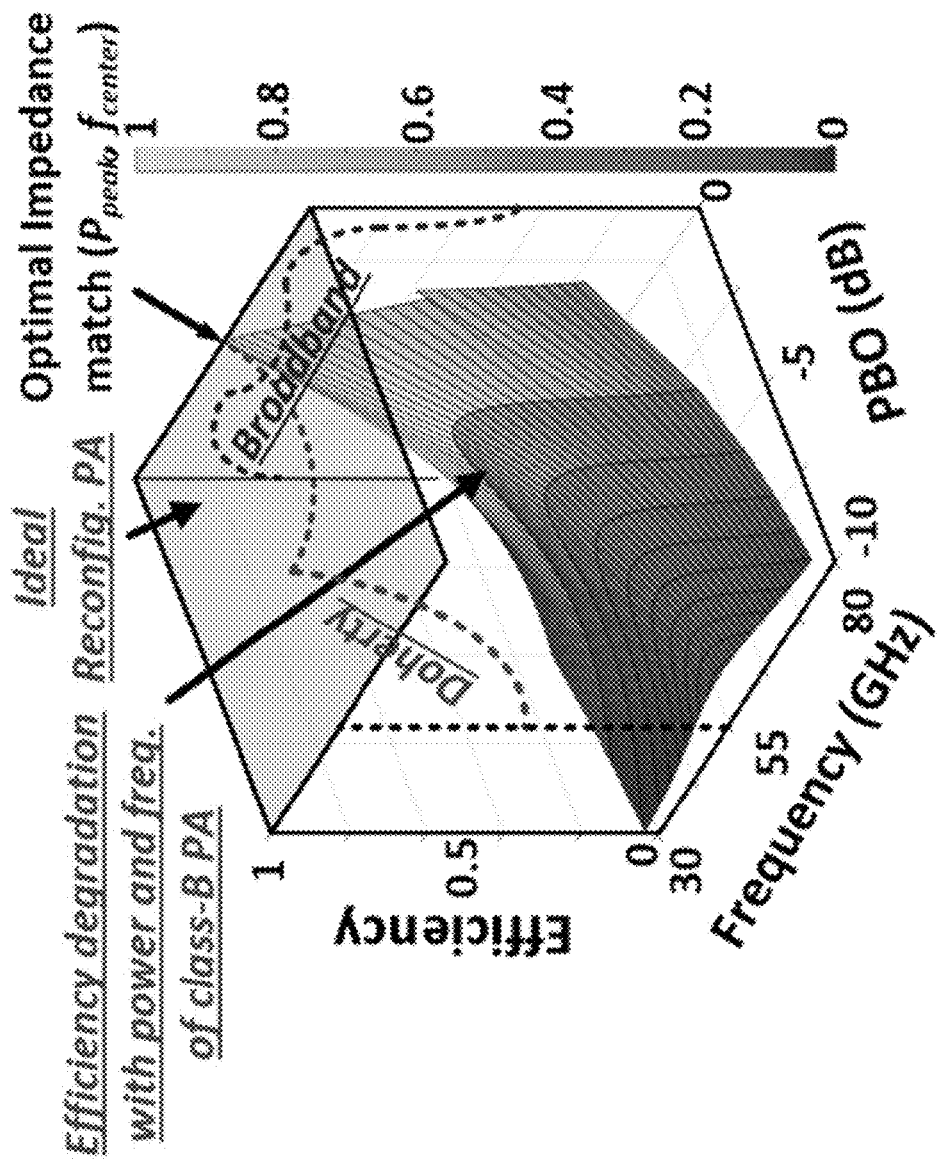
Figure 28B:
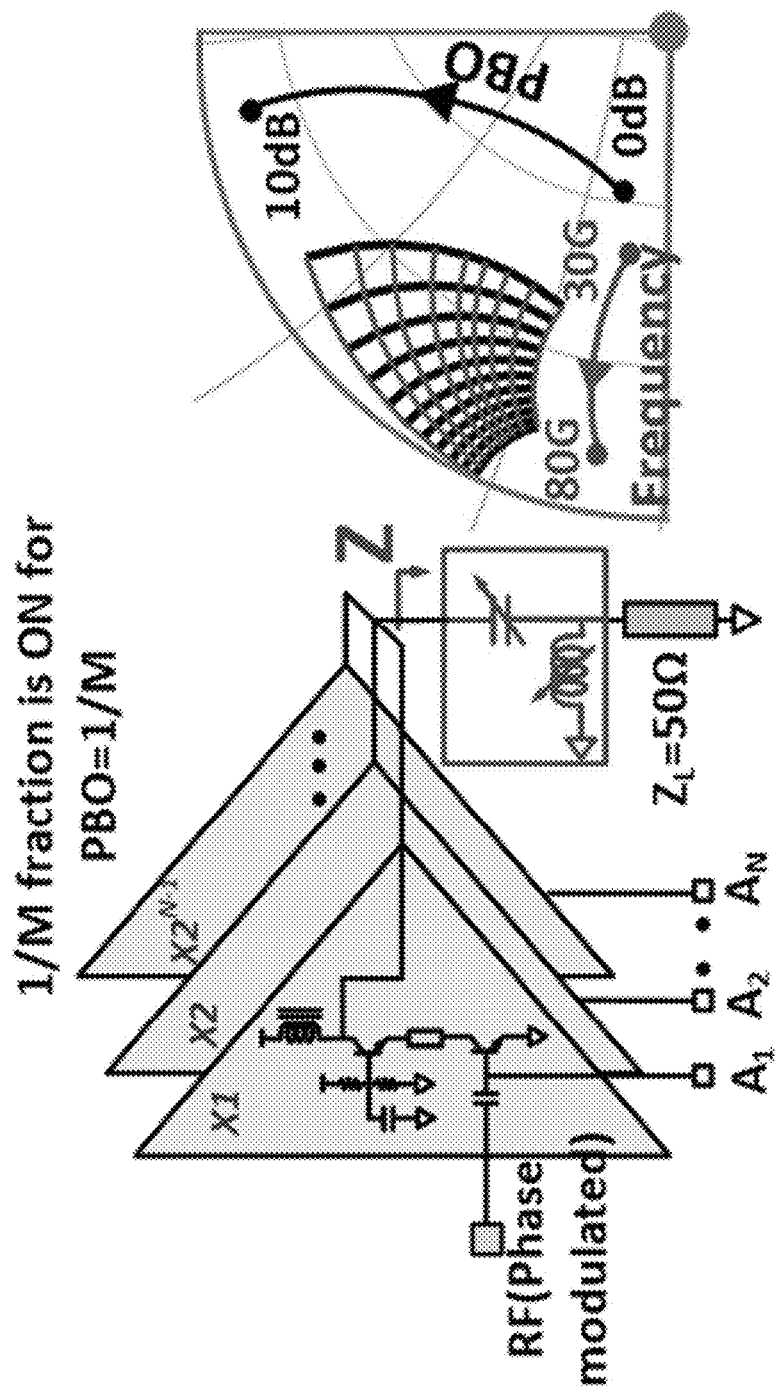

FIG. 20D is a graph showing simulated output power ($P_{out}$) against $P_{avs}$ which is the maximum combined power that can be extracted from the PA cells with lossless networks designed optimally at each frequency;

FIG. 21 is a PA circuit diagram showing the PA and the driver cells, implemented matching networks, variable delay line for phase control and the simulated performance of the various matching stages;

FIG. 22 is a chip Micrograph of the implemented PA;

FIGS. 23A and 23B are graphs showing the measured S-parameters when reconfigured for maximum saturated output power at 55 GHz. Gain improvement of 1.3 dB achieved through phase reconfiguration that enables re-alignment of optimal impedance for small-signal performance;

FIGS. 24A-24F are graphs showing measured large-signal performance ($P_{out}$/PAE) when the PA is reconfigured across frequencies from 40-65 GHz;

FIG. 25A is a graph showing measured Psat, $PAE_{peak}$ and $P_{1\ dB}$ and $PAE_{P1\ dB}$;

FIG. 25B is a graph showing when the PA is reconfigured across frequencies from 40-65 GHz. The PA can be configured to maintain $P_{sat}$>22 dBm and $P_{1\ dB}$ close to 20 dBm between 40 and 65 GHz with $PAE_{peak}$>25% between 40-60 GHz;

FIG. 25C is a graph showing $P_{sat}$ variation for three sets of reconfigured conditions;

FIG. 26A is a block diagram showing a measurement Set-up for non-constant envelope modulation;

FIGS. 26B-26D show measured constellations and EVM variation against output power for 16-QAM at data rate of 2 Gbps at 40 GHz and 60 GHz;

FIGS. 26E-26G show measured constellations and EVM variation against output power for 64-QAM at data rate of 3 Gbps at 40 GHz and 60 GHz;

FIG. 27 is a graph showing measured AM-PM distortion (limited by the nonlinearity of the transmitter mixer used for upconversion);

FIG. 28A is a graph showing the degradation of efficiency of a mm-Wave DAC (with class-B PA cell) across back-off and frequency;

FIG. 28B is a block diagram showing optimal operation across the 2D plane of reconfiguration requires dynamic synthesis of optimal impedances over a 2D space;

FIG. 28C-D are graphs showing and example of optimum impedances required for 16-QAM at two different operation frequencies.

Figure 28E:
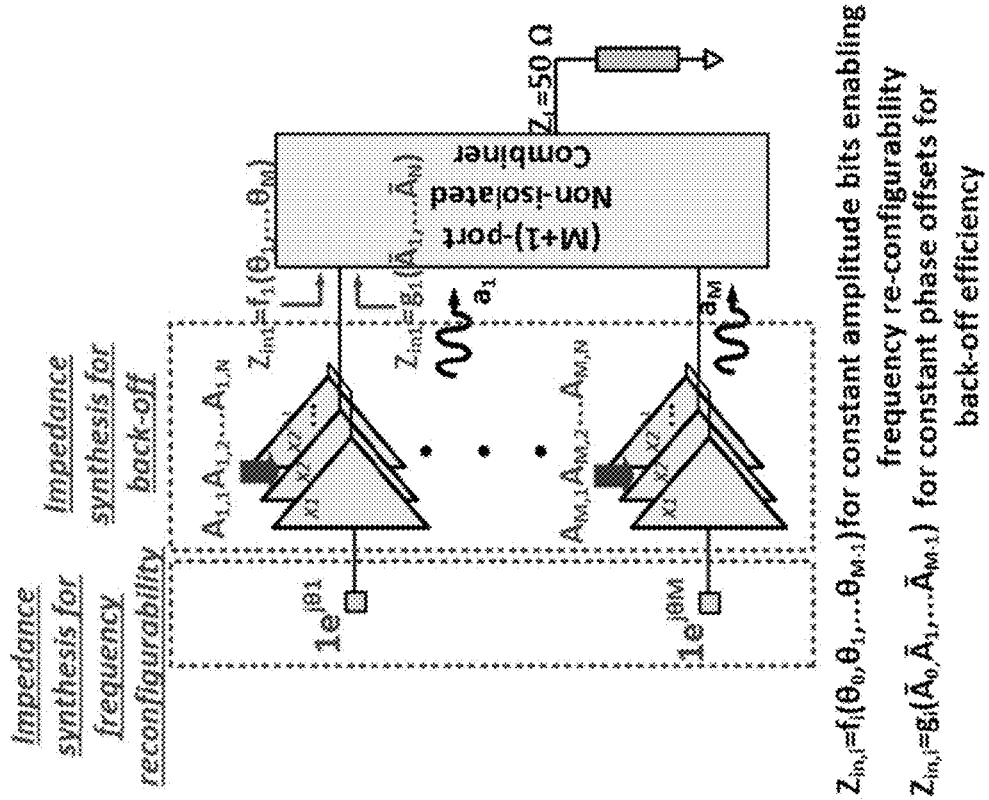
Figure 29A:
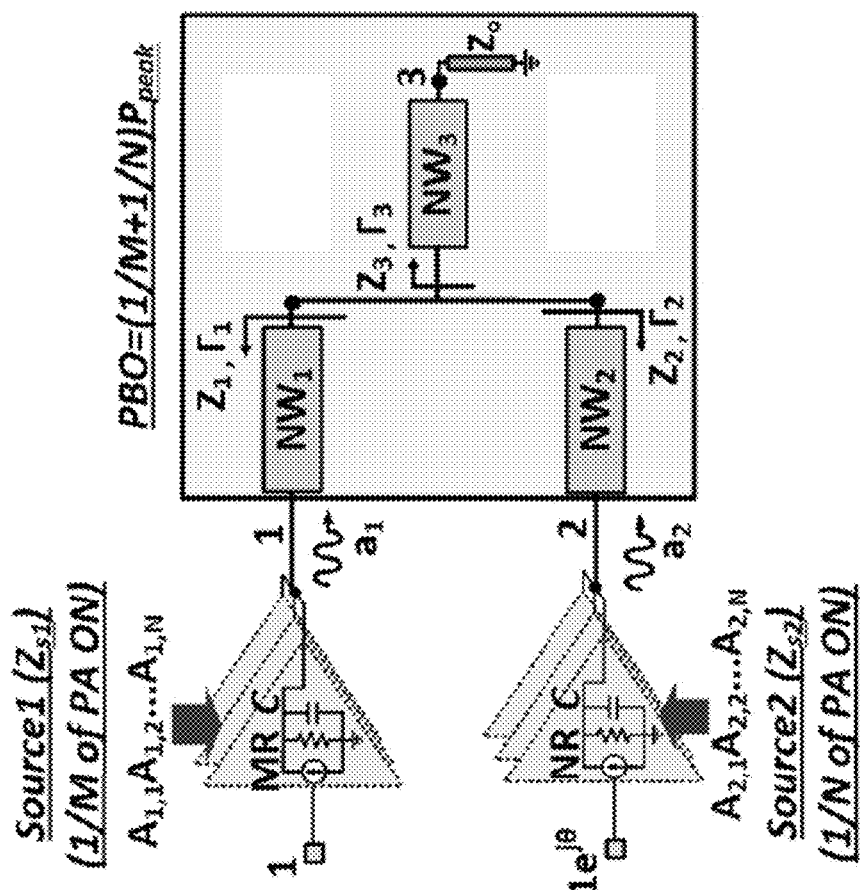
Figure 29B:
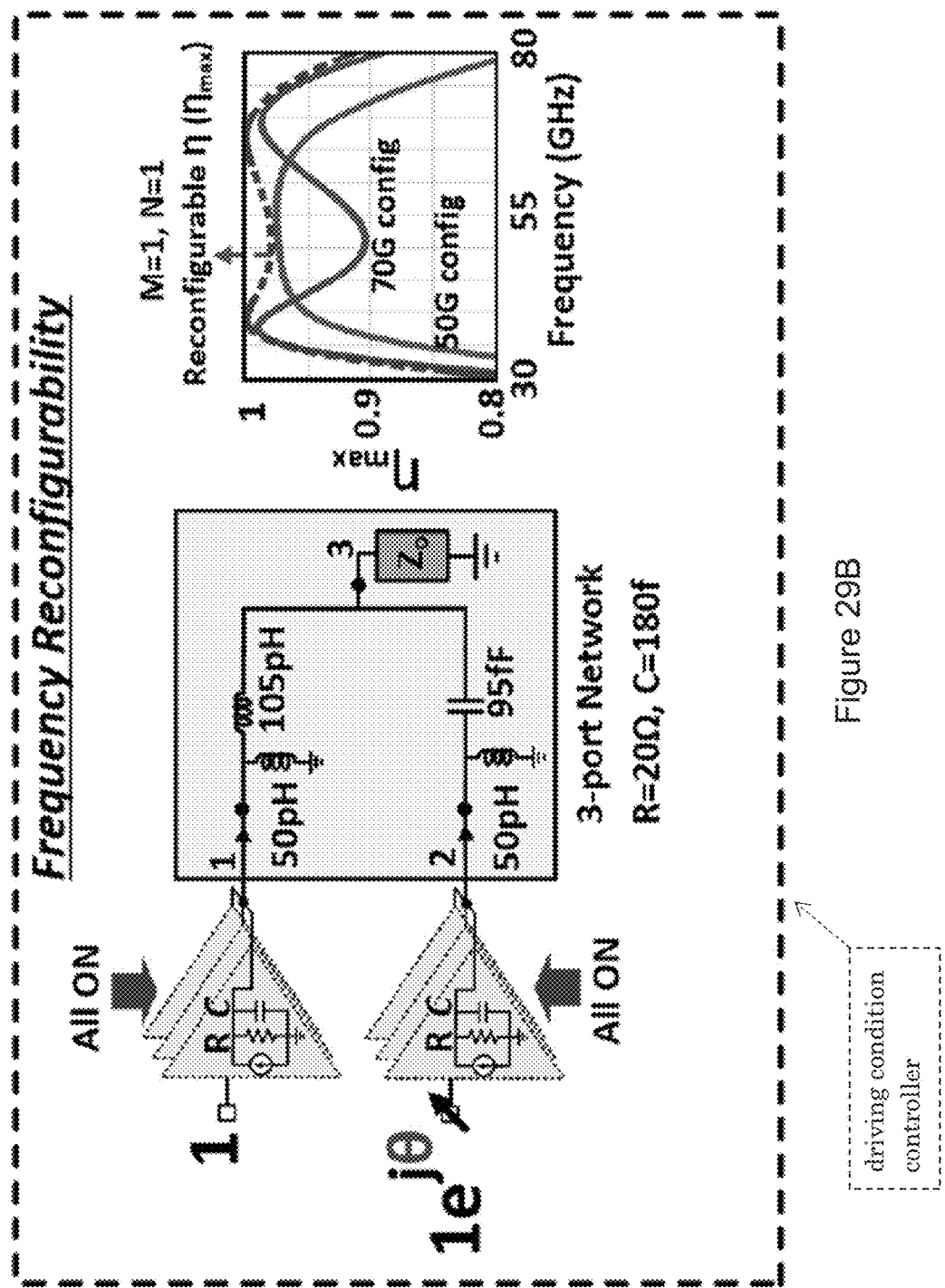
Figure 29C:
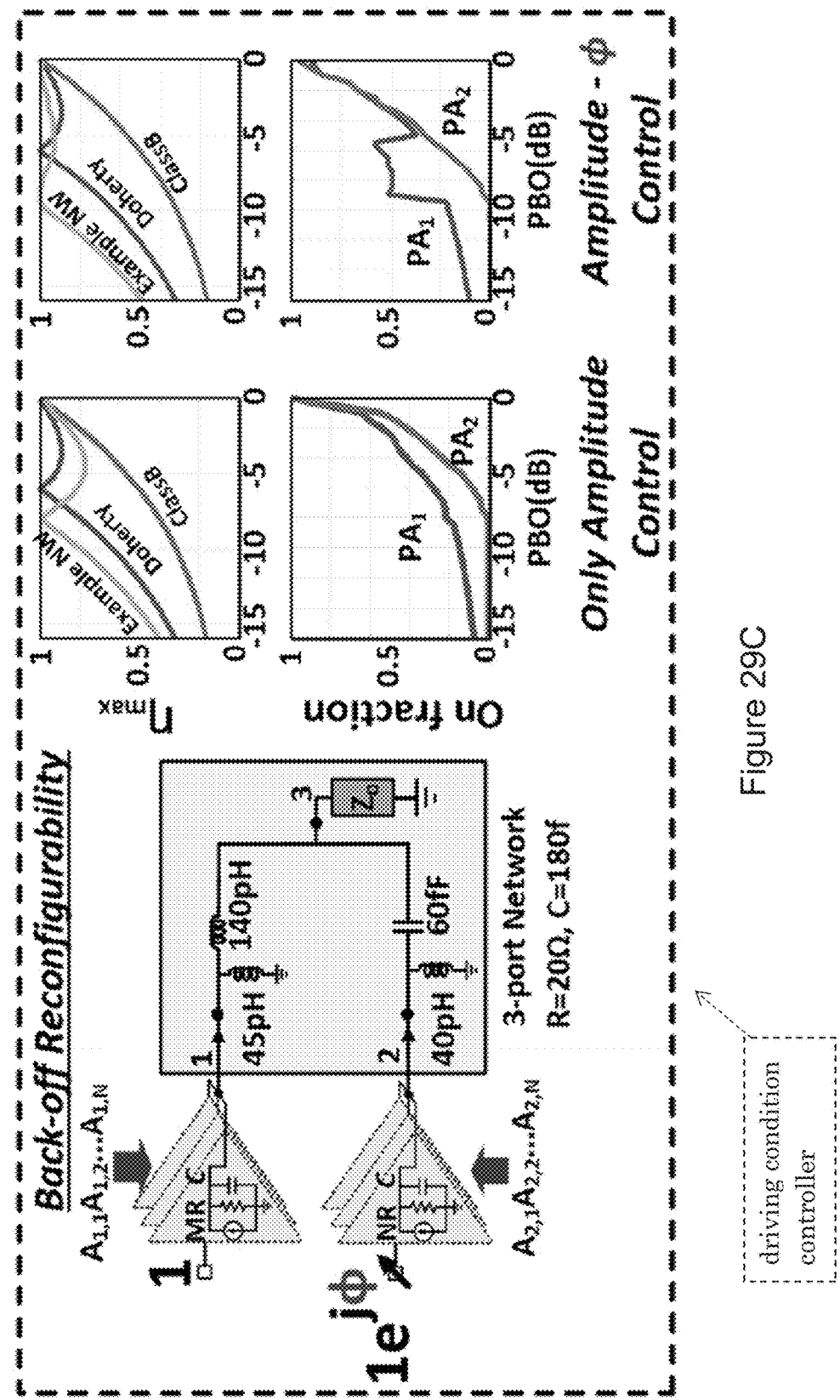
Figure 30A:
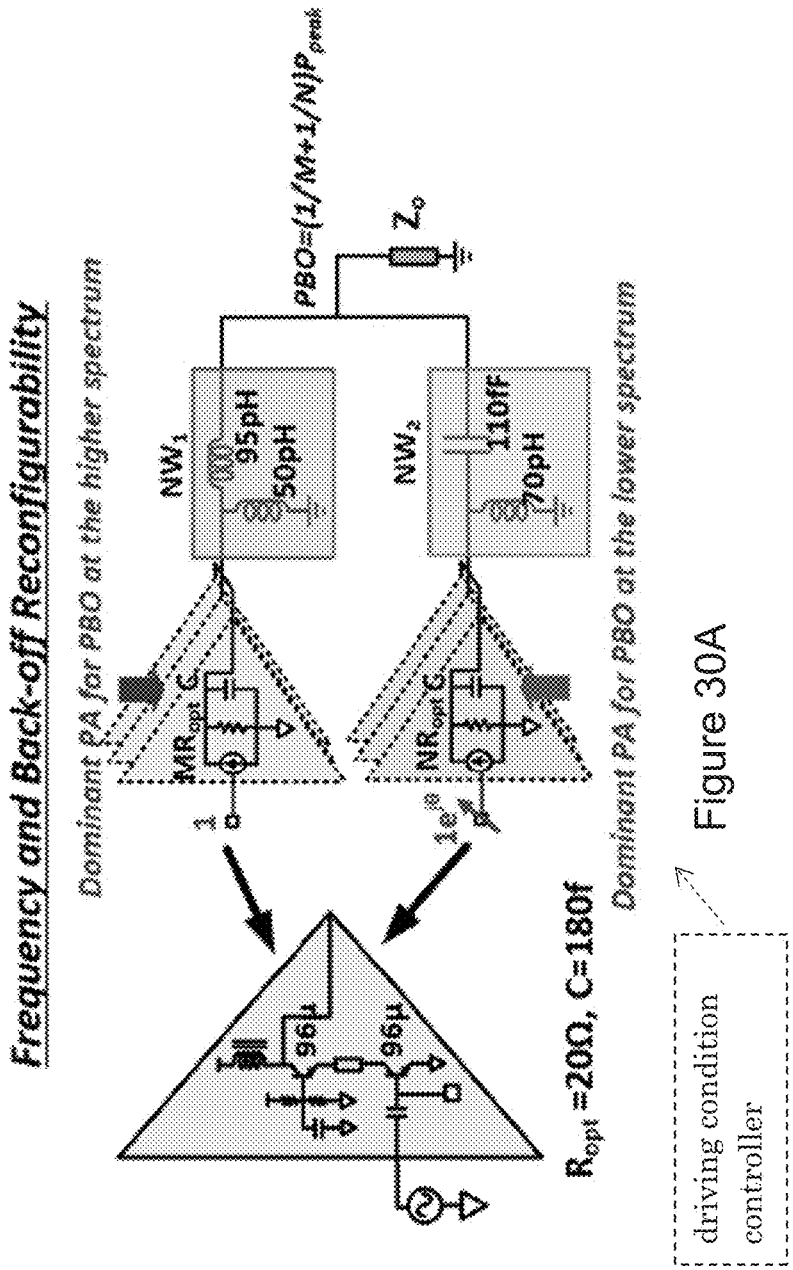
Figure 30B:
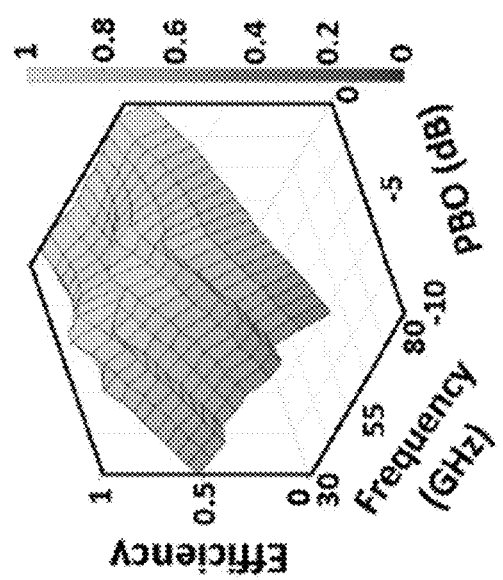
Figure 31A:
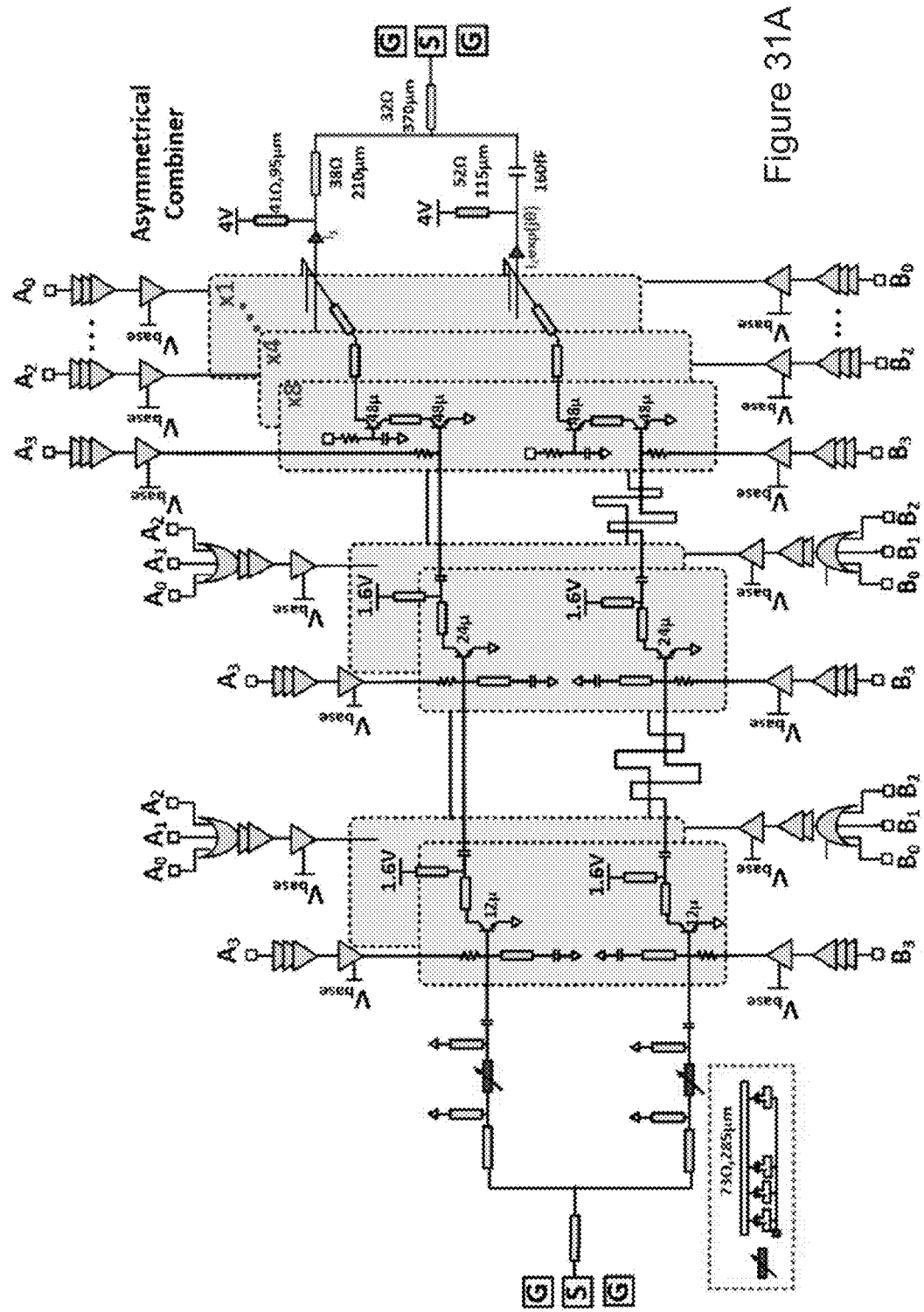
Figure 31B:
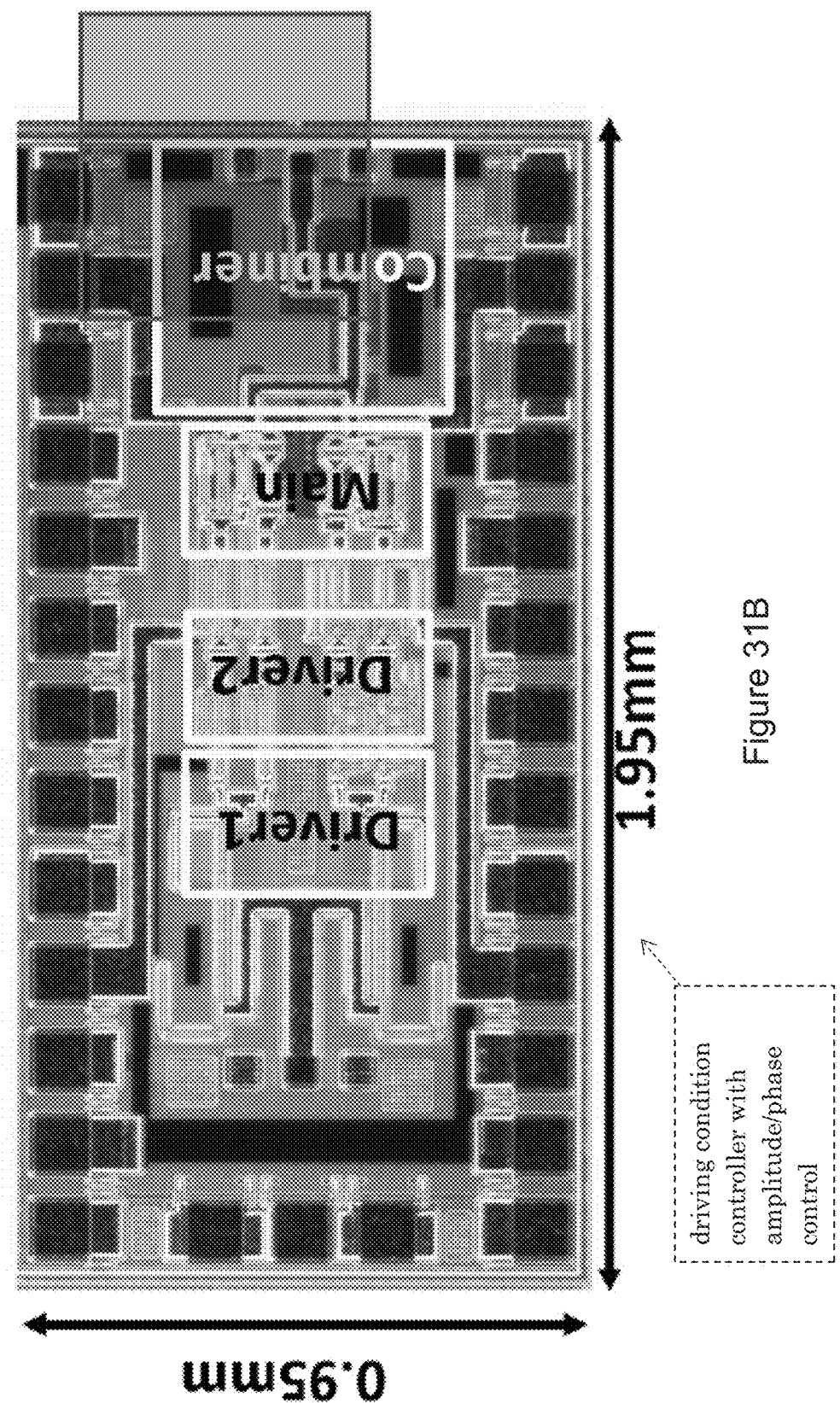
Figure 32A:
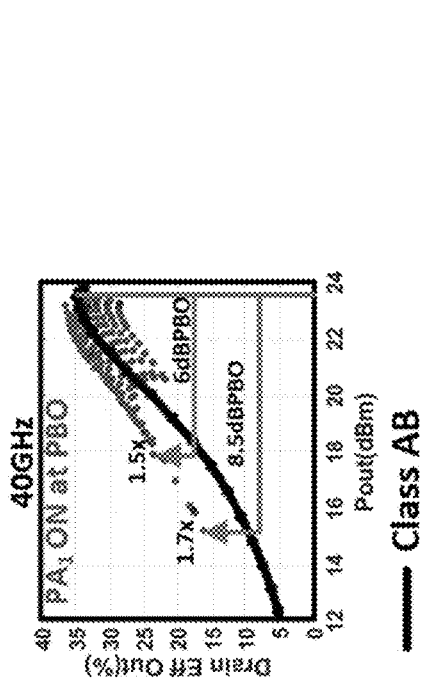
Figure 32B:
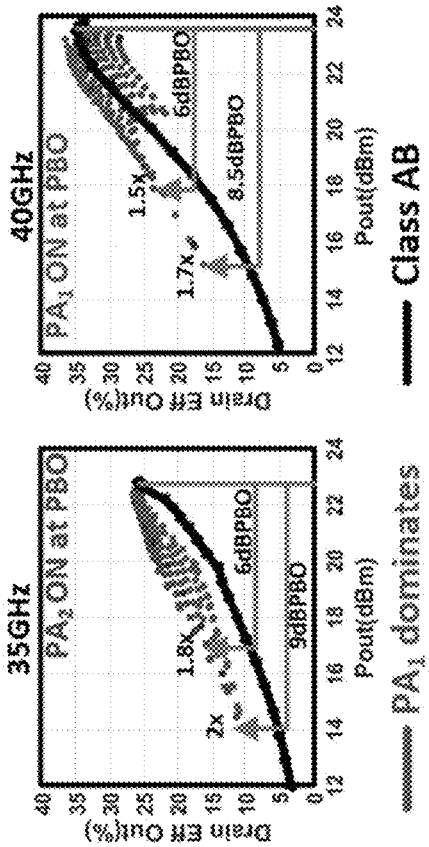
Figure 32C:
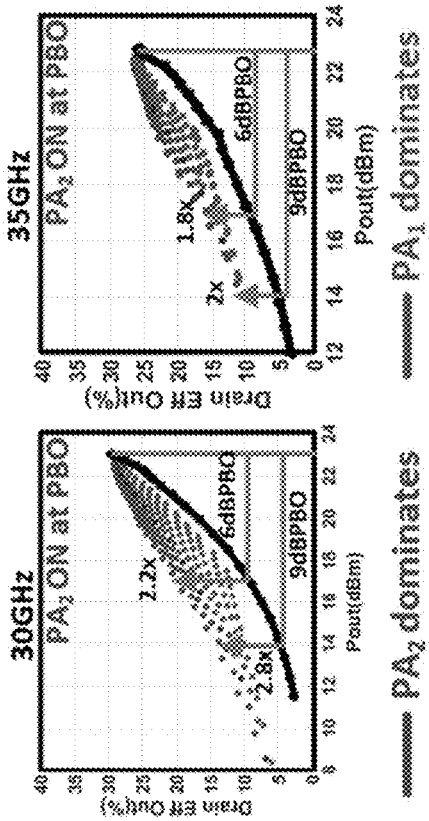
Figure 32D:
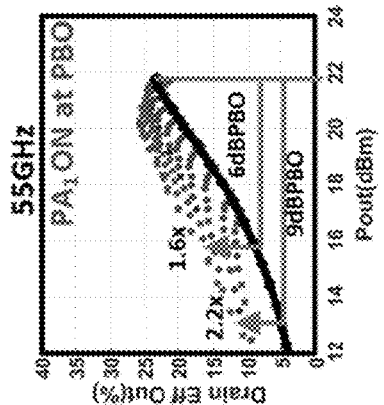
Figure 32E:
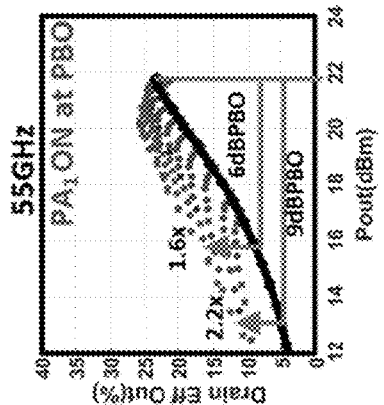
Figure 32F:
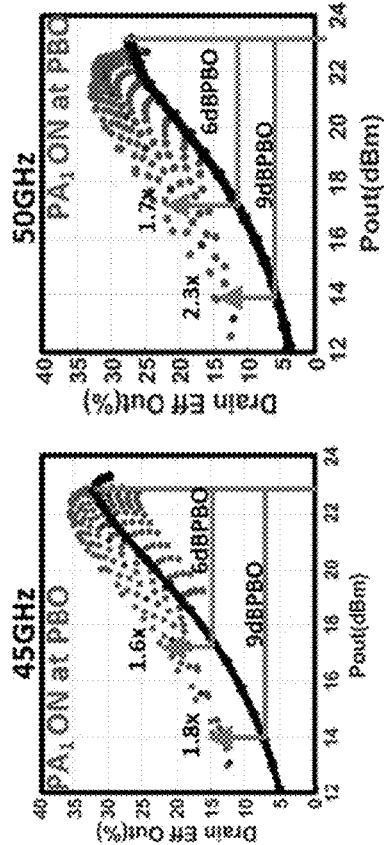

FIG. 28E is an example architecture for dual-reconfigurability for frequency and back-off with asymmetric phase and amplitude word control in a synthesized multi-port network;

FIG. 29A is a block diagram of a network synthesis approach to enable dual reconfigurability with a 3-port combining network with PAs combining power at 3rd port;

FIG. 29B is a block diagram showing example PA architecture that achieves frequency reconfigurability across 35-75 GHz;

FIG. 29C is a block diagram showing example PA architecture that achieves PBO reconfigurability across 0-10 dB at 60 GHz;

FIG. 30A is a block diagram of a dual-reconfigurable PA with stacked DAC cells and an example combiner network;

FIG. 30B is a graph showing variation of efficiency against frequency and PBO showing dual frequency-PBO reconfigurability;

FIGS. 30C-30F are graphs showing the dominant PA switches between $PA_1$ and $PA^2$ at back-off over the range for optimal operation;

FIG. 31A is a circuit Schematic of an example PA;

FIG. 31B is a an example chip microphotograph;

FIGS. 32A-32F are graphs showing measured $\eta_{out}$ vs PBO across 30-55 GHz against combination of the amplitude codes. The color shows the dominant PA at PBO over the frequency range which changes between PA1 and PA2.

FIGS. 33A-33D Measured $\eta_{out}$, $P_{out}$, PAE at 0, 3, 6, 9 dB PBO across 30-55 GHz.

Figure 34A:
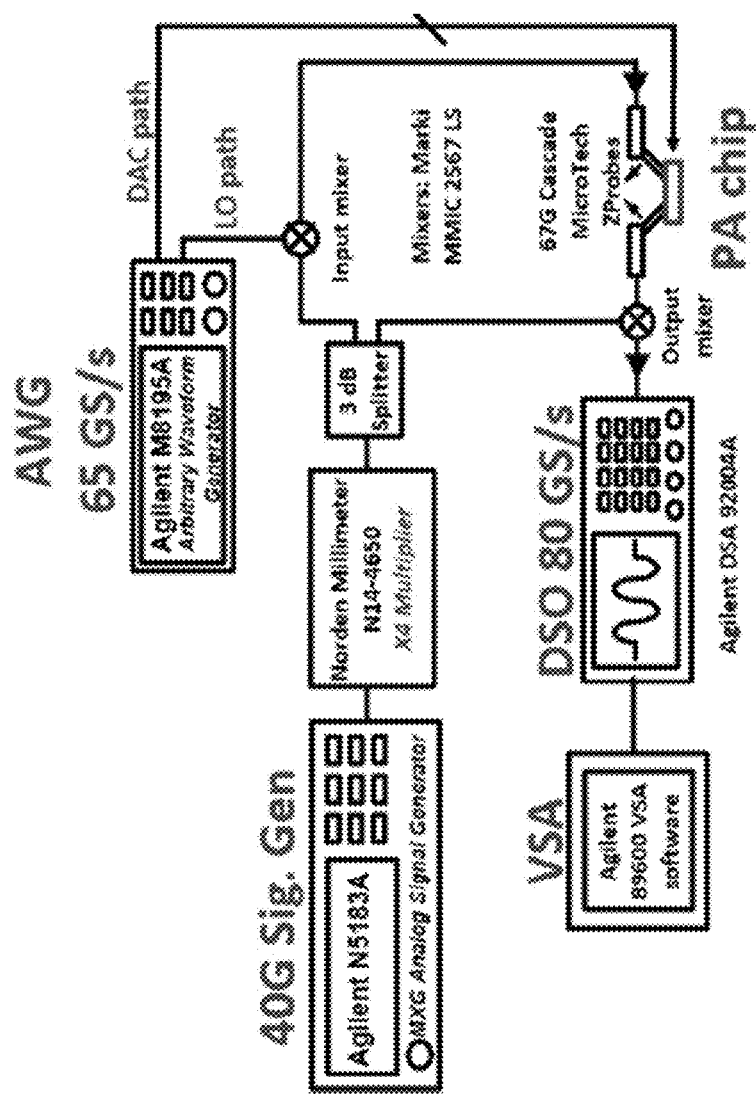
Figure 34B:
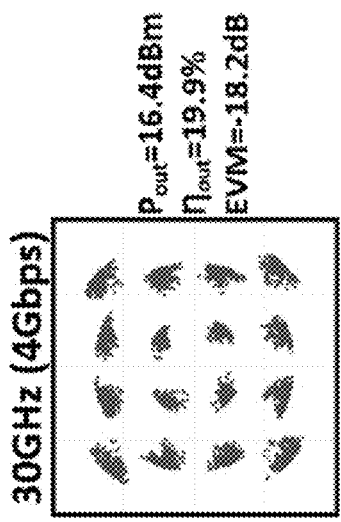
Figure 34C:
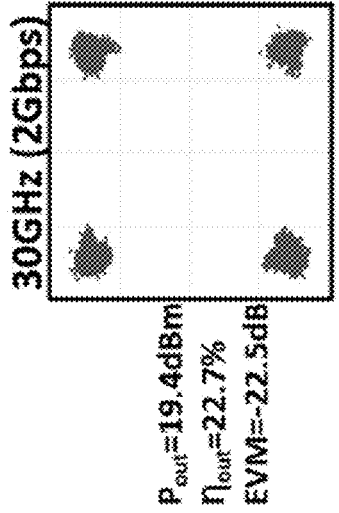
Figure 34D:
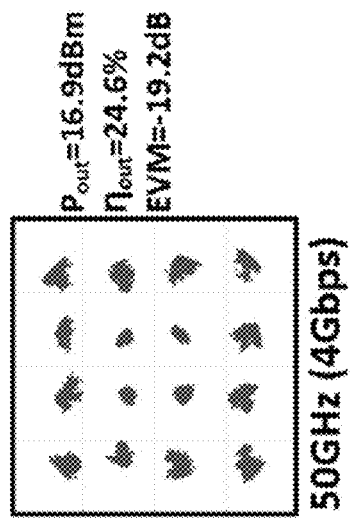
Figure 34E:
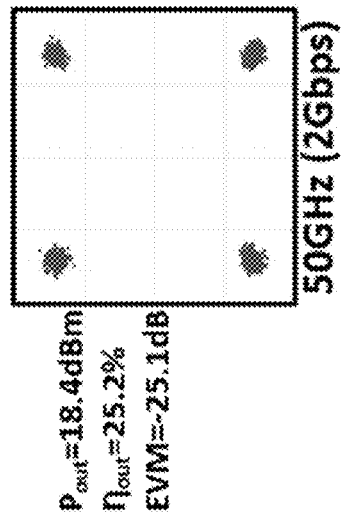
Figure 34F:
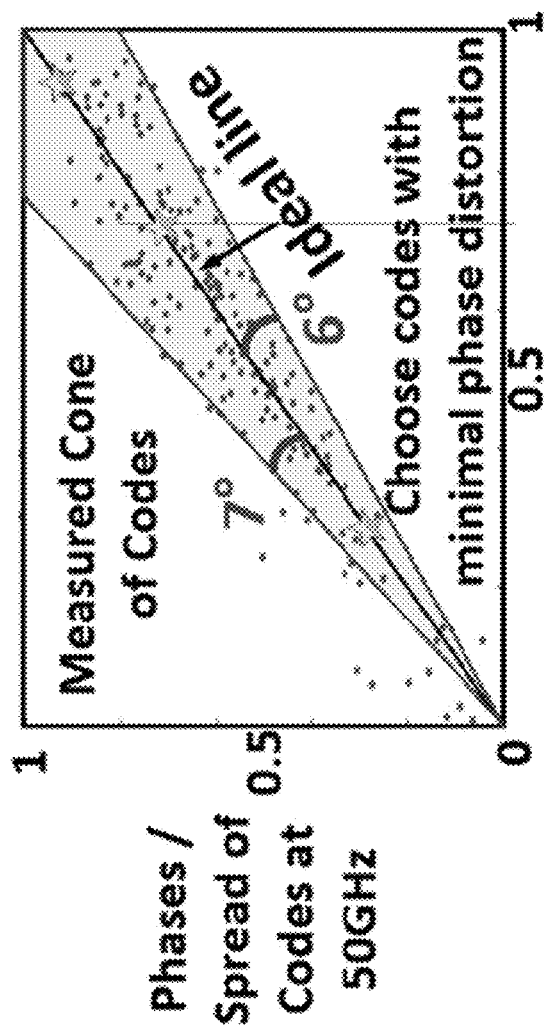
Figure 34G:
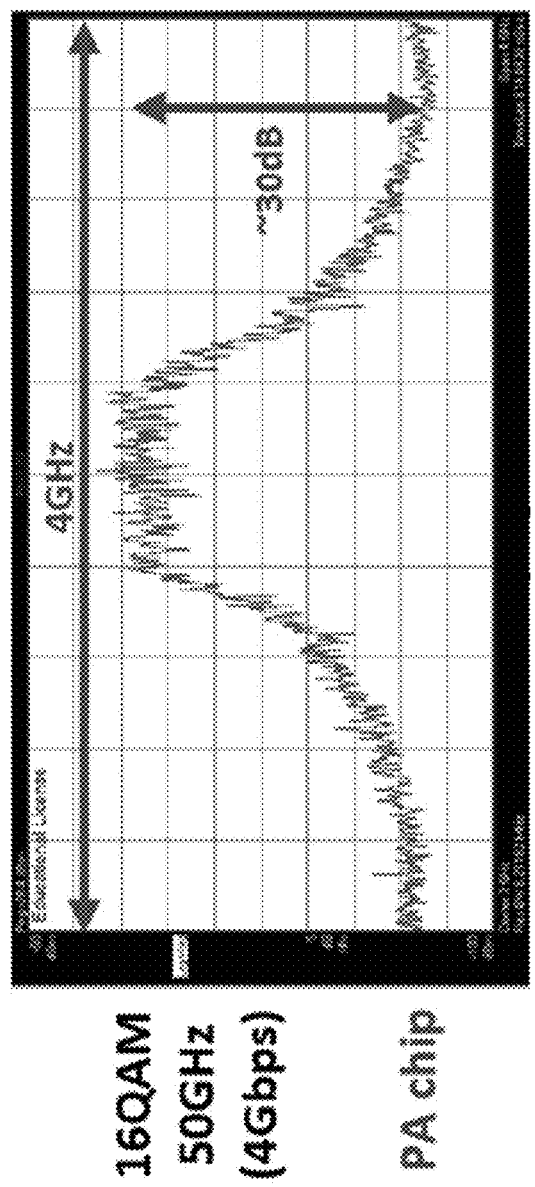

FIG. 34A is a block diagram showing modulation measurement setup;

FIG. 34B-34E are graphs showing QPSK (2 Gbps) and 16-QAM (4 Gbps) constellations at 30 and 50 GHz;

FIG. 34F is a graph showing phase rotations due to asymmetrical switching and choice of amplitude codes to minimize any phase corrections; and FIG. 34G is a graph showing the spectrum of pulse-shaped 16-QAM at 50 GHz.

To facilitate understanding, identical reference numerals have been used, where possible, to designate identical elements that are common to the figures.

DETAILED DESCRIPTION

This disclosure is focused on the transmitter front-end, particularly the power amplifier (PA), and discloses frequency-flexible PA architectures which can be reconfigured to operate near-optimally over a wide band of mm-Wave frequencies without lossy variable passive elements.

Lower breakdown voltages of active devices, lower $f_t$ & $f_{max}$, lower power gain and quality factor of on-chip passives in silicon make efficient and high-power on-chip signal generation at mm-Wave frequencies with high linearity extremely challenging. In general, for optimal power generation, the load-pull impedance for the PA is transformed from 50Ω through a passive matching network which limits the bandwidth and frequency of operation of PA. This transformation ratio increases for higher power generation with multiple combining cells, which typically degrades operable bandwidth as well as the efficiency of the matching network. This results in strong trade-offs between output power, efficiency and bandwidth.

Figure 1A:
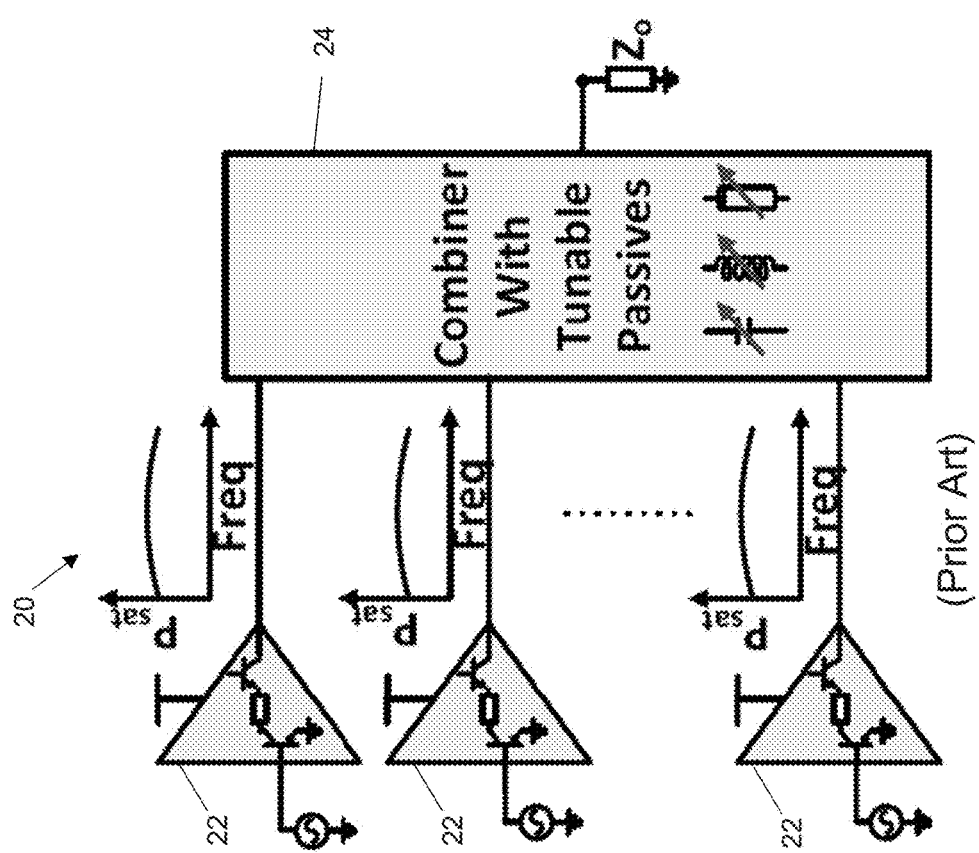
FIG. 1A is a block diagram of multiple identical power amplifiers (PAs) driven through a classical symmetrical combing architecture with variable tunable passives for frequency-reconfigurable operation.

FIG. 1A shows a typical combining architecture 20 where multiple identical PAs 22 are driven symmetrically through a passive combiner 24 to achieve power combination and impedance transformation simultaneously at the desired frequency of operation. Ideally with variable passive elements, the matching network can be tuned over the frequency of operation. However, the loss and tuning range of variable passive elements at mm-Wave frequencies is prohibitive and severely limits efficiency and frequency reconfigurability. An alternative approach to realize efficient operation across frequency is to enable instantaneous broadband operation employing higher-order networks at the output that enables passive synthesis of the optimal load-pull impedance across the frequency. However, realizing such complex combiner networks with larger number of passives, also typically trades-off with efficiency, can induce undesired mutual coupling and be area intensive. Techniques such as staggering and distributed amplification for PAs can also be inefficient at mm-Wave frequencies. To mitigate these issues, as disclosed herein an active impedance synthesis approach may be used over an asymmetrical combining PA architecture that can be programmed to operate near-optimally over a wide range of mm-Wave frequencies with a low-order and efficient output combiner.

Figure 1B:
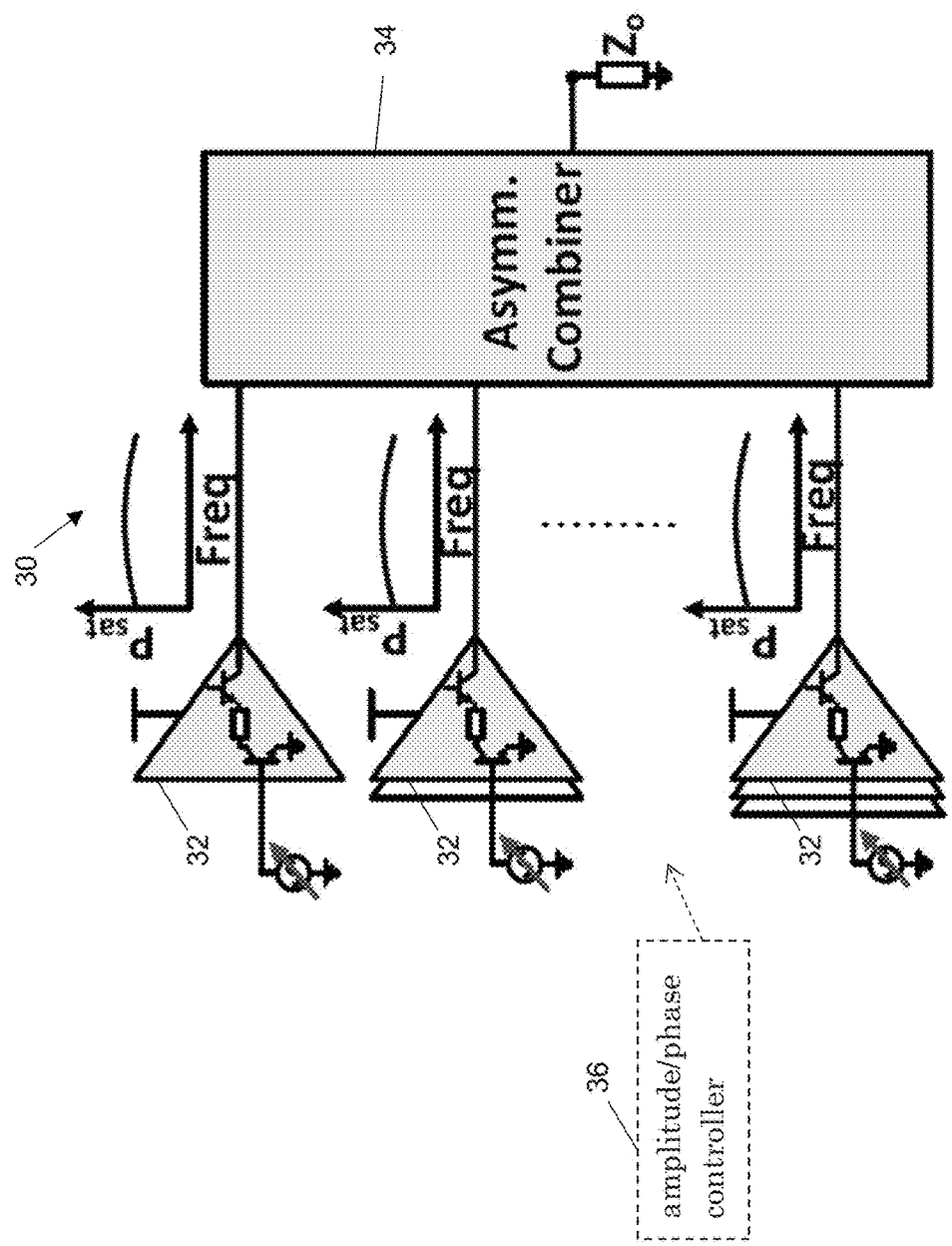
FIG. 1B is a block diagram of an asymmetrical architecture with programmable driving conditions to enable active impedance synthesis for optimal frequency-reconfigurable operation without lossy variable passives.

FIG. 1B is a block diagram of an asymmetrical architecture 30 with programmable driving conditions to enable active impedance synthesis for optimal frequency-reconfigurable operation without lossy variable passives. FIG. 1B shows a plurality of PAs 32 coupled to an asymmetrical combiner 34 that actively reconfigures the output impedances of the combining cells to match their optimal load-pull impedances over the operable spectrum for high-efficiency power generation. An amplitude/phase controller 36 sets the driving conditions at each input of the asymmetrical combiner 34 to ultimately control the amplitude and phase at the asymmetrical combiner output. This establishes an optimal impedance at the carrier frequency for each of the plurality of PAs as explained in detail below. This configuration provides a frequency-programmable, efficient and high-power PA.

Figure 1C:
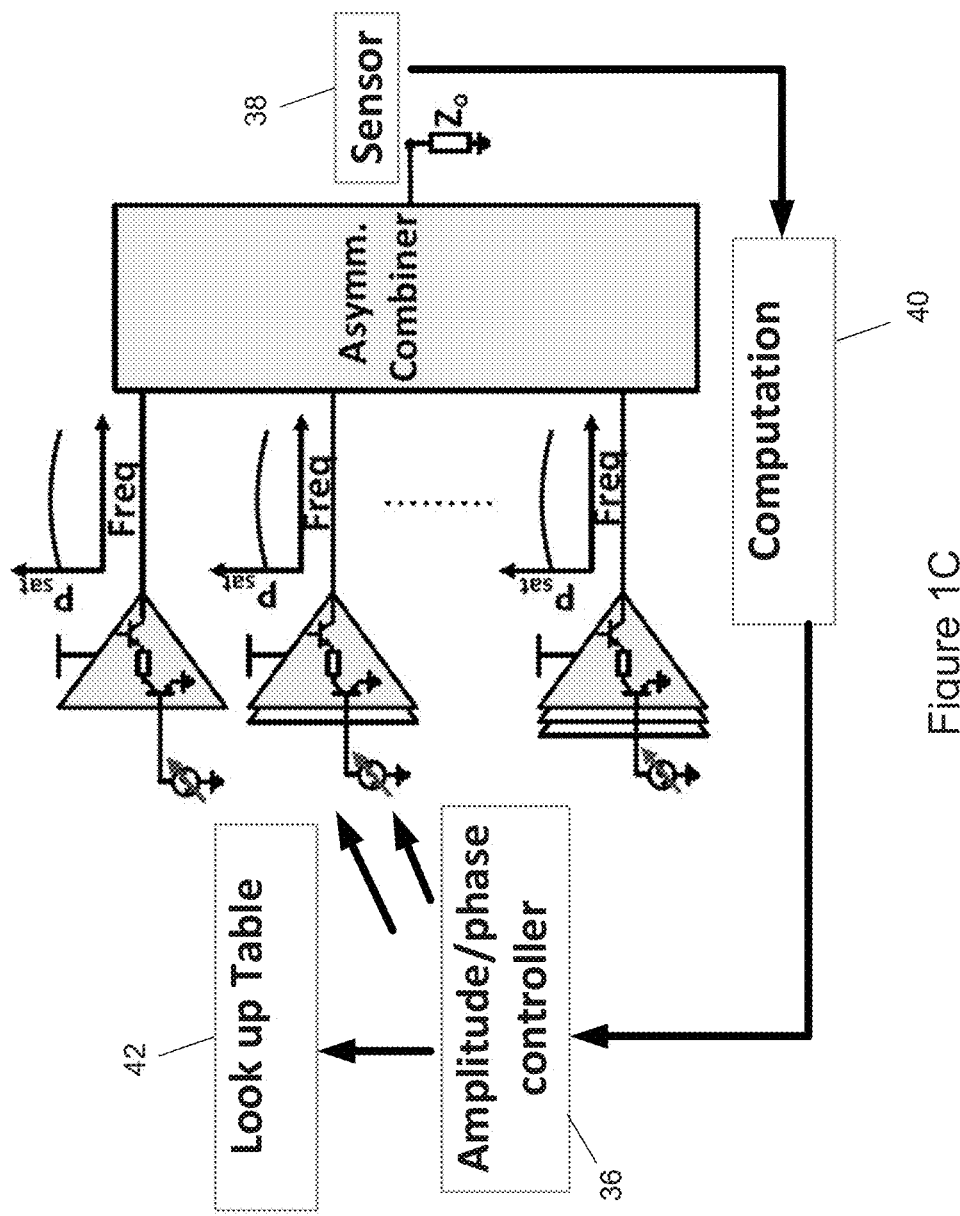
FIG. 1C is a block diagram showing more details of the implementation of a driving condition controller or amplitude/phase controller.

FIG. 1C is a block diagram showing more details of the implementation of a driving condition controller or amplitude/phase controller 36. The amplitude/phase control and the driving conditions can be controlled in a feedback fashion with a sensor 38 that measure output power and a computation block 40 that stores the measured signal from each of the combinations of the amplitude/phase and driving conditions. The results can also be stored in a look-up table 42 for future use. It should be understood that the computations may be carried out inside the driving condition controller or amplitude/phase controller without departing from the scope of this disclosure. Similarly, the any lookup table may be implemented in the driving condition controller or amplitude/phase controller without departing from the scope of this disclosure.

Architectures for Frequency-Reconfigurable Operation

Figure 2A:
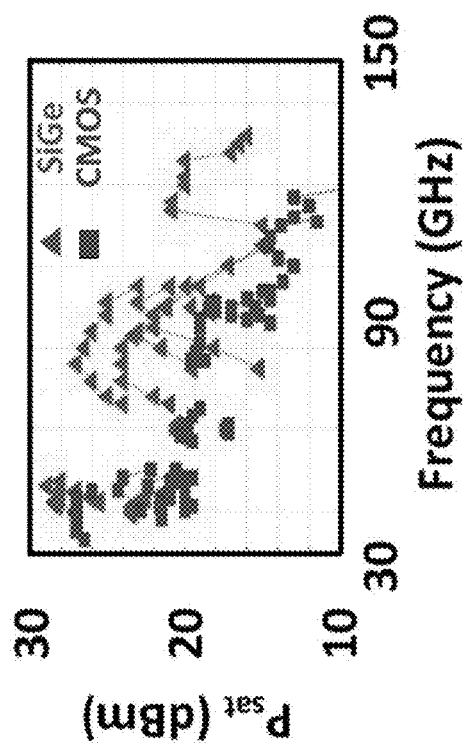
FIG. 2A is a graph that shows the output power ($P_{sat}$) of reported state-of-the-art mm-Wave PAs in silicon processes.
Figure 2B:
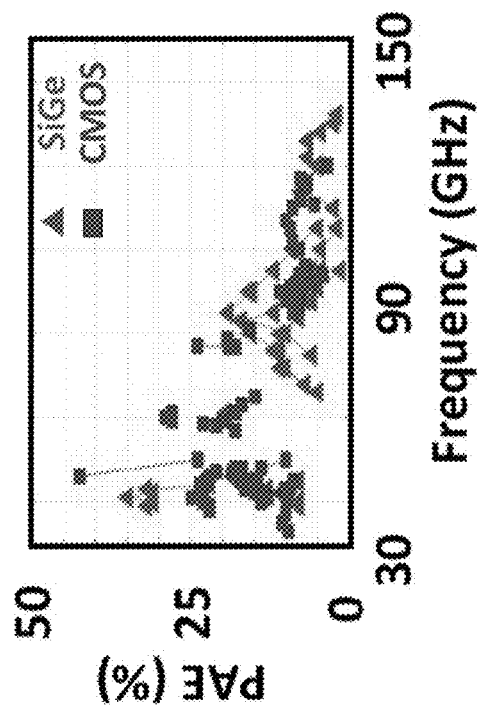
FIG. 2B is a graph that shows the power-added-efficiency (PAE) of reported state-of-the-art mm-Wave PAs in silicon processes.

FIG. 2A is a graph that shows the output power ($P_{out}$ or $P_{sat}$) of reported state-of-the-art mm-Wave PAs in silicon processes. FIG. 2B is a graph that shows the power-added-efficiency (PAE) of reported state-of-the-art mm-Wave PAs in silicon processes. While recent works have demonstrated mm-Wave power generation near the Watt-level range, the operable frequency ranges of these topologies are still limited by the bandwidth of the output matching network.

For a PA to generate maximum power with the highest efficiency over a wide range of the spectrum, it needs to see the changing optimal load-pull impedance over that range. This can be achieved with a multi-order broadband impedance transformation network that allows the impedance presented to the PA cells to be moved closer to the load-pull path. FIG. 3A shows an example of a unit PA cell with stacked architecture with simulated optimal $P_{out}\approx4$ W at 40 GHz. FIG. 3B is a graph that shows variation of power delivery efficiency $$\left(\eta = \frac{P_L}{P_{avs}}\right)$$

for lossless networks of different orders (k) across frequencies from the amplifier cell. FIG. 3C is a Smith Chart showing optimal load-pull path against frequency and convergence of impedance paths followed by matching networks with increasing order towards the optimal one. The Smith Chart is centered at $Z_0=2.5\Omega$. It is generally known that for lossy passives, the efficiency of the network, typically, trades-off with the order of the network, especially for higher impedance transformation ratio required for high output power. In general, there exists strong trade-offs between $P_{out}$, efficiency ($\eta$) and frequency range of operation.

Broadband Multi-Order Symmetrical Power-Combining Architecture

Before elaborating on active impedance synthesis, the following is a review of a classical symmetrical power-combining architecture. At mm-Wave frequencies, due to the limited output power available from a single device, multiple identical PA unit cells are driven symmetrically and power is combined through a symmetrical combining network either in voltage or current domain. FIGS. 4A and 4B are circuit diagrams showing that a traditional current combined N-way symmetrical PA architecture (FIG. 4A) is functionally similar to a single larger PA (of size xN) with a matching network of order k=l+m (FIG. 4B). FIG. 4A shows such an example of an N-way current-combined architecture with the matching networks of order l in each branch and of order m after the combined node. It can be noted that due to the symmetry of operation and architecture, the voltages and currents at all the intermediate nodes are identical which allows the network to be functionally identically to one large PA (xN times the size of each unit cell) followed by the matching network of order l+m. Therefore, the design of such an architecture which operates efficiently over a broad range of mm-Wave frequencies suffers from the same trade-offs between output power ($P_{out}$), efficiency ($\eta$) and frequency range of operation.

Tunable Matching Network

Ideally, a frequency reconfigurable PA could also be realized with a tunable matching network which can be reconfigured to present the optimal impedance over the frequency range. However, at mm-Wave frequencies, tuning elements like varactors are extremely lossy, which significantly limits the range of tunability of such architecture and this topology too, trades-off directly with output power, efficiency and tunability.

Frequency Reconfigurability Through Active Impedance Synthesis—Active Impedance Synthesis The identical nature of the symmetrical power combining architecture (S-combiner) and a single PA of size xN arises due to the symmetry of the combining network and the symmetry of the drive signals. An important concept behind active impedance synthesis is to forgo the symmetry of the architecture, the driving signals of the unit cells and any isolation between them. FIGS. 5A and 5B are circuit diagram showing asymmetrical PA architecture with actively synthesized impedances for the combining cells that allows frequency-reconfiguration (FIG. 5A) operation similar to classical PA with ideal tunable matching network (FIG. 5B). As shown in FIG. 5A, the complex RF currents from each PA cell combine in an asymmetrical network which leads to the impedance seen by each cell as a function of the driving conditions of all the cells i.e. $Z_i=f_i(A_1e^{j\theta_1}, A_2e^{j\theta_2}, \ldots A_Ne^{j\theta_N})$. Therefore, the impedance at each port can be reconfigured by programming the RF driving conditions of the PA cells and complex RF impedances can by synthesized actively at each output. The variation is, of course, a function of the combiner itself, and the central premise of this work addresses the design and analysis of such asymmetrical combining architectures that allows the required programmable impedance synthesis for frequency-reconfigurable operation. FIGS. 5C and 5D are Smith Chart examples of impedance variation of one PA cell as the driving condition of the other PA cell is varied in an asymmetrical combiner. FIGS. 5C and 5D shows an example of such impedance coverage with a two-way Asymmetrical combiner (A-combiner) with a stacked SiGe topology as a unit cell. As shown here, the impedance seen by one cell can be actively reconfigured over the entire Smith Chart by controlling the driving condition of the other cell. FIGS. 5E and 5F are charts showing a conceptual representation of the impedance variation and output power for the frequency-reconfigurable PA which allows the architecture to trace the peaks of the individual plots for optimal operation across the range. FIGS. 5E and 5F show the conceptual representation of the impedance variation and output power ($P_{out}$) of such a frequency-reconfigurable PA respectively for various reconfiguration states across the range of operation. The goal is for the PA to be able to be programmed to trace the peaks of the individual efficiency curves for optimal operation across the range.

In this section we explore if a classical symmetrical architecture designed optimally at a given frequency can be programmed to operate more efficiently with asymmetrical excitation at a different frequency. FIGS. 6A and 6B are circuit diagrams showing a linearized model of a PA output cell consisting of a stacked SiGe topology with intra-transistor matching for output network analysis and synthesis. FIGS. 6C and 6D are graphs showing a comparison of optimal load-pull path ($Z_{opt}$) obtained through nonlinear simulations against $Z_s^*$ showing close correspondence and validity of the model for predicting $Z_{opt}$ against frequency. In order to simplify analysis, we first linearize the operation of a PA cell as an output current source with complex RC impedance where $Z_s=Z_{opt}^*$ where $Z_{opt}$ is the optimal load-pull impedance the central frequency as shown in FIGS. 6A and 6B. This allows us to model the PA over a broad frequency range and FIGS. 6C and 6D show the close correspondence between the simulated and modeled optimal impedance for the stacked topology between 30-100 GHz.

With this linearization, FIG. 7A presents a broadband 2-way mm-Wave PA with an optimized symmetrical multi-order (k=5) lossless combining network designed to operate between 40-100 GHz. As illustrated in FIGS. 7B and 7C the impedances seen by the two cells are identical with symmetric excitations and they closely follow the optimal impedance path over a portion of the frequency range. By reconfiguring the driving conditions, if the impedance seen by one cell is made to follow exactly on the optimal load-pull path that is seen by the other cell will deviate strongly resulting in degradation of net efficiency (FIGS. 7D and 7E). In essence, the optimal driving condition for a symmetrical network is always identical excitations (equi-amplitude and equi-phase) independent of the frequency. However, this generalization does not hold for asymmetrical networks.

Optimal Driving Conditions for a Combiner—Maximum Collective Efficiency of Combiner Consider a (N+1)-port lossless passive combining network where N amplifier cells with complex output impedance $Z_{s,i}$ and available power $|p_i^2|$ combine their power at the $(N+1)^{th}$ port, as shown in FIG. 5. Understandably, power transmitted to the load is a function of the collective impedance mismatches and therefore, dependent on the driving conditions of the amplifiers ($A_ie^{j\theta_i}$, $1 \leq i \leq N$). We will analyze the optimal driving conditions that minimize the collective mismatches at a given frequency, and leads to optimal power efficiency given the combiner network. If the S-parameters of the combiner are defined with respect to the complex terminating impedances, its efficiency can be expressed as $$\eta = \frac{P_{load}}{P_{avs}} \tag{1}$$

$$= \frac{\left|\sum_{i=1}^{N} S_{N+1,i} \cdot p_i\right|^2}{\sum_{i=1}^{N} |p_i|^2}$$

where $p_i$ represents the power-wave at the $i^{th}$ port. By Cauchy-Schwartz inequality, it can be shown that $$\eta = \frac{\left|\sum_{i=1}^{N} S_{N+1,i} \cdot p_i\right|^2}{\sum_{i=1}^{N} |p_i|^2} \leq \frac{\sum_{i=1}^{N} |S_{N+1,i}|^2 \cdot \sum_{i=1}^{N} |p_i|^2}{\sum_{i=1}^{N} |p_i|^2} = \tag{2}$$

$$\sum_{i=1}^{N} |S_{N+1,i}|^2 = 1 - |S_{N+1,N+1}|^2$$

The upper bound or optimal efficiency is achieved when each PA cell is driven as $$p_i \propto S_{N+1,i}^* \tag{3}$$

The design of the a frequency-reconfigurable PA therefore, relies on the co-design of the combiner and the PA cells that allows the existence of such an optimal driving condition that can synthesize the optimal load-pull impedances across all the cells over the frequency range.

Efficiency of Each Driving Source

The efficiency of $i^{th}$ source is given by $\eta_i = 1 - |r_i|^2$ where $|r_i|^2$ is the fraction of power delivered to the other ports and $r_i$ is given by, $r_i = (\sum_{j=1}^{N} S_{i,j} p_j)/p_i$. Therefore, under optimal driving conditions, $r_i = \sum_{j=1}^{N} S_{i,j} \cdot (S_{N+1,j}/S_{N+1,i})^*$. For a passive lossless (N+1)-port network, we know that $SS^H = I_{N+1}$ (i.e. $\sum_{j=1}^{N+1} S_{i,j} S_{N+1,j}^* = 0$) which implies $\sum_{j=1}^{N} S_{i,j} S_{N+1,j}^* = -S_{i,N+1} \cdot S_{N+1,N+1}^*$. This gives $$r_i = \frac{\sum_{j=1}^{N} S_{i,j} \cdot S_{N+1,j}^*}{S_{N+1,i}^*} = -\frac{S_{i,N+1} S_{N+1,N+1}^*}{S_{N+1,i}^*} \tag{4}$$

Therefore, the efficiencies of all the sources under optimal driving conditions are identical and is given by $$\eta_i = 1 - |r_i|^2 = 1 - |S_{N+1,N+1}|^2 = \sum_{i=1}^{N} |S_{N+1,i}|^2 = \eta \tag{5}$$

Frequency Reconfigurability by Reconfiguring Driving Conditions

The bound expressed in (2) gives the maximum achievable efficiency at a given frequency obtained by reconfiguring the driving conditions of the combining cells according to (3) that minimizes the collective mismatches of all the unit cells. The expressions in (3)-(5) proves our previous observation that for a symmetric combiner ($S_{N+1,i}$ identical for all i), the optimal driving conditions at any frequency is equi-amplitude and equi-phase and higher power cannot be extracted by deviating from this condition. Evidently, this does not hold for an asymmetrical network.

FIG. 8A is a circuit diagram showing an example of a two-way asymmetrical architecture with the same PA cells ($PA_1 = PA_2$) as in FIG. 7. FIGS. 8B and 8C are graphs showing impedance paths followed by both the cells follow closely the load-pull path when driven optimally. FIGS. 8D and 8E are graphs showing the optimal driving conditions ($x_i$) across frequencies and the efficiency of power delivery when re-configured for two sets of driving conditions at 35 GHz and 75 GHz. Achievable maximum efficiency traces the peaks of all such frequency-specific configured curves as seen by the dotted line.

FIG. 8A illustrates this concept with the identical PA cells shown in FIG. 7, where the symmetrical combiner has been modified to introduce asymmetry. As shown in FIG. 8B-8E, by reconfiguring its voltage driving condition as $p_2/p_1 = xe^{j\Theta} = (S_{32}/S_{31})^*$, the PA can be operated with higher efficiency over a much broader range of frequencies, compared to a higher-order symmetrical combiner. In essence, a reconfigurable quasi-higher order network is synthesized with a lower number of passives as shown in the comparison in FIGS. 7B-7C and FIGS. 8D-8E between the S-combiner (l=4, m=1) and A-combiner (l=4, m=0). As also seen in the figures, the impedances seen by the cells are not identical, but closely trace the optimal path resulting in higher overall efficiency over the frequency range. It is important to note that in this example, as the PA is reconfigured for optimal operation across frequencies, both the PA cells do not deliver the same output power (FIGS. 8D-8E), but collectively maintains the overall efficiency and total output power level over the reconfigurable range. Functionally, this example is equivalent to multiple narrow-band switchable amplifiers, but this distributed approach eliminates the need for complex lossy mm-Wave switching networks and encompasses the functionality in a monolithic network where reconfiguration can be achieved efficiently.

While the linearized model establishes the concept of active impedance synthesis, the constant output impedances of the unit cells in the model ($Z_s = Z_{opt}^*$) at a given frequency independent of the driving conditions do not fully capture the voltage and current saturation effects for peak operation in a nonlinear PA. The amplitude variation in the driving conditions can be achieved digitally through a power-mixer/RF-DAC architecture by switching on and off-cores which simultaneously modulates the optimal load-pull impedance required for peak efficiency operation. Therefore, the network synthesis and the PA cell-operation need to be co-designed to ensure optimal efficiency throughout the operating range.

FIG. 9A is a circuit diagram showing an example of a digital PA architecture where amplitude control is achieved through asymmetric switching of the PA cells. FIGS. 9b and 9C are graphs showing the total output power from each cell across frequency normalized to that in a symmetrical combiner and phase control across the frequency of operation. FIGS. 9D and 9E are graphs showing a comparison of efficiency of the A-combiner and S-combiner for ideal and lossy passives. The total output power of the A-combiner normalized to the S-combiner shows higher power delivery with higher efficiency across the frequency with almost 50% improvement in efficiency and output power over certain frequency range for lossy passives for the design example presented.

FIG. 9A shows a conceptual architecture and a design example, where frequency-dependent amplitude control is achieved digitally through switching appropriate fraction of the cores in the combining cells and phase control is achieved in the LO path. FIGS. 9B-9C shows the phase control and simulated output power of each cell normalized to that in an S-combiner. FIGS. 9D and 9E show the achievable efficiency in an A-combiner against an S-combiner with ideal and lossy passives. The design example demonstrates higher power delivery with higher efficiency across the frequency range with nearly 50% improvement in efficiency and output power over certain frequency ranges for lossy passives. This distributed approach removes the complexity of broadband output combiners and implicitly encompasses this in the active controls of the combining cells, suitable for silicon implementation.

It should be understood that an amplitude/phase controller configured to control the amplitude and/or phase at each of the PAs can be implemented in a variety of ways based on the disclosure above. The amplitude/phase may be inserted anywhere along the signal path. In most cases the amplitude/phase controller will be inserted prior to the input to the asymmetrical combiner. The amplitude/phase controller may be implanted in hardware or a combination of hardware and software. For example, each of the PAs can be configured with a control port configured to receive a control signal or control output to control the amplitude/phase of the generated at the amplifier output. The control output may be configured as a bias control signal in each of the n amplifiers. The control output may be realized with a separate active device connected to each of the plurality of n amplifiers. An input distribution network may be coupled to the input of each of the PAs. The input distribution network includes amplitude and/or phase control. The amplitude/phase controller may include at least one of the following: variable capacitors, variable inductors and variable delay lines. The amplitude/phase controller may be configured to control amplitude/phase by vector summation of in-phase and quadrature phase input signal. The amplitude/phase controller may be configured for optimal linearity of the PAs. The amplitude/phase controller may be configured for canceling AM-PM distortion of the PAs. The amplitude/phase controller may be configured for overcoming antenna impedance mismatches.

Network Synthesis and Design Methodology

The previous sections describe the active impedance synthesis properties of an asymmetrical architecture with design examples and in this section, we will describe design methodologies for synthesizing such a network. As discussed before, the synthesis of an S-combiner is equivalent to that of a 2-port combiner. An asymmetrical network synthesis is however a multi-port synthesis problem. While there are formal methods to construct the S-parameter description of such a network and synthesize it, in following provides an intuitive design methodology which can be further improved with more sophisticated optimization procedures.

Condition 1: Power Transfer Efficiency

FIG. 10A is a circuit diagram showing synthesis of a two-way asymmetric combiner with ideal passives with each source being modeled with their complex output impedance $Z_{s1,2}=Z_{opt1,2}^*$. FIG. 10B is a circuit diagram showing a simplification of the 3-port network by encompassing the network $NW_3$ into one impedance $Z_3$ and the lossless nature of the passives ensures $\eta_A=\eta_B$. This decouples the 3-port network problem into the synthesis of two 2-port networks.

Let us consider the 2-way A-combiner with lossless passive components (FIG. 10A) that achieves constant efficiency over a desired frequency range with both the PAs operating nearly at the peak of their output power levels. Therefrom (2), and (3), we desire a network which satisfies $\eta=|S_{31}|^2+|S_{32}|^2=1$ (i.e. $|S_{33}|^2=0$) and also $$\frac{|p_1|^2}{|p_2|^2} \approx r,$$

where 'r' is the ratio of sizes of the two PA cells implying $$\frac{|S_{31}|}{|S_{32}|} \approx \sqrt{r}$$

It has to be remembered that the S-parameters are defined with respect to the complex impedances $Z_{ref}=(Z_{s1},Z_{s2},Z_o)$. Since the networks are lossless, the architecture can be simplified by encompassing $NW_3$ into one impedance $Z_3$ as shown in FIG. 10B. Therefore, the maximum achievable efficiency in power delivery is $\eta=1-|S_{33}|^2$, where $S_{33}$ is given by $$S_{33}=(Z_1\|Z_2-Z_3^*)/(Z_1\|Z_2+Z_3) \qquad (6)$$

Defining reflection coefficients as $$\Gamma_i = \frac{Z_i - Z_o}{Z_i + Z_o}$$

as shown in FIG. 11A, it can be shown that $$S_{33} = \frac{\left[\Gamma_1\Gamma_2 - \frac{1-\Gamma_1}{2} \cdot \frac{1-\Gamma_2}{2}\right] - \Gamma_3^*\left[1 - \frac{1-\Gamma_1}{2} \cdot \frac{1-\Gamma_2}{2}\right]}{\left[1 - \frac{1-\Gamma_1}{2} \cdot \frac{1-\Gamma_2}{2}\right] - \Gamma_3\left[\Gamma_1\Gamma_2 - \frac{1-\Gamma_1}{2} \cdot \frac{1-\Gamma_2}{2}\right]} \qquad (7)$$

In order to maximize efficiency, $|S_{33}|\approx0$ and this implies $$\left[\Gamma_1\Gamma_2 - \frac{1-\Gamma_1}{2} \cdot \frac{1-\Gamma_2}{2}\right] - \Gamma_3^*\left[1 - \frac{1-\Gamma_1}{2} \cdot \frac{1-\Gamma_2}{2}\right] = 0 \qquad (8)$$

Considering a simplified network where the PAs combine directly at the load (i.e. $\Gamma_3=0$ or $Z_3=Z_o$), this simplifies to the following condition $$\Gamma_1\Gamma_2 - \frac{1-\Gamma_1}{2} \cdot \frac{1-\Gamma_2}{2} = 0 \qquad (9)$$

Condition 2: Peak Operation of Both Cells

In order to ensure that both the PA cells operate at peak power over the range, the network as shown in FIG. 10A needs to satisfy $$\left(\frac{|S_{31}|}{|S_{32}|}\right) \approx \sqrt{r}.$$

By dissociating the 3-port network into two separate 2-port networks, we perform an S-parameter transformation where terminating impedances are transformed from $Z_{ref}=(Z_{s1},Z_{s2},Z_o)$ to $Z_{ref1}'=(Z_{s1},Z_2\|Z_3)$ and $Z_{ref2}'=(Z_{s2},Z_1\|Z_3)$ respectively as shown in FIG. 11B. Assuming as before, both PAs combining directly on the load, as shown in the Appendix, it can be proved that that the 2-port network in FIG. 11B satisfies $$|S_{aa'}|^2 = \frac{(1-|\Gamma_1|^2)\cdot(1+\text{Re}\{\Gamma_2\})}{2\left|1 - \frac{1-\Gamma_1}{2}\cdot\frac{1-\Gamma_2}{2}\right|^2} \quad (10)$$

For lossless network, $|S_{aa'}|^2 = 1-|S_{aa}|^2 = 1-|S_{11}|^2 = |S_{12}|^2 + |S_{13}|^2$. This implies $$|S_{12}|^2 + |S_{13}|^2 = \frac{(1-|\Gamma_1|^2)\cdot(1+\text{Re}\{\Gamma_2\})}{2\left|1 - \frac{1-\Gamma_1}{2}\cdot\frac{1-\Gamma_2}{2}\right|^2} \quad (11)$$

Similarly, for applying the same procedure to $NW_2$, we obtain $$|S_{12}|^2 + |S_{23}|^2 = \frac{(1-|\Gamma_2|^2)\cdot(1+\text{Re}\{\Gamma_1\})}{2\left|1 - \frac{1-\Gamma_1}{2}\cdot\frac{1-\Gamma_2}{2}\right|^2} \quad (12)$$

Substituting $|S_{31}|^2 = r|S_{32}|^2$ and performing (12)-(11) with $|S_{31}|^2 + |S_{32}|^2 = 1$, we get $$\frac{1-r}{1+r} = \frac{1}{2}\cdot\frac{(1-|\Gamma_2|^2)\cdot(1+\text{Re}\{\Gamma_1\}) - (1-|\Gamma_1|^2)\cdot(1+\text{Re}\{\Gamma_2\})}{\left|1 - \frac{1-\Gamma_1}{2}\cdot\frac{1-\Gamma_2}{2}\right|^2} \quad (13)$$

If we choose identical PA cells (FIG. 8) i.e., r=1, from (13) we get the second condition for peak operation $$\frac{1+\text{Re}\{\Gamma_1\}}{1-|\Gamma_1|^2} = \frac{1+\text{Re}\{\Gamma_2\}}{1-|\Gamma_2|^2} \quad (14)$$

In summary, (9) and (14) may have multiple solutions and therefore, the network is not unique. As an example, $\Gamma_2=\Gamma_1$ satisfies (14) and leads to the symmetrical structure, while another solution $\Gamma_2=\Gamma_1^*$ results in an asymmetrical combiner. Substituting this in (9), we obtain a relationship on $\Gamma_1$ as $$|\Gamma_1| = \left|\frac{1-\Gamma_1}{2}\right| \quad (15)$$

Design Example

In this example, we will demonstrate synthesis for an asymmetrical PA architecture operating between 30-80 GHz with the center frequency of 55 GHz based on the described methodology. FIG. 12A shows the unit PA cell (stacked topology with 96 μm×0.13 μm emitter size) with its output impedance ($Z_s = Z_{opt}^*$) represented by the parallel network of $R_s=20\Omega$, $C_s=190$fF. Firstly, an inductor ($L_{mp}=45$ pH) is added in both branches to resonate out the source capacitance of 190 fF at the center frequency of 55 GHz and connect with the supply. With that established, the second condition of $\Gamma_2=\Gamma_1^*$ which satisfies (14) can be accomplished by adding inductor ($L_{ms}$) in series in one branch and capacitor ($C_{ms}$) in series in the other branch, such that $j\omega_0 L_{ms} = -1/j\omega_0 C_{ms}$ at the center frequency $\omega_0$. The other condition expressed in (15) for efficiency enhancement can be solved with $$\Gamma_1 = \frac{R_s + j\omega_0 L_{ms} - Z_0}{R_s + j\omega_0 L_{ms} + Z_0}$$

at $\omega_0$ leading to $L_{ms} \approx 110$ pH and $C_{ms}=75$ fF. As shown in FIGS. 12B-12C, the realized network maintains $\Gamma_2 \approx \Gamma_1^*$ across the frequencies 40-70 GHz with reconfigurable η>95% which can be improved to cover 30-75 GHz with slight tuning of the parameters (FIGS. 12A and 12D). FIG. 12D shows that even with a static configuration (@ 50 GHz), the A-combiner based architecture shows an instantaneous broadband performance with a simple second-order network in each branch.

FIGS. 13A and 13B are circuit diagrams showing intuitive understanding of the broadband nature of A-architecture by enabling the phase control with passive elements leading to an effective broadband higher-order output combining network. FIG. 13C is a graph showing a comparison of the maximum efficiency of FIGS. 13A and 13B. FIG. 13D is a circuit diagram showing dissociating the broadband higher-order output network and encompassing the phase shifter either at baseband, or at the input or at the intermediate stage minimizing output combiner loss. FIGS. 13E and 13F are graphs showing a comparison of the A-architecture vs optimized S-architecture for ideal and lossy passives.

The broadband nature of the A-combiner is implicitly encompassed in the phase rotations at the input of the combining cells. An intuitive reasoning is presented in FIG. 13A-13F. Consider the phase rotations induced at the input of the source be transferred to the output and be realized with passive elements as shown in FIGS. 13A-13B. This results in a characteristic broadband higher-order combiner with a single source displaying efficiencies similar to that of the A-architecture (FIG. 13C), but with the additional losses and shortcomings of a complex output combiner as discussed before. The N-way asymmetrical architecture breaks this trade-off between output power, efficiency and frequency range by dissociating the complexity of a higher-order combiner network into a simple phase rotations realizable at any of the previous stages, either though variable delay lines or digitally through I,Q phase rotations, leading to a high-efficiency reconfigurable architecture (FIG. 13D). FIG. 13E-13F show the comparison between $2^{nd}$-order A and S-architectures with ideal and lossy passives.

Asymmetrical Vs Symmetrical Design Trade-Offs

The ability to synthesize complex RF impedances actively creates very interesting design trade-offs and in this section, we provide qualitative and quantitative comparison of the frequency reconfiguration properties and its dependence on the design parameters such as the order of the network, size and size ratio of the constituent amplifiers and number of combining stages.

Order of the Network k (l+m)

Unlike a symmetrical combiner, the network order of an A-combiner does not get reduced and equivalently, a quasi-higher order reconfigurable network can be synthesized with lower number of matching elements. FIGS. 14A and 14B illustrate this trade-off comparing the reconfigurable peak efficiency of a 2-way A-combiner with k=4 against optimized S-combiners with k=5-9 with ideal and lossy passives. The combined cell size is identical to the one described in FIG. 6. The reduction in number of passive elements enables higher efficiencies achievable over the entire range with nearly 50% improvement over a range of frequencies for the design examples presented.

Scaling of Output Power

Expectedly, increasing the size of the constituent amplifiers to increase output power also simultaneously increases impedance transformation ratio which typically reduces network efficiency due to higher losses. This makes it even more difficult to realize high power and efficient mm-Wave PA capable of operating over a large frequency range of operation. Reducing the order of the network and synthesizing the desired complex RF impedances actively helps to break this trade-off. This is illustrated in FIGS. 15A and 15B which compare the efficiency of the two architectures with k=4 and k=5 respectively for different power scaling ratios.

Sizing of the Combining Cells:

The previous examples illustrate asymmetrical combining network with identical PA cells. FIGS. 16A and 16B show the variation of the performance as the splitting ratio is varied between the combining cells for a 2-way combiner for constant output power. Intuitively, for a high value of r (say r=100), the architecture is equivalent to one cell and expectedly, the asymmetrical architecture is essentially equivalent to that of a symmetrical combiner. As shown in the example in FIGS. 16A and 16B, with increase in r, the A-combiner progresses towards a S-combiner with maximum efficiency improvement achieved near r=1.

Number of Combining Stages

Intuitively, the asymmetrical architecture exploits the non-existence of symmetry in the combining networks to synthesize the variable complex RF impedance over frequency. Therefore, with larger number of combining cells, the architecture can leverage more energy-storing elements to enable frequency reconfigurability over an even broader range of frequencies for the same output power. Unlike the symmetrical architecture, where the network order remains unchanged with the number of combining cells, the effective order of the network of an A-combiner increases with increase in 'η' enabling it to break the trade-off between frequency range of operation and output power. This is illustrated in FIGS. 17A and 17B.

Bounds of frequency range of operation Symmetrical Vs Asymmetrical

So far, we have understood intuitively that A-combiner performs more efficiently than the S-combiner due to the higher effective order of the combining network owing to the asymmetry. This can be quantitatively understood from the bounds similar to the ones developed by Bode-Fano that relate efficiency (η) to the attainable bandwidth (B) of a given network.

S-Combiner

The bandwidth bound of an N-way S-combiner being mathematically identical to a 2-port network due to operational symmetry (FIGS. 18A and 18B) is given by the Bode-Fano bound as:

$$\int_0^\infty \ln\left(\frac{1}{|r(f)|}\right)df = \int_0^\infty \ln\left(\frac{1}{\sqrt{1-\eta(f)}}\right)df \leq \frac{1}{2RC} \quad (16)$$

where $|r(f)|^2$ and $\eta(f)$ represent the fraction of the reflected power and the transmitted efficiency of the network respectively. The bound is independent of load and matching network and depends only on the time constant of source impedance (RC) and shows clearly the trade-off between η and BW.

A-Combiner

FIG. 19A is a circuit diagram showing a general (N+M) port passive network with M uncorrelated sources driving N loads defined by load S matrix ($S_L$) whose bound scales as N/M. FIG. 19B is a circuit diagram showing that by setting M=1 and N identical RC loads in FIG. 19A to arrive at FIG. 19B which has N-times higher bound than a single RC network. FIG. 19C is a circuit diagram showing an A-architecture with a combiner employing N-sources with scaled output impedances (NR,C/N) driving a single load $Z_o$ (obtained by interchanging the sources and loads) has N-times bound compared to a S-architecture. FIG. 19D is a graph showing a simulation of the bound of a 2-way A-combiner showing twice the bound of that of an S-combiner.

The bandwidth limitations of an A-combiner is related to the bound of a multi-port system and is more complex. It has recently been shown in that the integral bound for a multi-port network with M uncorrelated sources driving N loads (defined by S-parameter $S_L$) as shown in FIG. 19A is given by $$\int_0^\infty \ln\left(\frac{1}{|r(f)|}\right)df \leq \frac{-1}{4M}\left(\sum_i p_{L,i} + \sum_i z_{L,i}\right) \quad (17)$$

where $|r(f)|^2$ is the power reflection ratio [55] and $p_{L,i}$, $z_{L,i}$s are the poles and zeros of $S_L$. Therefore, for a single source with N identical RC loads (FIG. 19B), the bound is N-times that of a 2-port network and given by $$\int_0^\infty \ln\left(\frac{1}{|r(f)|}\right)df \leq \frac{-1}{4}\left(\sum_i p_{L,i} + \sum_i z_{L,i}\right) = \frac{N}{2RC} \quad (18)$$

where the power reflection ratio is given by $|r(f)|^2=|S_{11}|^2=1-\Sigma_{j=2}^{N+1}|S_{j,1}|^2$. As shown in FIG. 19C, if we now interchange the sources and loads resulting in the A-combiner with the load $Z_o$ at port 1, the maximum efficiency of such an A-combiner from (2) due to the reciprocal nature of the passive network is given by $\eta_{max}=\Sigma_{j\neq 1}|S_{1,j}|^2=\Sigma_{j\neq 1}|S_{j,1}|^2=1-|r(f)|^2$ which results in the bound for maximum achievable efficiency for an N-way A-combiner as $$\int_0^\infty \ln\left(\frac{1}{\sqrt{1-\eta_{max}}}\right)df \leq \frac{N}{2RC} \quad (19)$$

Hence, the bound for an N-way A-combiner is N times that of an N-way S-combiner. This is the essence behind the frequency-reconfiguration property of the proposed asymmetrical architecture. FIG. 19D illustrates this property and shows simulated bounds for 2-way symmetrical and asymmetrical combining architectures with networks that reach close to the maximum achievable bounds.

mm-Wave PA Design and Implementation

A close co-design process between the constituent PA cells and the output combiner is followed for co-optimization of peak power and efficiency across the frequency range.

Choice of the Unit PA Cell:

A stacked topology for a PA cell was chosen for its higher gain, PAE and higher optimum impedance by allowing larger voltage swings across the output. The optimum intra-stack matching is employed to maximize output power extracted from the common emitter transistor to be pumped into the stacked transistor. For a wideband performance, the double-stack configuration with a transmission-line for intra-stack matching is chosen in our design as shown in FIG. 20A.

Combiner Design

FIG. 20A is a circuit diagram showing and output asymmetrical combiner with stacked PA unit cells with intra-stage t-line matching. The cells are sized at a ratio of 1.5:1. FIGS. 20B and 20C are graphs showing optimal driving conditions for amplitude and phase for frequency-reconfigurable operation. The bottom figure shows the power delivery efficiency of the combiner $$\left(\eta = \frac{P_L}{P_{avs}}\right).$$

FIG. 20D is a graph showing simulated output power ($P_{out}$) against $P_{avs}$ which is the maximum combined power that can be extracted from the PA cells with lossless networks designed optimally at each frequency.

The combiner was designed following the methodology described above to ensure that the PAs operate close to peak efficiency and output power throughout the frequency range. FIG. 20A shows the details of the combiner. Given the range of amplitude and phase rotations, the 2-way combiner was co-designed with the PA cells which were sized at a near-optimal ratio of r=1.5. It can be shown that given a constant available power, maximization of output power can be achieved by modifying (2) and optimizing $$\eta_{max} = \frac{\left\| S_{31} \sqrt{r} \right\| + |S_{32}| \right\|^2}{r+1}$$

across frequencies. To ensure peak operation for the designed combiner with the ratioed PA cells, it can be shown that the optimal driving conditions should satisfy $$\frac{p_2}{p_1} = \frac{xe^{j\theta}}{\sqrt{r}} \text{ and } \left|\frac{p_2}{p_1}\right| \approx \frac{1}{\sqrt{r}}.$$

As shown in FIGS. 20B-20C, with the amplitude control ('x') between 1 and 1.2 and phase control within 30°, $\eta_{max}$>70% could be achieved across 45-80 GHz. The combiner is realized with shielded micro-strip transmission lines and realized with the top Al metal layer of 4 μm thickness. FIG. 20D shows the simulated performance of the output PA stage with the combiner showing the ability for $P_{out}$ to follow closely $P_{avs}$ across 40-80 GHz where $P_{avs}$ is defined as the maximum combined output power by both the PA cells when presented with optimal impedances realized with lossless matching networks designed separately at each of the frequencies.

Complete PA Architecture

The complete schematic of the proof-of-concept PA is shown in FIG. 21. The PA cells in the output stage are double-stacked with the transistors sized 4×18 μm and 4×12 μm in the upper and lower branches respectively. Both these PA cells operate from 4V supply. The capacitors used for intra-stack matching at the base of the stacked transistor are absorbed in the parasitics in both the branches. The driver amplifiers are common-emitter stages sized 4×9 μm and 4×6 μm in upper and lower branches respectively, and operate from a 1.6 V supply. Amplitude control is achieved by controlling the gain of the PA cells through bias control, while the differential phase tuning of up to 40° is achieved by through a variable-delay transmission line realized with distributed varactors. In order to minimize the effect of loss on the output power, the delay lines are integrated with the input matching. The simulated input matching is broadband with $S_{11}$ below −10 dB across 30-80 GHz. The inter-stages are designed to be broadband with losses below 3.2 dB and 2.1 dB for the upper and lower branches respectively for 40-80 GHz. The combiner loss is below 1.2 dB across 40-80 GHz. It can be noted that, in integration with the full transmitter system, the amplitude control could be achieved through a multibit DAC structure and the phase tuning could be achieved at the baseband itself. Enabling a wide phase synthesis can allow further optimization of a compact asymmetrical combiner architecture not constrained by the limited phase rotations of RF phase shifters.

Measurement Results

The PA is implemented in 0.13 μm SiGe BiCMOS process and the chip micrograph is shown in FIG. 22. The chip measures 1.23×0.83 mm² with the active area measuring 1.1×0.32 mm². The main stage PA cells operate from 4V supply while the driver cells operate from 1.6V supply.

S-Parameter Measurement

The measured S-parameters for the chip when reconfigured for maximum output power at the center frequency are shown in FIGS. 23A and 23B. The input matching is broadband with $S_{11}$ below −9.5 dB across 30-80 GHz. The small-signal gain peaks at 18 dB at 39 GHz. It can be noted that even though the PA architecture and output combining network is designed for maximizing output power across the frequency range, phase reconfiguration can be applied to reconfigure the output impedance and can enhance small-signal gain performance, as noted by a 1.3 dB increase in small-signal gain at 70 GHz shown in FIGS. 23A and 23B.

Large-Signal Measurement

The PA was characterized for large signal measurement across 30-80 GHz where the PA is reconfigured at each frequency through bias and phase control. During reconfiguration, the bias voltages for the base of the common-source transistors and that of the stacked transistor are varied from 0.8-0.9 V and 2.6-2.9 V through resistive dividers, both of which enable gain control and amplitude control of the PA. The control voltage for the variable delay line between 0 to 1 V controls the relative phases between the two branches. The measured large-signal performance for the PA across 40-65 GHz is shown in FIGS. 24A-24F. The measured $P_{sat}$ and $PAE_{peak}$ for the frequencies 30-70 GHz is shown in FIG. 25A. The peak $P_{sat}$ is 23.6 dBm at a $PAE_{peak}$ of 27.7% at the center frequency of 55 GHz and maintains a frequency reconfigurable $P_{sat}$>22 dBm with $PAE_{peak}$>25% between 40 and 60 GHz. The reconfigurable $P_{sat}$ 1 dB-bandwidth spans 25 GHz between 40-65 GHz while that of the $PAE_{peak}$ spans between 40-60 GHz. The linearity of the PA and its ability to perform with high-efficiency at back-off is indicated by its 1 dB compression measurement. As shown in FIG. 25B, reconfigurable $P_{1\ dB}$ peaks at 19.9 dBm at a PAE of 15.7% at 55 GHz. The measured variations of $P_{sat}$ against frequency for three different reconfiguration states at 45, 55 and 65 GHz is shown in FIG. 25C.

Measurement with Non-Constant Envelope Modulation

FIG. 26A is a block diagram showing a measurement Set-up for non-constant envelope modulation. FIGS. 26B-26D show measured constellations and EVM variation against output power for 16-QAM at data rate of 2 Gbps at 40 GHz and 60 GHz. FIGS. 26E-26G show measured constellations and EVM variation against output power for 64-QAM at data rate of 3 Gbps at 40 GHz and 60 GHz.

The measurement set-up for measuring the PA performance with non-constant envelope modulations is shown in FIG. 26A. The baseband data from Agilent M8195A Arbitrary Waveform Generator (AWG) with a sampling rate of 65 GS/s is up-converted through an external mixer as an input to the chip and is later down-converted through an identical mixer, then captured by a real-time oscilloscope with a sampling rate of 20 GS/s, and analyzed through the VSA software on PC. The measured constellations 16QAM and 64QAM across 40-60 GHz for data rates of 2 Gbps and 3 Gbps respectively along with EVM are shown in FIGS. 26B-26G. EVM of below −21 dB for $P_{avg}$<14.5 dBm for 16QAM and an EVM of below −25 dB for $P_{avg}$<11.7 dBm for 64QAM is observed for 40-60 GHz. Currently, the linearity measurement is limited by the linearity of the input mixer, which results in these output power levels fall below the measured $P_{1\ dB}$. The measured AM-PM distortion between 40-60 GHz is shown in FIG. 27. It is measured as the r.m.s. phase error of the measured constellation of modulated-QPSK signals corresponding to different power levels. The phase distortion of below 1.5° is observed for output powers below 14 dBm for 40-60 GHz and is also currently limited by the linearity of the input mixer in the measurement setup.

Disclosed herein are circuits and active impedance synthesis techniques which exploit interaction of multiple PA cells in an asymmetric combiner architecture to enable frequency-reconfigurable operation over a broad range of mm-Wave frequencies. Also presented are analysis and design criteria of the disclosed architecture along with detailed comparison with the classical symmetrical architecture. As a proof of concept, an integrated PA implemented in 0.13 μm SiGe BiCMOS process is demonstrated to achieve a peak Psat of 23.6 dBm at a peak PAE of 27.7% with a frequency reconfigurable P_(sat,−1 dB) bandwidth of 25G ranging from 40-65 GHz. The PA maintains P_sat>22 dBm at a PAE>20% across the frequencies 40-65 GHz. Multi-Gbps data rates with non-constant envelope modulations of 16-QAM and 64-QAM at mm-Wave frequencies is demonstrated.

A Generalized Approach Towards Frequency and Back-Off Reconfigurability in mm-Wave PAs With the expected proliferation of devices and technology in the mm-Wave frequency region (30-100 GHz) from 5G and wireless connectivity to imaging and sensing, future mm-Wave wireless architectures are expected to work in an extremely heterogeneous environment, where frequency and waveform agility with high energy efficiency will be key to ensure maximal utilization of spectral resources. These include techniques such as spectrum pooling and dynamic allocation of spectral resources, and using non-constant modulation schemes with OFDM resulting in high peak-to-average-power-ratio (PAPR) in the range of 9-10 dB. This requires mm-wave transmitter (Tx) architectures to move from fixed-frequency and high peak-efficiency operation to being frequency-reconfigurable with high back-off efficiency across the range. It is well known that a traditional PA topology suffers from strong trade-offs between output power, efficiency, frequency reconfigurability and spectral efficiency. This is highlighted in FIG. 28A which shows the efficiency variation of a mm-Wave DAC (with class-B PA cell) against the two axes of reconfiguration: output power and frequency. As can be seen, the topology performs with maximum efficiency at a given frequency for a given output power due to the optimal output impedance presented by the matching network. As shown in FIG. 28A, the efficiency can degrade drastically away from this optimal design condition, particularly for high output power and low supply voltage. An ideal reconfigurable Tx topology, that is both frequency and back-off reconfigurable, should display a constant efficiency across the plane of variation. This can be achieved if the output network can be made to present a dynamically reconfigurable impedance efficiently across the 2D surface ensuring simultaneous voltage and current saturation for all its regions of operation (FIG. 28B, 28C).

Techniques such as Doherty, outphasing, and envelope tracking, can offer improvement at PBO at a given frequency (FIG. 28A), but the complexity and overhead of employing these at mm-Wave frequencies can be substantial. Even at one frequency, Doherty (and its variations) are a subset of embodiments of a broader set of possible networks that exploit load-modulation to synthesize optimal impedances at back-off, some of which can have much superior spectral properties with low-loss and low area overhead. On the other hand, wide-band networks can theoretically enable optimal efficiency against frequency at a given power level (FIG. 28A), but the losses associated with complex multi-order network at mm-Wave frequencies can be prohibitively large. In this section, we present a generalized network synthesis approach towards re-configurable PAs that allows dynamic synthesis of the optimal impedances for PBO and frequency reconfigurability to enable high-efficiency operation with spectrally-efficient modulation over a wide frequency span, a key towards approaching a universally programmable Tx architecture.

Reconfigurable Architecture

Generalized (N+1)-Port Architecture for Dual Reconfigurability

The generalized architecture is shown in FIG. 28D, where an array of asymmetrically-coded binary-weighted mm-Wave DACs combine in an asymmetric multi-port network. Separate mechanisms are employed to generate controllable mutual load-modulation to create the optimal impedances necessary for the dual reconfigurability. Firstly, to enable frequency reconfigurability at peak power level, all the combining cells should be fully switched ON. Tunable optimal operation across frequencies can be ensured simply with phase control of the inputs. Secondly, to generate a given back-off power efficiently at a given frequency, the network needs to be designed such that there exists a set of optimal amplitude codes for the combining cells. These codes should ensure that when $1/M_i$ fraction of the $i^{th}$ cell is switched on, the mutual interactions should present to it, the optimal impedance of:

$$Z_{PBO,i,M_i} = M_i R \hat{\parallel} j/(\omega C) \text{ for all } 1 \le \hat{i} \le N$$

See FIG. 29A. For a different operating frequency, a different set of optimum asymmetric switching codes can exist for the same PBO level. If this is guaranteed for all PBO levels at all frequencies, the PA efficiency remains constant (assuming low losses in the off-resistance of the cells). Therefore, to enable dual reconfigurability, the network is co-synthesized with the set of mm-Wave DACs to ensure the existence of a set of these optimal amplitude words.

Network Synthesis and Design Methodology

It can be noted that, unlike a classical symmetrical combining topology whose order remains constant with the number of elements, the proposed asymmetrical network-order scales with the number of combining elements. This enables higher power combining efficiency across a wider range of frequencies and deeper back-off levels.

In order to illustrate the design methodology, we present example synthesis of a 2-way combining topology, as shown in FIG. 29A. The network is defined by the parameters $$\Gamma_i = \frac{z_i - z_0}{z_i + z_0}$$

and for simplicity, we assume that the PAs directly combine at the output i.e. $\Gamma_3=0$. Modeling each PA cell by its output load-pull impedance, it can be shown that the maximum efficiency of such a network is given by $\eta_{max}=|S_{31}|^2+|S_{32}|^2=1-|S_{33}|^2$ when the combining cells are driven such that the power wave at the $i^{th}$ port, $a_i \propto S_{3,i}*$. To ensure, $\eta_{max}\approx 1$ i.e. $S_{33}\approx 0$, the following condition for the network can be derived $$\Gamma_1\Gamma_2 - \frac{1-\Gamma_1}{2}\cdot\frac{1-\Gamma_2}{2} = 0 \quad (1)$$

When the PA is operated at back-off, with 1/M and 1/N fraction of the cells being switched on (, the driving condition to ensure optimal ratioed power delivery requires $$\left|\frac{S_{32}}{S_{31}}\right| = \sqrt{r},$$

where $PA_2 = r \cdot PA_1$ and $r = M/N$. Therefore, the network needs to satisfy another condition as given below $$\frac{r-1}{r+1} = \frac{1}{2}\cdot\frac{(1-|\Gamma_2|^2)\cdot(1+R(\Gamma_1)) - (1-|\Gamma_1|^2)\cdot(1+R(\Gamma_2))}{\left|1 - \frac{1-\Gamma_1}{2}\cdot\frac{1-\Gamma_2}{2}\right|^2} \quad (13)$$

Equations (1) and (2) set up the baseline for synthesis, and can be solved for dual reconfigurability for the combiner design. Typically, the solutions are not unique.

1) Frequency Reconfigurability: To ensure peak power across frequencies, all the combining DAC cells are switched completely ON i.e., r=1. Evidently, a traditional symmetric solution gives $\Gamma_1=\Gamma_2$. Interestingly, $\Gamma_2=\Gamma_1*$ is also possible asymmetric solution. When solved along with (1) giving $$|\Gamma_1| = \left|\frac{1-\Gamma_1}{2}\right|,$$

a simple second-order asymmetrical conjugate network emerges as shown in FIG. 29B in each branch. When reconfigured for optimal operation with a static phase control, the combiner allows broad-band performance across 35-75 GHz (FIG. 29B). The figure also shows efficiency variation when reconfigured optimally for 50 and 70 GHz.

When programmed over the range, the overall performance traces the peaks of the individual curves.

FIG. 29B includes a driving condition controller coupled to the plurality of n amplifier cells to control driving conditions at the input of the asymmetrical combiner to target an optimal impedance for back-off operation, wherein the driving conditions include: codes defining a fraction of the unit amplifiers being switched on, or a duty cycle for each of the unit amplifiers and/or amplitude/phase. As discussed in connection with FIG. 1C, the driving condition controller can be controlled in a feedback fashion with sensors that measure output power and a computation block that stores the measured signal from each of the combinations of the driving conditions. The results can also be stored in a look-up table for future use. It should be understood that the computations may be carried out inside the driving condition controller without departing from the scope of this disclosure. Similarly, the any lookup table may be implemented in the driving condition controller without departing from the scope of this disclosure.

2) PBO Reconfigurability at one frequency: At a given frequency, (1) and (2) could be solved at multiple PBO levels to enable high efficiency and high spectral efficiency simultaneously. This reconfigurability could be achieved either through pure amplitude control (asymmetric switching codes) or dual amplitude-dynamic phase (ø) control. An example network at 60 GHz, when solved for two PBO levels, is shown in the FIG. 29C that achieves η close to 1 until −10 dB deep PBO higher than a classical Doherty topology.

3) Simultaneous Frequency-PBO Reconfigurability: Enabling dual reconfigurability requires a co-synthesis approach, which reveals interesting characteristics as shown in FIGS. 30A-30F. Firstly, as shown in FIG. 30B, optimal peak power operation is achieved across the frequency span with more than 90% combining efficiency with a phase control in one branch. Due to its limited tuning range requirement, this can be realized with a simple RF phase shifter before the driver stage or programmed at the baseband. To enable efficient backoff power generation across frequencies, spectrally-dependent asymmetric switching codes are calculated. As an example, to generate a PBO level of $P_{PBO}=P_{peak}/\alpha$, frequency dependent switching ratios (M,N) are calculated such that $1/\alpha=1/M+1/N$, where 1/M and 1/N represent the fractions of the DAC cells that are switched ON. As shown in FIGS. 30C-F, one of the PAs ($PA_1$) shuts off at deep-PBO for optimal efficiency at the lower frequencies, while the roles interchange and the other PA ($PA_2$) shuts off for the higher frequency end. This maintains a PBO performance almost similar to Doherty across the frequency range. Functionally, this emulates an array of frequency shifted, narrow-band, switchable, Doherty-like PAs, each with a size equaling the combined size of all the DAC cells. In this topology, this functionality is achieved through controlled interactions in an asymmetrical, compact, low-loss combiner.

Circuit Schematic

The schematic of the PA implemented in a 0:13 μm SiGe as BiCMOS process is shown in FIG. 31A. A chip microphotograph measuring 1.95 mm×0.95 mm are shown in FIG. 31B. The PA is based on transmission-line combining topology with two asymmetrical paths. The RF phase control for frequency-reconfigurability is implemented with variable delay transmission line. Each of the two output stages consists of binary-weighted mm-Wave DACs with 4-bit amplitude control. The power DACs operate from a 4 V supply, are based on a stacked topology (with the MSB sized 48 µm in emitter length) with intra-stack t-line matching for wider bandwidth. The 4-b words in each cell are buffered with programmable delays to compensate for on-chip and off-chip delay mismatches. The driver stages operate from 1.6 V supply. The second driver stage employ two different cells with 4×6 µm in emitter lengths in the two branches, driving separately the 8× and 7× output DACs. This enables half of the driver stages to be switched off at back-off when the MSB of the corresponding path ($A_3/B_3$) is set to zero, thereby saving power. The input and interstage matching networks are designed to be broadband.

Measurement Results

Large-Signal Measurements

The large-signal measurement results are shown in FIGS. 32A-32F. The measured $\eta_{out}$ for all possible code combinations in both branches is shown in FIG. 32. The PA achieves $P_{sat}$>21.8 dBm with $\eta_{out}$>24% across 30-55 GHz and peak $P_{sat}$ of 23.7 dBm at a PAE of 28.5% at 40 GHz. The 4-bit word settings have been color-coded for digital operation (along with the analog Class-AB operation) to illustrate the dominant operation of the PA cells. As can be seen, the lower DAC cell ($PA_2$) dominates at deep PBO for the lower frequency range (<40 GHz), while the upper DAC cell ($PA_1$) does that at deep PBO for the higher frequency end (>40 GHz) for efficient operation. The switching frequency is close to 40 GHz, where both the PAs deliver near equal power over the power range. As can be seen, the PBO efficiency of the optimal code settings when compared against the class AB operation, has nearly 1.5-2.2× improvement at −6 dB PBO and 1.7-2.8× at −9 dB PBO between 30-55 GHz. Measured Pout, PAE and $\eta_{out}$ for back-off levels between 0 to −9 dB are shown in FIGS. 33A-33D. As can be seen, the PA can be actively configured to maintain $\eta_{out}$>16% at −6 dB back-off across 30-55 GHz.

Modulation Measurements

The modulation measurement setup is shown in FIG. 34A. Measured Multi-Gbps constellation schemes of pulse-shaped QPSK and 16-QAM at 30 GHz and 50 GHz are shown in FIGS. 34B-34E. QPSK at 30 and 50 GHz is measured with an average power of 19.4 and 18.4 dBm and data rates of 2 Gbps with $\eta_{out}$ of 22.7% and 25.2% and EVM of −22.5 and −25.1 dB respectively. Currently, limited by the nonlinearity of the input mixer (FIG. 34A), 16-QAM is measured with an average power of 16.4 and 16.9 dBm at 4 Gbps with $\eta_{out}$ of 19.9% and 24.6% with EVM of −18.2 and −19.2 dB at 30 GHz and 50 GHz respectively. The phase rotations due to the asymmetric switching remains in a narrow angular cone and optimal amplitude codes can be chosen to avoid pre-PA phase corrections (FIG. 34F). FIG. 34G is a graph showing the spectrum of pulse-shaped 16-QAM at 50 GHz.

In disclosure above we disclosed a generalized multi-port network synthesis approach for enabling both frequency and back-off reconfigurability in a mm-Wave PA. The approach exploits the interaction of asymmetric mm-Wave DAC cells synthesizing the optimal impedance across the dual reconfigurability space. As a proof of concept, a silicon-based PA is presented which operates between 30-55 GHz with peak $P_{sat}$ of 23.7 dBm at 40 GHz and _out of 34.5% and maintaining $\eta_{out}$>16% at −6 dB back-off across the range. The PA is capable of efficient multi-Gbps communication with spectrally efficient codes over a wide mm-Wave frequency span.

Further disclosure is contained in U.S. provisional application 62/312,822, filed Mar. 24, 2017, which is incorporated herein in its entirety. All references that are cited in U.S. provisional application 62/312,822 and the appendix are also incorporated herein in their entirety. Further disclosure is also provided in the paper by Chandrakanth R. Chappidi and Kaushik Sengupta, *Frequency Reconfigurable mm-Wave Power Amplifier with Active Impedance Synthesis in an Asymmetrical Non-Isolated Combiner*, ISSCC, page 344-345. IEEE, (2016) and the paper by Chandrakanth R. Chappidi et al., *Generalized Approach towards Frequency and Back-off Reconfigurability in mm-Wave PAs* (2016) which are also incorporated herein in their entirety. It should be understood that many variations are possible based on the disclosure herein. Although features and elements are described above in particular combinations, each feature or element can be used alone without the other features and elements or in various combinations with or without other features and elements. The digital processing techniques disclosed herein may be partially implemented in a computer program, software, or firmware incorporated in a computer-readable (non-transitory) storage medium for execution by a general-purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general-purpose processor, a special purpose processor, a conventional processor, a digital signal processor (DSP), a plurality of microprocessors, one or more microprocessors in association with a DSP core, a controller, a microcontroller, Application-Specific Integrated Circuits (ASICs), Field-Programmable Gate Arrays (FPGAs) circuits, any other type of integrated circuit (IC), and/or a state machine.

What is claimed is:

1. A power amplifier system for amplifying an input having a carrier frequency having an amplitude and phase and generating an amplified output, the system comprising:
   a plurality of n amplifiers coupled to an asymmetrical combiner, the asymmetrical combiner being formed of a passive network including one or more of inductors, capacitors, transmission lines, and transformers, each amplifier having an input and an output, the asymmetrical combiner having a plurality of inputs and an output, the output of each amplifier being coupled to an input of the asymmetrical combiner, an impedance viewed at the output of each of the n amplifiers being a function of the amplitude and phase at each of the other n−1 amplifiers; and
   an amplitude/phase controller coupled to the plurality of n amplifiers or the asymmetrical combiner to control the amplitude and phase at the asymmetrical combiner input;
   the amplitude/phase controller being configured to present an amplitude/phase at each input of the asymmetrical combiner to target an optimal impedance at the carrier frequency for each of the plurality of n amplifiers.

2. The system of claim 1 wherein each of the n amplifiers has a control port configured to receive a control output to control the amplitude/phase of the generated amplifier output.

3. The system of claim 2 where the control output is configured as a bias control in each of the n amplifiers.

4. The system of claim 2 where the control output is realized with a separate active device connected to each of the plurality of n amplifiers.

5. The system of claim 1 further comprising an input distribution network coupled to the input of each of the n amplifiers.

6. The system of claim 5 wherein the input distribution network includes amplitude and/or phase control.

7. The system of claim 1 wherein the amplitude/phase controller comprises at least one of variable capacitors, variable inductors and variable delay lines.

8. The system of claim 1 wherein the amplitude/phase controller is configured to control amplitude/phase by vector summation of in-phase and quadrature phase input signal.

9. The system of claim 1 where the amplitude/phase controller is configured for improving linearity at least one of the plurality of n amplifiers.

10. The system of claim 1 where the amplitude/phase controller is configured for reducing AM-AM and/or AM-PM distortion of at least one of the plurality of n amplifiers.

11. The system of claim 1 where the amplitude/phase controller is configured for reducing antenna impedance mismatches.

12. The system of claim 1 further comprising a sensor for measuring output power wherein the amplitude/phase controller is controlled in a feedback fashion based on the measured output power.

13. A power amplifier system for amplifying an input generating an output having an amplitude and phase and generating an amplified output, the system comprising:
   a plurality of n amplifier cells, each amplifier cell comprising an array of unit amplifiers, each of the n amplifier cells being coupled to an asymmetrical combiner, each amplifier cell having a set of driving conditions, the asymmetrical combiner being formed of a passive network, each amplifier cell having an input and an output, the asymmetrical combiner having a plurality of inputs and an output, the output of each amplifier cell being coupled to an input of the asymmetrical combiner, the impedance viewed at the output of each of the n amplifier cells being a function of the driving conditions of the other n−1 amplifier cells; and
   a driving condition controller coupled to the plurality of n amplifier cells to control driving conditions at the input of the asymmetrical combiner to target an optimal impedance for back-off operation, wherein the driving conditions include: codes defining a fraction of the unit amplifiers being switched on, or a duty cycle for each of the unit amplifiers and/or amplitude/phase.

14. The system of claim 13 wherein the driving condition controller is configured to present an amplitude/phase at each input of the asymmetrical combiner to establish an optimal impedance to each of the plurality of n amplifier cells.

15. The system of claim 13 wherein each of the n amplifier cells has a control port configured to receive a control output to control the amplitude/phase of the generated amplifier output.

16. The system of claim 15 where the control output is configured as a bias control in each of the n amplifier unit cells.

17. The system of claim 15 where the control output is realized with a separate active device connected to each of the plurality of n amplifiers.

18. The system of claim 13 wherein the asymmetrical combiner comprises a passive network including a combination of inductors, capacitors, transmission lines or transformers.

19. The system of claim 13 further comprising an input distribution network coupled to the input of each of the n amplifiers.

20. The system of claim 19 wherein the input distribution network includes amplitude and/or phase control.

21. The system of claim 13 wherein the driving condition controller comprises variable capacitors and/or inductors.

22. The system of claim 13 wherein the driving condition controller is configured to control amplitude/phase by vector summation of in-phase and quadrature phase input signal.

23. The system of claim 13 wherein the each of the n amplifier cells is configured to receive a control output comprising a plurality of bits configured for optimal back-off operation.

24. The system of claim 13 wherein control bits are modulated to impart amplitude information in a phase rotated signal.

25. The system of claim 13 where the driving condition controller is configured to improve linearity of at least one the plurality of n amplifiers.

26. The system of claim 13 where the driving condition controller is configured for reducing AM-AM and/or AM-PM distortion of at least one of the plurality of n amplifier cells.

27. The system of claim 13 where the driving condition controller is configured for reducing antenna impedance mismatches.

28. The system of claim 13 further comprising a sensor for measuring output power wherein the driving condition controller is controlled in a feedback fashion based on the measured output power.

29. A power amplifier system for amplifying an input having a carrier frequency having an amplitude and phase and generating an amplified output, the system comprising:
   a plurality of n amplifiers coupled to an asymmetrical combiner, the asymmetrical combiner being formed of a passive network, each amplifier having an input and an output, the asymmetrical combiner having a plurality of inputs and an output, the output of each amplifier being coupled to an input of the asymmetrical combiner, an impedance viewed at the output of each of the n amplifiers being a function of the amplitude and phase at each of the other n−1 amplifiers; and
   an amplitude/phase controller coupled to the plurality of n amplifiers or the asymmetrical combiner to control the amplitude and phase by vector summation of in-phase and quadrature phase input signal at the asymmetrical combiner input;
   the amplitude/phase controller being configured to present an amplitude/phase at each input of the asymmetrical combiner to target an optimal impedance at the carrier frequency for each of the plurality of n amplifiers.

* * * * *